(12) United States Patent
Omura

(10) Patent No.: US 9,606,443 B2
(45) Date of Patent: Mar. 28, 2017

(54) REDUCING IMMERSION PROJECTION OPTICAL SYSTEM

(71) Applicant: Nikon Corporation, Tokyo (JP)

(72) Inventor: Yasuhiro Omura, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 14/227,691

(22) Filed: Mar. 27, 2014

(65) Prior Publication Data

US 2014/0211182 A1 Jul. 31, 2014

Related U.S. Application Data

(63) Continuation of application No. 12/379,415, filed on Feb. 20, 2009, now Pat. No. 9,086,635, which is a
(Continued)

(30) Foreign Application Priority Data

| May 6, 2003 | (JP) | 2003-128154 |
| Oct. 9, 2003 | (JP) | 2003-350647 |
| Oct. 24, 2003 | (JP) | 2003-364596 |

(51) Int. Cl.
  *G02B 17/00* (2006.01)
  *G03F 7/20* (2006.01)
  (Continued)

(52) U.S. Cl.
  CPC ............ *G03F 7/7015* (2013.01); *G02B 9/34* (2013.01); *G02B 17/0844* (2013.01);
  (Continued)

(58) Field of Classification Search
  CPC ............ G02B 17/0808; G02B 17/0896; G02B 17/0852; G02B 17/0856; G02B 13/143;
  (Continued)

(56) References Cited

U.S. PATENT DOCUMENTS

| 4,346,164 A | 8/1982 | Tabarelli et al. |
| 4,480,910 A | 11/1984 | Takanashi et al. |

(Continued)

FOREIGN PATENT DOCUMENTS

| CN | 1535392 | 10/2004 |
| CN | 1639644 | 7/2005 |

(Continued)

OTHER PUBLICATIONS

Communication pursuant to Article 94(3) EPC dated Sep. 22, 2015, directed to EP Application No. 13175504.3-1562; 4 pages.

(Continued)

*Primary Examiner* — Arnel C Lavarias
(74) *Attorney, Agent, or Firm* — Morrison & Foerster LLP

(57) ABSTRACT

A projection objective includes at least four curved mirrors, which include a first curved mirror that is a most optically forward mirror and a second curved mirror that is a second most optically forward mirror, as defined along a light path. In addition, an intermediate lens element is disposed physically between the first and second mirrors, the intermediate lens element being a single pass type lens. The objective forms an image with a numerical aperture of at least substantially 1.0 in immersion.

23 Claims, 21 Drawing Sheets

Related U.S. Application Data continuation of application No. 11/882,208, filed on Jul. 31, 2007, now abandoned, which is a continuation of application No. 11/266,288, filed on Nov. 4, 2005, now Pat. No. 7,348,575, which is a continuation-in-part of application No. PCT/JP2004/006417, filed on May 6, 2004.

(60) Provisional application No. 60/721,582, filed on Sep. 29, 2005.

(51) Int. Cl.
  *G02B 9/34* (2006.01)
  *G02B 17/08* (2006.01)
  *H01L 21/027* (2006.01)

(52) U.S. Cl.
  CPC ...... *G03F 7/70225* (2013.01); *G03F 7/70341* (2013.01); *H01L 21/027* (2013.01)

(58) Field of Classification Search
  CPC ...... G02B 13/14; G02B 7/70241; G02B 1/02; G02B 13/146; G02B 27/4211; G02B 1/00; G02B 13/18; G02B 27/0025; G02B 13/16; G02B 17/08; G02B 7/70225; G02B 17/0892; G02B 7/70275; G02B 17/0812; G02B 7/70223; G02B 17/0657; G02B 23/06; G02B 17/0884; G02B 17/0668; G02B 5/10; G02B 17/0621; G02B 17/0663; G02B 17/061; G02B 13/22; G02B 13/04; G02B 9/12; H01J 37/3174; H01J 37/3171; H01J 37/3007; B41J 2/16585; B41J 2/17596; B41J 3/445; B41J 11/0005; B41J 11/70; C03C 3/06; G03B 27/68; G03B 27/526; G03B 27/527; G03B 27/72; G03G 15/28; G03G 15/04; B82Y 10/00; G03F 7/701; G03F 7/702; G03F 7/706; G03F 7/70225; G03F 7/70241; G03F 7/70916; G03F 7/70258; G03F 7/70633; G03F 7/70275; G03F 7/70108; G03F 7/70291; G03F 7/70308; G03F 7/7035
  USPC ....... 359/351, 355, 356, 357, 364, 365, 366, 359/730, 858, 649, 651; 250/492.2; 355/18, 52, 66, 67, 71
  See application file for complete search history.

(56) References Cited

U.S. PATENT DOCUMENTS

| | | | |
|---|---|---|---|
| 4,509,852 A | 4/1985 | Tabarelli et al. | |
| 5,121,256 A | 6/1992 | Corle et al. | |
| 5,610,683 A | 3/1997 | Takahashi | |
| 5,729,331 A | 3/1998 | Tanaka et al. | |
| 5,815,310 A | 9/1998 | Williamson | |
| 5,825,043 A * | 10/1998 | Suwa ................ | G03F 7/70275 250/548 |
| 5,852,490 A | 12/1998 | Matsuyama | |
| 5,900,354 A | 5/1999 | Batchelder | |
| 6,020,964 A | 2/2000 | Loopstra et al. | |
| 6,166,865 A | 12/2000 | Matsuyama | |
| 6,191,429 B1 | 2/2001 | Suwa | |
| 6,198,576 B1 | 3/2001 | Matsuyama | |
| 6,473,243 B1 | 10/2002 | Omura | |
| 6,600,608 B1 | 7/2003 | Shafer et al. | |
| 6,631,036 B2 | 10/2003 | Schuster | |
| 6,636,350 B2 | 10/2003 | Shafer et al. | |
| 6,829,099 B2 | 12/2004 | Kato et al. | |
| 6,873,476 B2 | 3/2005 | Shafer | |
| 6,961,186 B2 | 11/2005 | Pierrat et al. | |
| 7,030,965 B2 | 4/2006 | Takahashi | |
| 7,085,075 B2 | 8/2006 | Mann et al. | |
| 7,209,292 B2 | 4/2007 | Epple et al. | |
| 7,215,478 B1 | 5/2007 | Hirata | |
| 7,256,932 B2 | 8/2007 | Epple et al. | |
| 7,309,870 B2 | 12/2007 | Omura | |
| 7,312,463 B2 | 12/2007 | Omura | |
| 7,317,507 B2 | 1/2008 | Straaijer | |
| 7,348,575 B2 | 3/2008 | Omura | |
| 7,362,508 B2 | 4/2008 | Omura et al. | |
| 7,385,756 B2 | 6/2008 | Shafer et al. | |
| 7,414,794 B2 | 8/2008 | Novak | |
| 7,532,306 B2 | 5/2009 | Dodoc et al. | |
| 7,551,362 B2 | 6/2009 | Omura et al. | |
| 7,580,197 B2 | 8/2009 | Omura et al. | |
| 7,609,455 B2 | 10/2009 | Omura et al. | |
| 7,619,827 B2 | 11/2009 | Omura et al. | |
| 7,688,517 B2 | 3/2010 | Omura et al. | |
| 7,701,640 B2 | 4/2010 | Omura et al. | |
| 8,390,784 B2 | 3/2013 | Epple | |
| 2001/0040722 A1 | 11/2001 | Shafer et al. | |
| 2001/0043391 A1 | 11/2001 | Shafer et al. | |
| 2002/0008855 A1 | 1/2002 | Kato et al. | |
| 2002/0024741 A1* | 2/2002 | Terasawa ............ | G02B 13/143 359/627 |
| 2002/0176063 A1 | 11/2002 | Omura | |
| 2003/0004757 A1 | 1/2003 | Haines | |
| 2003/0011755 A1 | 1/2003 | Omura et al. | |
| 2003/0011894 A1 | 1/2003 | Schuster | |
| 2003/0030916 A1 | 2/2003 | Suenaga | |
| 2003/0133198 A1 | 7/2003 | Kurata | |
| 2003/0174408 A1 | 9/2003 | Rostalski et al. | |
| 2003/0197922 A1 | 10/2003 | Hudyma | |
| 2004/0130806 A1 | 7/2004 | Takahashi | |
| 2004/0240047 A1 | 12/2004 | Shafer et al. | |
| 2005/0018164 A1 | 1/2005 | Hansen | |
| 2005/0036213 A1 | 2/2005 | Mann et al. | |
| 2005/0068499 A1 | 3/2005 | Dodoc et al. | |
| 2005/0094119 A1 | 5/2005 | Loopstra et al. | |
| 2005/0190435 A1 | 9/2005 | Shafer et al. | |
| 2006/0028630 A1 | 2/2006 | Akimoto | |
| 2006/0077366 A1 | 4/2006 | Shafer et al. | |
| 2006/0119750 A1 | 6/2006 | Epple et al. | |
| 2006/0171040 A1 | 8/2006 | Mann et al. | |
| 2006/0187430 A1 | 8/2006 | Dodoc et al. | |
| 2008/0316452 A1 | 12/2008 | Dodoc et al. | |

FOREIGN PATENT DOCUMENTS

| | | | |
|---|---|---|---|
| CN | 1784623 | 6/2006 | |
| CN | 1910494 | 2/2007 | |
| CN | 100405119 | 7/2008 | |
| DE | 221 563 | 4/1985 | |
| DE | 224 448 | 7/1985 | |
| EP | 0 023 231 | 2/1981 | |
| EP | 0 605 103 | 7/1994 | |
| EP | 0 834 773 | 4/1998 | |
| EP | 1 069 448 | 1/2001 | |
| EP | 1 098 215 | 5/2001 | |
| EP | 1 115 019 | 7/2001 | |
| EP | 1 336 887 | 8/2003 | |
| JP | 6-53120 | 2/1994 | |
| JP | 06-188169 | 7/1994 | |
| JP | 7-142338 | 6/1995 | |
| JP | 7-307278 | 11/1995 | |
| JP | 10-163099 | 6/1998 | |
| JP | 10-214783 | 8/1998 | |
| JP | 10-228661 | 8/1998 | |
| JP | 10-255319 | 9/1998 | |
| JP | 10-303114 | 11/1998 | |
| JP | 11-176727 | 7/1999 | |
| JP | 2000-58436 | 2/2000 | |
| JP | 2000-505958 | 5/2000 | |
| JP | 2001-27727 | 1/2001 | |
| JP | 2001-228401 | 8/2001 | |
| JP | 3246615 | 11/2001 | |
| JP | 2002-118058 | 4/2002 | |
| JP | WO 0235273 A1 * | 5/2002 | ......... G02B 17/0844 |
| JP | 2002-208551 | 7/2002 | |

(56) References Cited

FOREIGN PATENT DOCUMENTS

| | | | | |
|---|---|---|---|---|
| JP | 2002-244035 | 8/2002 | | |
| JP | 2002-277742 | 9/2002 | | |
| JP | 2003-15040 | 1/2003 | | |
| JP | 2003-114387 | 4/2003 | | |
| JP | 2003-233001 | 8/2003 | | |
| JP | EP 1336887 A1 * | 8/2003 | ......... | G02B 17/0844 |
| JP | 2007-518125 | 7/2007 | | |
| WO | WO-98/28665 | 7/1998 | | |
| WO | WO-99/49504 | 9/1999 | | |
| WO | WO-00/77037 | 12/2000 | | |
| WO | WO-01/07048 | 2/2001 | | |
| WO | WO-01/51979 | 7/2001 | | |
| WO | WO-01/59502 | 8/2001 | | |
| WO | WO-01/65296 | 9/2001 | | |
| WO | WO-02/35273 | 5/2002 | | |
| WO | WO-02/44786 | 6/2002 | | |
| WO | WO-2004/019128 | 3/2004 | | |
| WO | WO-2004/107048 | 12/2004 | | |
| WO | WO-2005/015316 | 2/2005 | | |
| WO | WO-2005/069055 | 7/2005 | | |
| WO | WO-2005/098505 | 10/2005 | | |
| WO | WO-2006/005547 | 1/2006 | | |

OTHER PUBLICATIONS

Omura, U.S. Notice of Allowance mailed Mar. 17, 2015, directed to U.S. Appl. No. 12/379,415; 8 pages.
Omura, U.S. Notice of Allowance mailed Mar. 10, 2015, directed to U.S. Appl. No. 13/275,760; 8 pages.
Notice of Reasons for Rejection mailed Feb. 17, 2015, directed to JP Application No. 2014-093069; 21 pages.
Omura, U.S. Office Action mailed Apr. 9, 2015, directed to U.S. Appl. No. 11/513,160; 11 pages.
Notice of Reasons for Rejection mailed Mar. 24, 2015, directed to JP Application No. 2014-087729; 17 pages.
Omura, et al., U.S. Notice of Allowance, mailed Oct. 29, 2007, directed to U.S. Appl. No. 11/266,288; 10 pages.
Omura, et al. U.S. Office Action mailed Apr. 4, 2007, directed to U.S. Appl. No. 11/513,160; 9 pages.
Omura, Y., U.S. Office Action mailed Dec. 12, 2007, directed to U.S. Appl. No. 11/513,160; 20 pages.
Omura, Y., U.S. Office Action mailed Jul. 14, 2008, directed to U.S. Appl. No. 11/513,160; 19 pages.
Omura, Y., U.S. Office Action mailed Oct. 27, 2009, directed to U.S. Appl. No. 11/513,160; 15 pages.
Omura, et al., U.S. Notice of Allowance, mailed Sep. 2, 2010, directed to U.S. Appl No. 11/513,160; 17 pages.
Notice of Allowance dated Mar. 14, 2011 directed to U.S. Appl. No. 11/513,160; 7 pages.
Notice of Allowance dated Sep. 22, 2011 directed to U.S. Appl. No. 11/513,160; 7 pages.
Notice of Allowance dated Apr. 3, 2012 directed to U.S. Appl. No. 11/513,160; 7 pages.
Omura, U.S. Office Action mailed Feb. 27, 2014, directed to U.S. Appl. No. 11/513,160; 14 pages.
Omura, et al., U.S. Notice of Allowance, mailed Aug. 24, 2007, directed to U.S. Appl. No. 11/583,916; 10 pages.
Omura, et al., U.S. Notice of Allowance, mailed Aug. 14, 2007, directed to U.S. Appl. No. 11/583,934; 13 pages.
Omura, Y., U.S. Office Action mailed Aug. 21, 2008, directed to U.S. U.S. Appl. No. 11/882,208; 9 pages.
Omura, Y., U.S. Office Action mailed Sep. 24, 2010, directed to U.S. U.S. Appl. No. 12/379,415; 6 pages.
Omura, Y., U.S. Office Action mailed Jan. 7, 2011, directed to U.S. Appl. No. 12/379,415; 15 pages.
Omura, Y., U.S. Office Action mailed Oct. 14, 2011, directed to U.S. Appl. No. 12/379,415; 13 pages.
Omura, U.S. Office Action mailed Jan. 31, 2014, directed to U.S. Appl. No. 12/379,415; 18 pages.

Omura, Y., U.S. Office Action mailed Nov. 5, 2010, directed to U.S. Appl. No. 12/884,332; 8 pages.
Omura, Y., U.S. Office Action mailed Aug. 23, 2011, directed to U.S. Appl. No. 12/884,332; 7 pages.
Omura, U.S. Office Action mailed Feb. 17, 2012, directed to U.S. Appl. No. 13/275,760; 12 pages.
Omura, U.S. Office Action mailed Nov. 23, 2012, directed to U.S. Appl. No. 13/275,760; 16 pages.
Omura, Restriction Requirement mailed Jul. 11, 2013, directed to U.S. Appl. No. 13/275,760; 10 pages.
Omura, Ex parte Quayle Action mailed Sep. 27, 2013, directed to U.S. Appl. No. 13/275,760; 8 pages.
Omura, U.S. Office Action mailed Apr. 7, 2014, directed to U.S. Appl. No. 13/275,760; 8 pages.
Declaration—Bd.R. 203(b)1 for Patent Interference No. 105,678 filed on Jan. 30, 2009; 6 pages.
Omura Motion 1 for Patent Interference No. 105,678 filed Jun. 2, 2009; 41 pages (105,678 Omura Motion 1).
Shafer Substantive Motion 1 for Patent Interference No. 105,678 filed Jun. 2, 2009; 57 pages (105678 Shafer Substantive Motion 1).
Shafer Substantive Motion 2 for Patent Interference No. 105,678 filed Jun. 2, 2009; 38 pages (105678 Shafer Substantive Motion 2).
Shafer Substantive Motion 3 for Patent Interference No. 105,678 filed Jun. 2, 2009; 30 pages (105678 Shafer Substantive Motion 3).
Depositon of Mitchell C. Ruda, Ph.D. dated Jul. 23, 2009, regarding Patent Interference No. 105,678; 74 pages.
Omura Response 1 in Patent Interference No. 105,678 filed Aug. 26, 2009; 39 pages (105,678 Omura Response 1).
Decision on Motions—Bd.R. 125(a) in Patent Interference No. 105,678 filed Aug. 31, 2009; 3 pages.
Judgment—Request for Adverse—Bd.R. 127(b) in Patent Interference No. 105,678 filed Aug. 31, 2009; 3 pages.
Notice of Appeal for Patent Interference No. 105,678 filed Apr. 5, 2010; 20 pages.
Brief of Appellant Omura for Patent Interference No. 105,678 filed Aug. 30, 2010; 108 pp. (105,678 Brief Appellant Omura).
Corrected Appellees Brief for Patent Interference No. 105,678 dated Oct. 25, 2010; 97 pages (105,678 Corrected Brief).
Reply Brief of Appellant Omura for Patent Interference No. 105,678 filed Nov. 29, 2010; 36 pages. (105,678 Omura Reply Brief).
Declaration—Bd.R. 203(b)1 for Patent Interference No. 105,749 filed on Apr. 28, 2010; 6 pages.
Decision for Patent Interference No. 105,678 dated Apr. 8, 2011; 8 pages.
Omura Motion 1 for Patent Interference No. 105,749 filed Aug. 20, 2010; 13 pages. (105,749 Omura Motion 1).
Omura Motion 2 for Patent Interference No. 105,749 filed Aug. 20, 2010; 16 pages (105,749 Omura Motion 2).
Shafer Substantive Motion 1 for Patent Interference No. 105,749 filed Aug. 20, 2010; 62 pages (105,749 Shafer Substantive Motion 1).
Shafer Substantive Motion 2 for Patent Interference No. 105,749 filed Aug. 20, 2010; 79 pages (105,749 Shafer Substantive Motion 2).
Shafer Responsive Motion 3 for Patent Interference No. 105,749 filed Sep. 17, 2010; 25 pages (105,749 Shafer Responsive Motion 3).
Omura Responsive Motion 3 for Patent Interference No. 105,749 filed Sep. 17, 2010; 21 pages (105,749 Omura Responsive Motion 3).
Omura Responsive Motion 4 for Patent Interference No. 105,749 filed Sep. 17, 2010; 6 pages (105,749 Omura Responsive Motion 4).
Omura Responsive Motion 5 for Patent Interference No. 105,749 filed Sep. 17, 2010; 32 pages (105,749 Omura Responsive Motion 5).
Omura Opposition 1 for Patent Interference No. 105,749 filed Nov. 5, 2010; 53 pages (105,749 Omura Opposition 1).
Omura Opposition 2 for Patent Interference No. 105,749 filed Nov. 5, 2010; 40 pages (105,749 Omura Opposition 2).
Omura Opposition 3 for Patent Interference No. 105,749 filed Nov. 5, 2010; 10 pages (105,749 Omura Opposition 3).
Shafer Opposition 1 for Patent Interference No. 105,749 filed Nov. 5, 2010; 49 pages (105,749 Shafer Opposition 1).

(56) References Cited

OTHER PUBLICATIONS

Shafer Opposition 2 for Patent Interference No. 105,749 filed Nov. 5, 2010; 51 pages (105,749 Shafer Opposition 2).
Shafer Opposition 3 for Patent Interference No. 105,749 filed Nov. 5, 2010; 55 pages (105,749 Shafer Opposition 3).
Shafer Opposition 4 for Patent Interference No. 105,749 filed Nov. 5, 2010; 28 pages (105,749 Shafer Opposition 4).
Shafer Opposition 5 for Patent Interference No. 105,749 filed Nov. 5, 2010; 40 pages (105,749 Shafer Opposition 5).
Omura Reply 1 for Patent Interference No. 105,749 filed Dec. 3, 2010; 36 pages (105,749 Omura Reply 1).
Omura Reply 2 for Patent Interference No. 105,749 filed Dec. 3, 2010; 41 pages (105,749 Omura Reply 2).
Omura Reply 3 for Patent Interference No. 105,749 filed Dec. 3, 2010; 40 pages (105,749 Omura Reply 3).
Omura Reply 4 for Patent Interference No. 105,749 filed Dec. 3, 2010; 23 pages (105,749 Omura Reply 4).
Omura Reply 5 for Patent Interference No. 105,749 filed Dec. 3, 2010; 31 pages (105,749 Omura Reply 5).
Shafer Reply 1 for Patent Interference No. 105,749 filed Dec. 3, 2010; 64 pages (105,749 Shafer Reply 1).
Shafer Reply 2 for Patent Interference No. 105,749 filed Dec. 3, 2010; 47 pages (105,749 Shafer Reply 2).
Shafer Reply 3 for Patent Interference No. 105,749 filed Dec. 3, 2010; 15 pages (105,749 Shafer Reply 3).
Shafer Supplemental Notice for Patent Interference No. 105,749 dated Apr. 11, 2011; 3 page.
Declaration—Bd.R. 203(b)1 for Patent Interference No. 105,753 filed Jun. 29, 2010; 7 pages.
Order—Bd.R. 104(c) for Patent Interference No. 105,753 dated Aug. 11, 2010; 3 pages.
Shafer Supplemental Notice for Interference No. 105,753 dated Apr. 11, 2011; 3 pages.
Order—Bd.R. 104(a) for Patent Interference No. 105,753 dated Apr. 15, 2011; 4 pages.
Omura Supplemental Response for Patent Interference No. 105,753 dated May 10, 2011; 21 pages.
Omura, et al., U.S. Notice of Allowance mailed Jan. 10, 2008, directed to U.S. Appl. No. 10/525,372; 14 pages.
Omura, et al., U.S. Office Action mailed May 19, 2006, directed to U.S. Appl. No. 10/525,372; 15 pages.
Omura, et al. U.S. Office Action mailed Feb. 9, 2007, directed to U.S. Appl. No. 10/525,372; 13 pages.
Omura, et al. U.S. Office Action mailed Jun. 28, 2007, directed to U.S. Appl. No. 10/525,372; 13 pages.
Omura, et al. U.S. Notice of Allowance mailed Mar. 13, 2009, directed to U.S. Appl. No. 11/907,679; 9 pages.
Omura, et al. U.S. Notice of Allowance mailed Sep. 26, 2008, directed to U.S. Appl. No. 11/907,679; 12 pages.
Omura, et al. U.S. Notice of Allowance mailed Feb. 2, 2009, directed to U.S. Appl. No. 11/907,679; 14 pages.
Omura, et al. U.S. Office Action mailed May 29, 2008, directed to U.S. Appl. No. 11/907,679; 13 pages.
Omura, et al., U.S. Notice of Allowance mailed Dec. 3, 2009, directed to U.S. Appl. No. 11/907,797; 8 pages.
Omura, et al. U.S. Office Action mailed May 22, 2008, directed to U.S. Patent Application No. 11/907,797; 15 pages.
Omura, et al., U.S. Office Action mailed Nov. 19, 2008, directed to U.S. Appl. No. 11/907,797; 12 pages.
Omura, et al., U.S. Office Action mailed Jul. 9, 2009, directed to U.S. Appl. No. 11/907,797; 11 pages.
Omura, et al., U.S. Notice of Allowance mailed Dec. 7, 2009, directed to U.S. Appl. No. 11/907,801; 14 pages.
Omura, et al., U.S. Office Action mailed Mar. 7, 2008, directed to U.S. Appl. No. 11/907,801; 15 pages.
Omura, et al., U.S. Office Action mailed Nov. 18, 2008, directed to U.S. Appl. No. 11/907,801; 15 pages.
Omura, et al., U.S. Office Action mailed May 14, 2009, directed to U.S. Appl. No. 11/907,801; 14 pages.
Omura, et al., U.S. Office Action mailed Aug. 10, 2009, directed to U.S. Appl. No. 11/907,801; 12. pages.
Omura, et al., U.S. Notice of Allowance mailed Apr. 28, 2009, directed to U.S. Appl. No. 11/907,907; 10 pages.
Omura, et al., U.S. Notice of Allowance mailed Aug. 12, 2009, directed to U.S. Appl. No. 11/907,907; 8 pages.
Omura, et al., U.S. Office Action mailed Sep. 8, 2008, directed to U.S. Appl. No. 11/907,907; 16 pages.
Omura, et al. U.S. Notice of Allowance, mailed Aug. 11, 2009, directed to U.S. Appl. No. 11/976,028; 9 pages.
Omura, et al., U.S. Office Action mailed Oct. 14, 2008, directed to U.S. Appl. No. 11/976,028; 15 pages.
Omura, et al., U.S. Office Action mailed Apr. 10, 2009, directed to U.S. Appl. No. 11/976,028; 10 pages.
Omura, et al., U.S. Notice of Allowance mailed Apr. 17, 2009, directed to U.S. Appl. No. 11/907,908; 10 pages.
Omura, et al. U.S. Office Action mailed Nov. 18, 2008, directed to U.S. Appl. No. 11/907,908; 17 pages.
Chinese Office Action dated Jun. 15, 2007, directed to Chinese Patent Application No. 200480012069; 14 pages.
Chinese Office Action mailed Aug. 7, 2009 directed to Chinese Patent Application No. 2007103061172; 7 pages.
First Office Action mailed May 15, 2009, directed to Chinese Patent Application No. 200710306118.7; 19 pages.
Notification of Reexamination dated Apr. 17, 2012, directed to Chinese Patent Application No. 200710306118.7; 13 pages.
Notification of Reexamination dated Jun. 21, 2013, directed to Chinese Patent Application No. 200710306118.7; 15 pages.
Chinese Office Action mailed Dec. 18, 2009 directed to Chinese Patent Application No. 200710306118.7; 16 pages.
Chinese Office Action directed to Chinese Patent Application No. 200710306118.7; 17 pages.
Chinese Office Action dated Apr. 26, 2011, directed to Chinese Application No. 200710306118.7; 19 pages.
Reexamination Decision dated Mar. 27, 2014, directed to CN Application No. 200710306118.7; 53 pages.
Chinese Office Action mailed Aug. 21, 2009 directed to Chinese Patent Application No. 200710306119.1; 9 pages.
Chinese Office Action mailed Aug. 7, 2009 directed to Chinese Patent Application No. 200710306116.8; 8 pages.
Request for Invalidation of Patent dated Sep. 29, 2013, directed to CN Patent No. ZL200710306116.8; 108 pages.
Observations in Reexamination, Invalidation Announcement Procedure dated Oct. 29, 2013, directed to CN Application No. 200710306116.8; 4 pages.
Expert's Testimony of Professor Linqun Sun dated Oct. 29, 2013, for CN Application No. 20071036116.8, Department of Precision Instrument, Tsinghua University; 103 pages.
Chinese Office Action mailed Feb. 5, 2010 directed to Chinese Patent Application No. 200810085910.9; 8 pages.
Request for Invalidation of Patent dated Sep. 29, 2013, directed to CN Patent No. ZL200810085910.9; 102 pages.
Observations in Reexamination, Invalidation Announcement Procedure dated Oct. 29, 2013, directed to CN Application No. 200810085910.9; 5 pages.
Partial Technical Content of Expert'S Testimony by Professor Liqun Sun dated Oct. 29, 2013, for CN Application No. 200810085910.9, Department of Precision Instrument, Tsinghua University; 113 pages.
First Office Action Notification mailed Dec. 28, 2007, directed to Chinese Patent Application No. 038172534; 19 pages.
Second Office Action mailed Jun. 13, 2008, directed to Chinese Patent Application No. 038172534; 6 pages.
Supplementary European Search Report mailed Jun. 14, 2010, directed to European Patent Application No. 04731484.4; 7 pages.
Search Report dated Oct. 6, 2008, directed to European Patent Application No. 03792812.4; 3 pages.
Communication pursuant to Article 94(3) EPC dated Jun. 23, 2010, directed to European Patent Application No. 03792812.4; 3 pages.
European Office Action mailed Sep. 20, 2011, directed to European Application No. 04 731 484.4; 4 pages.
First Examination Report dated Apr. 22, 2008, directed to India Patent Application No. 5190/DELNP/2005; 2 pages.

(56) References Cited

OTHER PUBLICATIONS

International Preliminary Report on Patentability mailed Mar. 16, 2006, directed to Application No. PCT/JP2004/006417; 7 pages.
Search Report mailed Aug. 12, 2004, directed to International Patent Application No. PCT/JP03/10665; 5 pages.
Notice of Deficiencies issued by State of Israel directed to Patent Application No. 196080, dated Nov. 9, 2009; 4 pages.
Notice of Reasons for Rejection mailed on Mar. 12, 2013, directed toward Japanese Patent Application No. 2011-148303; 6 pages.
Notice of Reasons for Rejection mailed on Mar. 19, 2013, directed toward Japanese Patent Application No. 2010-214301; 10 pages.
Notice of Preliminary Rejection mailed Apr. 4, 2013, directed toward Korean Patent Application No. 10-2012-7032215; 9 pages.
Notice of Preliminary Rejection mailed Apr. 4, 2013, directed toward Korean Patent Application No. 10-2013-7001768; 8 pages.
Notice of Reasons for Rejection mailed on Feb. 25, 2014, directed toward JP Application No. 2013-101632; 6 pages.
Japanese Notice of Reasons for Rejection mailed on Feb. 16, 2010, directed at Japanese Application No. 2003-350647; 16 pages.
Final Rejection drafted Jun. 24, 2010, directed to Japanese Patent Application No. 2003-350647; 1 page.
Japanese Notice of Reasons for Rejection mailed Mar. 2, 2010, directed to Japanese Patent Application No. 2003-364596; 14 pages.
Final Rejection drafted Jun. 25, 2010, directed to Japanese Patent Application No. 2003-364596; 1 page.
Notice of Reasons for Rejection drafted Dec. 1, 2010, directed to Japanese Patent Application No. 2003-364596; 3 pages.
Notice of Reasons for Rejection dated Feb. 15, 2011, directed to Japanese Application No. 2003-364596.
Notice of Reasons for Rejection dated Jun. 14, 2011, directed to Japanese Application No. 2003-128154.
Notice of Reasons for Rejection drafted Feb. 26, 2009, directed to Japanese Patent Application No. 2003-128154; 3 pages.
Final Rejection drafted Jul. 28, 2010, directed to Japanese Patent Application No. 2003-128154; 1 page.
Interrogation drafted Sep. 15, 2010, directed to Japanese Patent Application No. 2003-128154; 6 pages.
Notice of Reasons for Rejection mailed Apr. 10, 2012, directed to Japanese Patent Application No. 2009-245042; 6 pages.
Notice of Reasons for Rejection mailed Jan. 8, 2013, directed to Japanese Application No. 2009-245042; 9 pages.
Decision of Dismissal of Amendment mailed Dec. 10, 2013, directed to JP Application No. 2009-245042; 5 pages.
Decision of Rejection mailed Dec. 10, 2013, directed to JP Application No. 2009-245042; 4 pages.
Notice of Reasons for Rejection drafted Oct. 7, 2009, directed to Japanese Patent Application No. 2004-530609 pages.
Final Rejection drafted Jan. 29, 2010, directed to Japanese Patent Application No. 2004-530609; 3 pages.
Notice of Reasons for Rejection drafted Apr. 15, 2011 directed to Japanese Patent Application No. 2009-276076; 3 pages.
Japanese Office Action dated Jul. 12, 2011, directed to Japanese Application No. 2009-276076.
Notice of Reasons for Rejection drafted Apr. 15, 2011 directed to Japanese Patent Application No. 2009-276077; 3 pages.
Final Rejection drafted Jul. 15, 2011, directed to Japanese Patent Application No. 2009-276077; 2 pages.
Notice of Preliminary Rejection mailed Aug. 24, 2010, directed to Korean Patent Application No. 10-2005-7003082; 6 pages.
Notice of Preliminary Rejection dated Jun. 11, 2012, directed to Korean Application No. 10-2012-7010592; 8 pages.
Notice of Preliminary Rejection dated Mar. 8, 2011 directed to counterpart Korean application No. 10-2005-7020923; 6 pages.
Korean Notice of Preliminary Rejection directed to Korean Patent Application No. 10-2008-7019081, issued May 31, 2010; 2 pages.
Korean Notice of Preliminary Rejection mailed Oct. 25, 2011, directed to Korean Application No. Oct. 2011-7021027; 6 pages.
Written Opinion mailed May 10, 2006, directed to Singapore Patent Application No. SG-200507944-7; 6 pages.

Preliminary Notice of the First Office Action dated Dec. 9, 2004, directed to Taiwan Patent Application No. 092123099; 4 pages.
Back et al., "Simulation Study of Process Latitude for Liquid Immersion Lithography," Optical Microlithography XVI, vol. 5040 (2003). pp. 1620-1630.
Feuer et al. "Projection Photolithography-Lithoff Techniques for Production of 0.2 μm Metal Patterns," IEEE Transactions on Electron Devices, vol. 28, No. 11. pp. 1375-1378. Nov. 1981.
Hafeman et al. "Simulation of Imaging and Stray Light Effects in Immersion Lithography," Optical Microlithography XVI, vol. 5040 (2003). pp. 700-712.
Kang H., et al. (2001). Optical Lithography at a 126nm Wavelength. *Emerging Lithographic Technologies*. Proceedings of SPIE. 4343:797-801.
Kawata et al., "Fabrication of 0.2 μm Fine Patterns Using Optical Projection Lithography with and Oil Immersion Lens." Jpn. J. Appl. Phys. vol. 31. pp. 4174-4417; part 1, No. 128 Dec. 1992.
Kawata, et al. "Optical Projection Lithography Using Lenses wih Numerical Apertures Great than Unity." Microelectronic Engineering 9 (1989). pp. 31-36.
Ohmura, Y. et al. (2003). "Catadioptric Lens Development for DUW and VUW Projection Optics." Optical Microlithography XVI. Proceedings of SPIE. 5040:781-788.
Owa, S. et al. (2003). "Immersion Lithography; Its Potential Performance and Issues." Optical Microlithography XVI. Proceedings of SPIE. 5040:724-733.
Owen et al. "1/8 μm optical lithography" J. Vac. Sci. Technol. B. 10(6), Nov./Dec. 1992, pp. 3032-3036.
Smith, et al. "Water Immersion Optical Lithography for the 45nm Node." Optical Microlithography XVI, vol. 5040 (2003) pp. 679-689.
Switkes, et al., "Resolution Enhancement of 157-nm Lithography by Liquid Immersion," Massachusetts Institute of Technology; 7 pages.
Ulrich et al. "The Development of Dioptric Projection Lenses for DUV Lithography," International Optical Design Conference 2002, vol. 4832 (2002), pp. 158-169.
Shafer, D. et al., U.S. Appl. No. 60/536,248, filed Jan. 14, 2004.
Expert's Testimony of Professor Linqun Sun; 116 pages.
Request for Invalidation of Patent dated Sep. 29, 2013, directed to CN Patent No. ZL200480012069.0; 117 pages.
Judgment, Paper No. 49, Interference No. 105,678 [Exhibit Zeiss 1003].
Judgment, Paper No. 157, Interference No. 105,749 [Exhibit Zeiss 1004].
Judgment, Paper No. 41, Interference No. 105,753 [Exhibit Zeiss 1005].
Judgment, Paper No. 291, Interference No. 105,834 [Exhibit Zeiss 1006].
M. Switkes and M. Rothschild, "Resolution Enhancement of 157-nm Lithography by Liquid Immersion," Proc. SPIE vol. 4691, pp. 460-465 (2002) [Exhibit Zeiss 1010].
Willi Ulrich et al., "The Development of Dioptric Projection Lenses for DUV Lithography," Proc. SPIE vol. 4832, pp. 158-169 (2002) [Exhibit Zeiss 1011].
Satoru Asai et al., "Resolution Limit for Optical Lithography Using Polarized Light Illumination," *Jpn. J. Appl. Phys* vol. 32, pp. 5863-5866 (1993) [Exhibit Zeiss 1013].
Certified English translation of PCT Patent Publication WO-99/49504 [Exhibit Zeiss 1015].
Exert Declaration of Richard C. Juergens [Exhibit Zeiss 1016].
Wikipedia, "Optical power," https://en.wikipedia.org/wiki/Optical_power (downloaded May 20, 2013) [Exhibit Zeiss 1017].
Willi Ulrich et al.,"Trends in Optical Design of Projection Lenses for UV- and EUV-Lithography," *Proc. SPIE* vol. 4146, pp. 13-24 (2000) [Exhibit Zeiss 1018].
Eugene Hecht, *Optics* (4th ed.), Addison Wesley (2002), pp. 171-173. [Exhibit Zeiss 1019].
Wikipedia, "Optical axis," https://en.wikipedia.org/wiki/Optical_axis (downloaded May 20, 2013) [Exhibit Zeiss 1020].
File History Excerpts from U.S. Appl. No. 11/266,288 [Exhibit Zeiss 1021].

(56) References Cited

OTHER PUBLICATIONS

File History Excerpts from U.S. Appl. No. 11/513,160 [Exhibit Zeiss 1022].
Decision, Paper No. 40, Interference No. 105,753 [Exhibit Zeiss 1023].
Wikipedia, "Refractive Index," http://en.wikipedia.org/wiki/Refractive_index (downloaded May 20, 2013) [Exhibit Zeiss 1024].
Omura Reply 1, Paper No. 200, Interference No. 105,834 [Exhibit Zeiss 1026].
*Curriculum Vitae* of Richard C. Juergens [Exhibit Zeiss 1028].
Code V sequence data [Exhibit Zeiss 1029].
Petition for Inter Partes Review of Claims 1-3, 8-12, 16-20, 23-26, and 29-33 of U.S. Pat. No. 7,348,575 filed on Jun. 17, 2013, with the U.S. Patent Trial and Appeal Board; 66 pages.
Certified English Translation of Japanese Unexamined Patent Publication No. JP2003-128154 [Exhibit Zeiss 1107].
Certified English Translation of Japanese Unexamined Patent Publication No. JP2003-350647 [Exhibit Zeiss 1108].
Certified English Translation of Japanese Unexamined Patent Publication No. JP2003-364596 [Exhibit Zeiss 1109].
Certified English Translation of JP Patent Application Publication No. JP2003-114387 ("Omura '387") [Exhibit Zeiss 1112].
Simon and Schuster, "New World Dictionary of the American Language", Second College Edition, 1980, p. 1552 [Exhibit Zeiss 1121].
J.R. Sheats and B.W. Smith, "Microlithography: Science and Technology", Marcel Dekker, Inc, Chapter 1, 1998, p. 1-p. 43 [Exhibit Zeiss 1127].
Code V Sub-routines [Exhibit Zeiss 1131].
Petition for Inter Partes Review of Claims 55-67 of U.S. Pat. No. 7,348,575 filed on Jun. 17, 2013, with the U.S. Patent Trial and Appeal Board; 65 pages.
Notice of Reasons for Rejection mailed Aug. 27, 2013, directed to Japanese Application No. 2011-252890; 10 pages.
Kidger, M.J. (2002). *Fundamental Optical Design*. SPIE Press—The International Society for Optical Engineering: Bellingham, WA, pp. 27-36.
Omura, U.S. Office Action mailed Oct. 1, 2014, directed to U.S. Appl. No. 11/513,160; 12 pages.
Omura, U.S. Notice of Allowance mailed Sep. 15, 2014, directed to U.S. Appl. No. 12/379,415; 10 pages.
Omura, U.S. Notice of Allowance mailed Oct. 2, 2014, directed to U.S. Appl. No. 13/275,760; 9 pages.
Notice of Reasons for Rejection mailed Aug. 5, 2014, directed to JP Application No. 2013-223545; 8 pages.
Notice of Deficiencies dated Apr. 22, 2014, directed to IL Application No. 196080; 12 pages.
Omura, U.S. Notice of Allowance mailed Nov. 13, 2014, directed to U.S. Appl. No. 12/379,415; 8 pages.
Omura, U.S. Notice of Allowance mailed Nov. 10, 2014, directed to U.S. Appl. No. 13/275,760; 8 pages.
Observations for Reexamination, Invalidation Declaration dated May 19, 2014, directed to CN Application No. ZL200710306116.8; 110 pages.
Observations for Reexamination, Invalidation Procedure dated May 19, 2014, directed to CN Application No. ZL200810085910.9; 149 pages.
Extended European Search Report mailed Jun. 25, 2014, directed to European Patent Application No. 13175504.3; 10 pages.
Extended European Search Report mailed Jun. 25, 2014, directed to European Patent Application No. 13185917.5; 10 pages.
Extended European Search Report mailed Jun. 25, 2014, directed to European Patent Application No. 13185918.3; 10 pages.
Extended European Search Report mailed Jun. 25, 2014, directed to European Patent Application No. 13185919.1; 10 pages.
Decision entered Dec. 16, 2013 before Blankenship, H. B. et al. with the U.S. Patent Trial and Appeal Board for Case IPR2013-00362, U.S. Pat. No. 7,348,575 B2, *Carl Zeiss SMT GMBH*, Petitioner, v. *Nikon Corporation*, Patent Owner, Paper 10; 21 pages.
Final Written Decision entered Nov. 4, 2014 before Blankenship, H. B. et al. with the U.S. Patent Trial and Appeal Board for Case IPR2013-00362, U.S. Pat. No. 7,348,575 B2, *Carl Zeiss SMT GMBH*, Petitioner, v. *Nikon Corporation*, Patent Owner, Paper 41; 32 pages.
Petitioner's Reply to Patent Owner's Response dated May 28, 2014, with the U.S. Patent Trial and Appeal Board for Case IPR2013-00362, U.S. Pat. No. 7,348,575 B2, *Carl Zeiss SMT GMBH*, Petitioner, v. *Nikon Corporation*, Patent Owner; 22 pages.
Decision entered Dec. 16, 2013 before Blankenship, H. B. et al. with the U.S. Patent Trial and Appeal Board for Case IPR2013-00363, U.S. Pat. No. 7,348,575 B2, *Carl Zeiss SMT GMBH*, Petitioner, v. *Nikon Corporation*, Patent Owner, Paper 7; 19 pages.
Final Written Decision entered Nov. 4, 2014 before Blankenship, H. B. et al. with the U.S. Patent Trial and Appeal Board for Case IPR2013-00363, U.S. Pat. No. 7,348,575 B2, *Carl Zeiss SMT GMBH*, Petitioner, v. *Nikon Corporation*, Patent Owner, Paper 34; 20 pages.
Petitioner's Reply to Patent Owner's Response dated May 28, 2014, with the U.S. Patent Trial and Appeal Board for Case IPR2013-00363, U.S. Pat. No. 7,348,575 B2, *Carl Zeiss SMT GMBH*, Petitioner, v. *Nikon Corporation*, Patent Owner; 23 pages.
Omura, U.S. Office Action mailed Oct. 21, 2015, directed to U.S. Appl. No. 13/889,780, 12 pages.
Omura, U.S. Office Action mailed Dec. 7, 2015, directed to U.S. Appl. No. 11/513,160; 13 pages.
Notice of Reasons for Rejection dated Jan. 5, 2016, directed to JP Application No. 2015-040255; 15 pages.
Notice of Deficiencies dated Jan. 18, 2016, directed to IL Application No. 196080; 9 pages.
Omura, U.S. Office Action mailed Mar. 11, 2016, directed to U.S. Appl. No. 14/227,349, 25 pages.
Examination Report dated Mar. 30, 2016, directed to IN Application No. 2651/DELNP/2009; 3 pages.
Examination Report dated Mar. 30, 2016, directed to IN Application No. 2655/delnp/2009; 3 pages.
Omura, U.S. Office Action mailed Jun. 24, 2016, directed to U.S. Appl. No. 11/513,160; 12 pages.
Notice of Reasons for Rejection dated Aug. 9, 2016, directed to JP Application No. 2015-233838; 9 pages.
Examination Report dated Sep. 7, 2016, directed to IN Application No. 2654/DELNP/2009; 10 pages.
Omura, U.S. Office Action mailed Dec. 1, 2016, directed to U.S. Appl. No. 14/227,349; 24 pages.
Omura, U.S. Office Action mailed Feb. 1, 2017, directed to U.S. Appl. No. 11/513,160; 14 pages.

\* cited by examiner

Fig.8

TRANSVERSE ABERRATION

MERIDIONAL          SAGITTAL

Y = 17.0 mm
0.0010 / -0.0010     0.0010 / -0.0010

Y = 14.25 mm
0.0010 / -0.0010     0.0010 / -0.0010

Y = 11.5 mm
0.0010 / -0.0010     0.0010 / -0.0010 (mm)

- - - - - - - - - - 193.3061 nm
————————— 193.3060 nm
— · — · — · — · 193.3059 nm

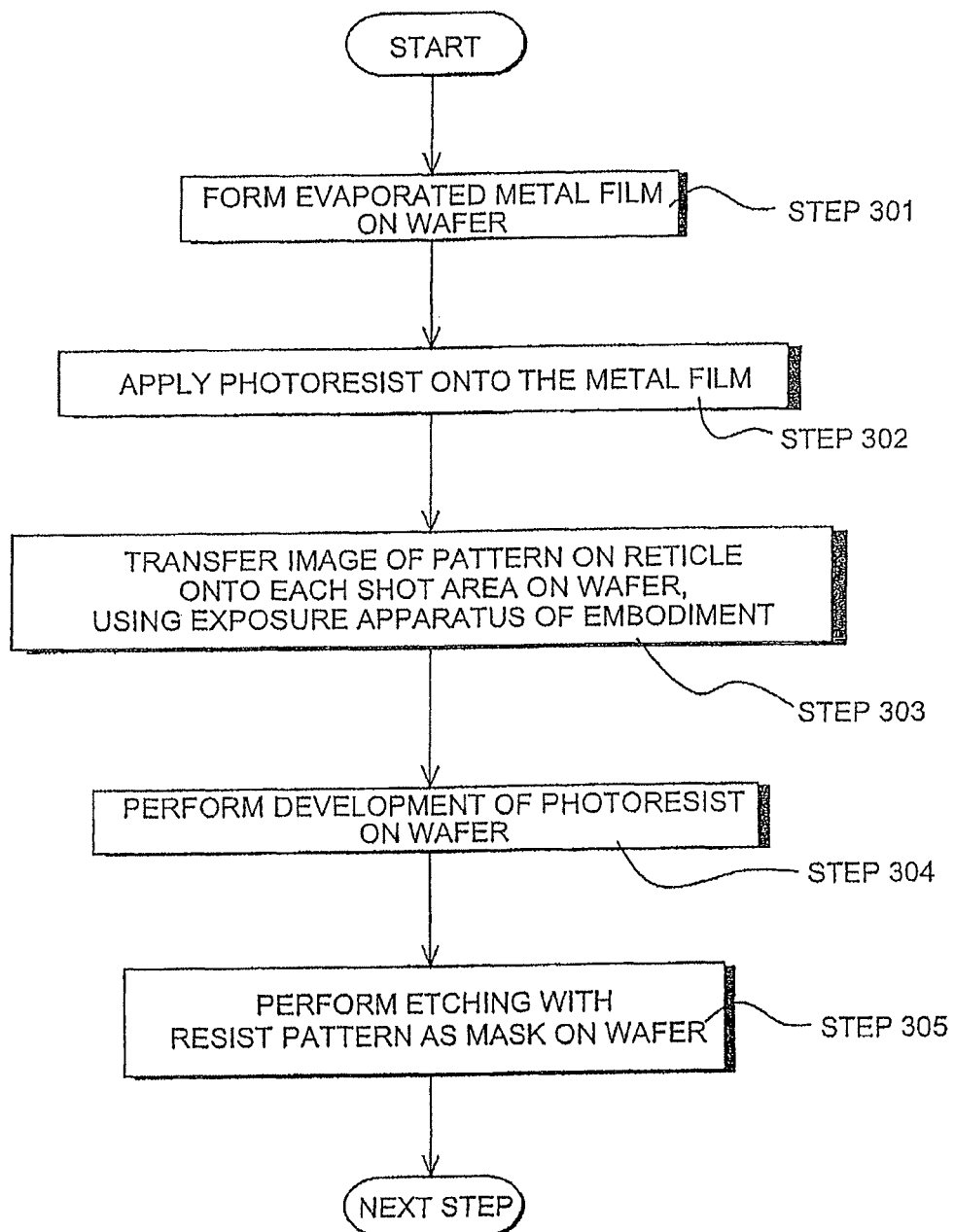

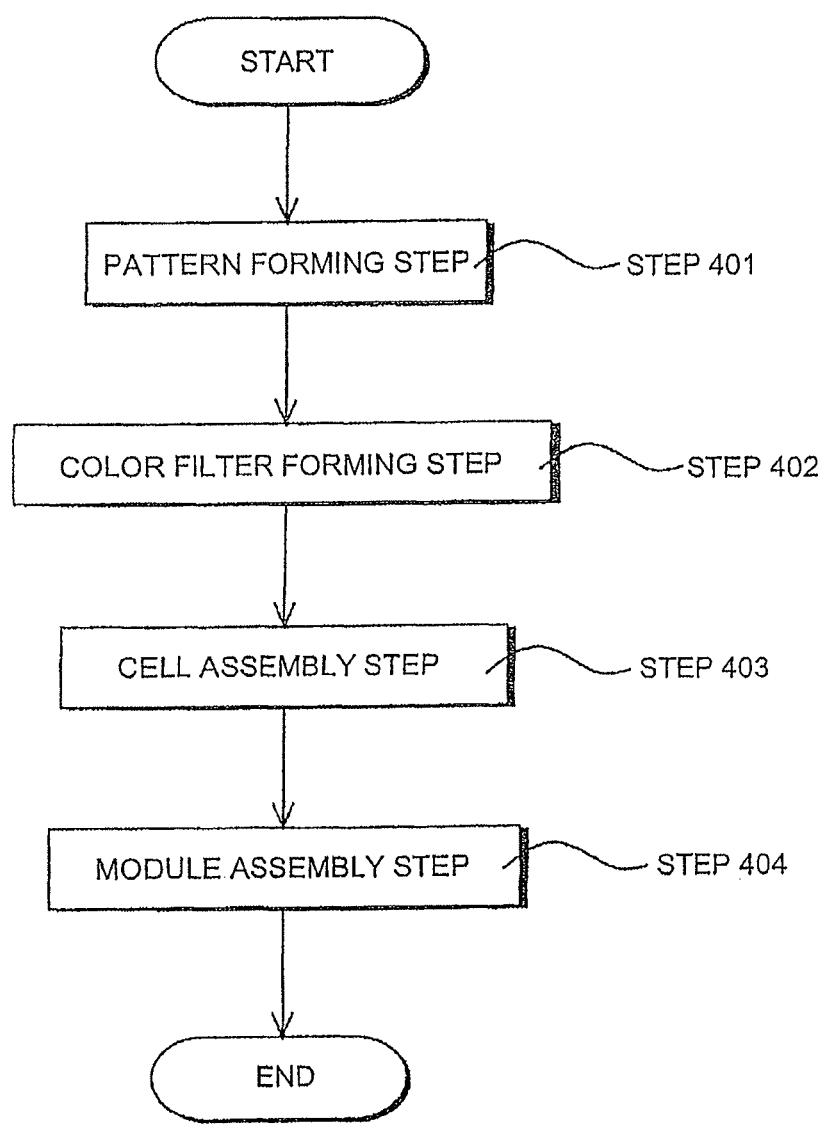

REDUCING IMMERSION PROJECTION OPTICAL SYSTEM

CROSS-REFERENCE TO RELATED APPLICATIONS

This is a continuation of U.S. patent application Ser. No. 12/379,415 filed Feb. 20, 2009, which is a continuation of U.S. patent application Ser. No. 11/882,208 filed Jul. 31, 2007, which is a continuation of U.S. patent application Ser. No. 11/266,288 filed Nov. 4, 2005, which in turn is a continuation-in-part of International Application No. PCT/JP2004/006417 filed May 6, 2004. Application Ser. No. 11/266,288 also claims the benefit of U.S. Provisional Application No. 60/721,582 filed Sep. 29, 2005.

FIELD OF THE INVENTION

The present invention relates to a catadioptric projection optical system, exposure apparatus, and exposure method and, more particularly, to a high-resolution catadioptric projection optical system suitable for exposure apparatus used in production of semiconductor devices, liquid-crystal display devices, etc. by photolithography.

RELATED BACKGROUND ART

The photolithography for production of the semiconductor devices and others is implemented using a projection exposure apparatus for projecting a pattern image of a mask (or a reticle) through a projection optical system onto a wafer (or a glass plate or the like) coated with a photoresist or the like. The resolving power (resolution) required for the projection optical system of the projection exposure apparatus is becoming increasingly higher and higher with increase in integration degree of the semiconductor devices and others.

As a result, in order to satisfy the requirements for the resolving power of the projection optical system, it is necessary to shorten the wavelength λ of illumination light (exposure light) and to increase the image-side numerical aperture NA of the projection optical system. Specifically, the resolution of the projection optical system is expressed by k·λ/NA (where k is the process coefficient). The image-side numerical aperture NA is represented by n·sin θ, where n is a refractive index of a medium (normally, gas such as air) between the projection optical system and the image plane and θ a maximum angle of incidence to the image plane.

In this case, if the maximum incidence angle θ is increased in order to increase the numerical aperture NA, it will result in increasing the input angle to the image plane and the output angle from the projection optical system, so as to increase reflection loss on optical surfaces and thus fail to secure a large effective image-side numerical aperture. For this reason, there is the known technology of increasing the numerical aperture NA by filling a medium like a liquid with a high refractive index in the optical path between the projection optical system and the image plane.

However, application of this technology to the ordinary dioptric projection optical systems caused such disadvantages that it was difficult to well correct for chromatic aberration and to satisfy the Petzval's condition to well correct for curvature of field, and that an increase in the scale of the optical system was inevitable. In addition, there was another disadvantage that it was difficult to secure a large effective image-side numerical aperture while well suppressing the reflection loss on optical surfaces.

SUMMARY OF THE INVENTION

A first object of the embodiment is to provide a relatively compact projection optical system having excellent imaging performance as well corrected for various aberrations, such as chromatic aberration and curvature of field, and being capable of securing a large effective image-side numerical aperture while well suppressing the reflection loss on optical surfaces.

In the case where the projection optical system is composed of only reflecting optical members and in the case where the projection optical system is composed of a combination of refracting optical members with reflecting optical members, with increase in the numerical aperture, it becomes more difficult to implement optical path separation between a beam entering a reflecting optical member and a beam reflected by the reflecting optical member and it is infeasible to avoid an increase in the scale of the reflecting optical member, i.e., an increase in the scale of the projection optical system.

In order to achieve simplification of production and simplification of mutual adjustment of optical members, it is desirable to construct a catadioptric projection optical system of a single optical axis; in this case, with increase in the numerical aperture, it also becomes more difficult to achieve the optical path separation between the beam entering the reflecting optical member and the beam reflected by the reflecting optical member, and the projection optical system increases its scale.

A second object of the embodiment is to achieve a large numerical aperture, without increase in the scale of optical members forming a catadioptric projection optical system.

A third object of the embodiment is to provide an exposure apparatus and exposure method capable of performing an exposure to transcribe a fine pattern with high accuracy through a projection optical system having excellent imaging performance and having a large effective image-side numerical aperture and therefore a high resolution. In order to achieve the above-described first object, a projection optical system according to a first aspect of the embodiment is a catadioptric projection optical system for forming a reduced image of a first surface on a second surface, the projection optical system comprising at least two reflecting mirrors, and a boundary lens whose surface on the first surface side has a positive refracting power, wherein, where a refractive index of an atmosphere in an optical path of the projection optical system is 1, an optical path between the boundary lens and the second surface is filled with a medium having a refractive index larger than 1.1, wherein every transmitting member and every reflecting member with a refracting power constituting the projection optical system are arranged along a single optical axis, and the projection optical system having an effective imaging area of a predetermined shape not including the optical axis.

In order to achieve the above-described second object, a projection optical system according to a second aspect of the embodiment is a catadioptric projection optical system for forming an image of a first surface on a second surface, the projection optical system comprising:

a first imaging optical system comprising two mirrors, for forming an intermediate image of the first surface; and a second imaging optical system for forming the intermediate image on the second surface, wherein the second imaging optical system comprises the following components in order of passage of a ray from the intermediate image side:

a first field mirror of a concave shape;
a second field mirror;
a first lens unit comprising at least two negative lenses and having a negative refracting power;
a second lens unit having a positive refracting power;
an aperture stop; and
a third lens unit having a positive refracting power.

In order to achieve the above-described second object, a projection optical system according to a third aspect of the embodiment is a catadioptric projection optical system for forming an image of a first surface on a second surface, the projection optical system comprising:

a first unit disposed in an optical path between the first surface and the second surface and having a positive refracting power;
a second unit disposed in an optical path between the first unit and the second surface and comprising at least four mirrors;
a third unit disposed in an optical path between the second unit and the second surface, comprising at least two negative lenses, and having a negative refracting power; and
a fourth unit disposed in an optical path between the third unit and the second surface, comprising at least three positive lenses, and having a positive refracting power, wherein an intermediate image is formed in the second unit and wherein an aperture stop is provided in the fourth unit.

In order to achieve the above-described second object, a projection optical system according to a fourth aspect of the embodiment is a catadioptric projection optical system for forming an image of a first surface on a second surface, the projection optical system comprising:

a first imaging optical system comprising at least six mirrors, for forming a first intermediate image and a second intermediate image of the first surface; and
a second imaging optical system for relaying the second intermediate image onto the second surface.

In order to achieve the above-described third object, an exposure apparatus according to a fifth aspect of the embodiment is an exposure apparatus for effecting an exposure of a pattern formed on a mask, onto a photosensitive substrate, the exposure apparatus comprising:

an illumination system for illuminating the mask set on the first surface; and
the projection optical system according to any one of the above-described aspects, for forming an image of the pattern formed on the mask, on the photosensitive substrate set on the second surface.

In order to achieve the above-described third object, an exposure method according to a sixth aspect of the embodiment is an exposure method of effecting an exposure of a pattern formed on a mask, onto a photosensitive substrate, the exposure method comprising:

an illumination step of illuminating the mask on which the predetermined pattern is formed; and
an exposure step of performing an exposure of the pattern of the mask set on the first surface, onto the photosensitive substrate set on the second surface, using the projection optical system as set forth in the above.

The present invention will be more fully understood from the detailed description given hereinbelow and the accompanying drawings, which are given by way of illustration only and are not to be considered as limiting the embodiment.

Further scope of applicability of the embodiment will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 8 is a diagram showing the transverse aberration in the second example.

FIG. 20 is a flowchart of a method of producing semiconductor devices as microdevices.

FIG. 21 is a flowchart of a method of producing a liquid crystal display device as a microdevice.

DETAILED DESCRIPTION OF THE PREFERRED EMBODIMENTS

Figure 1:
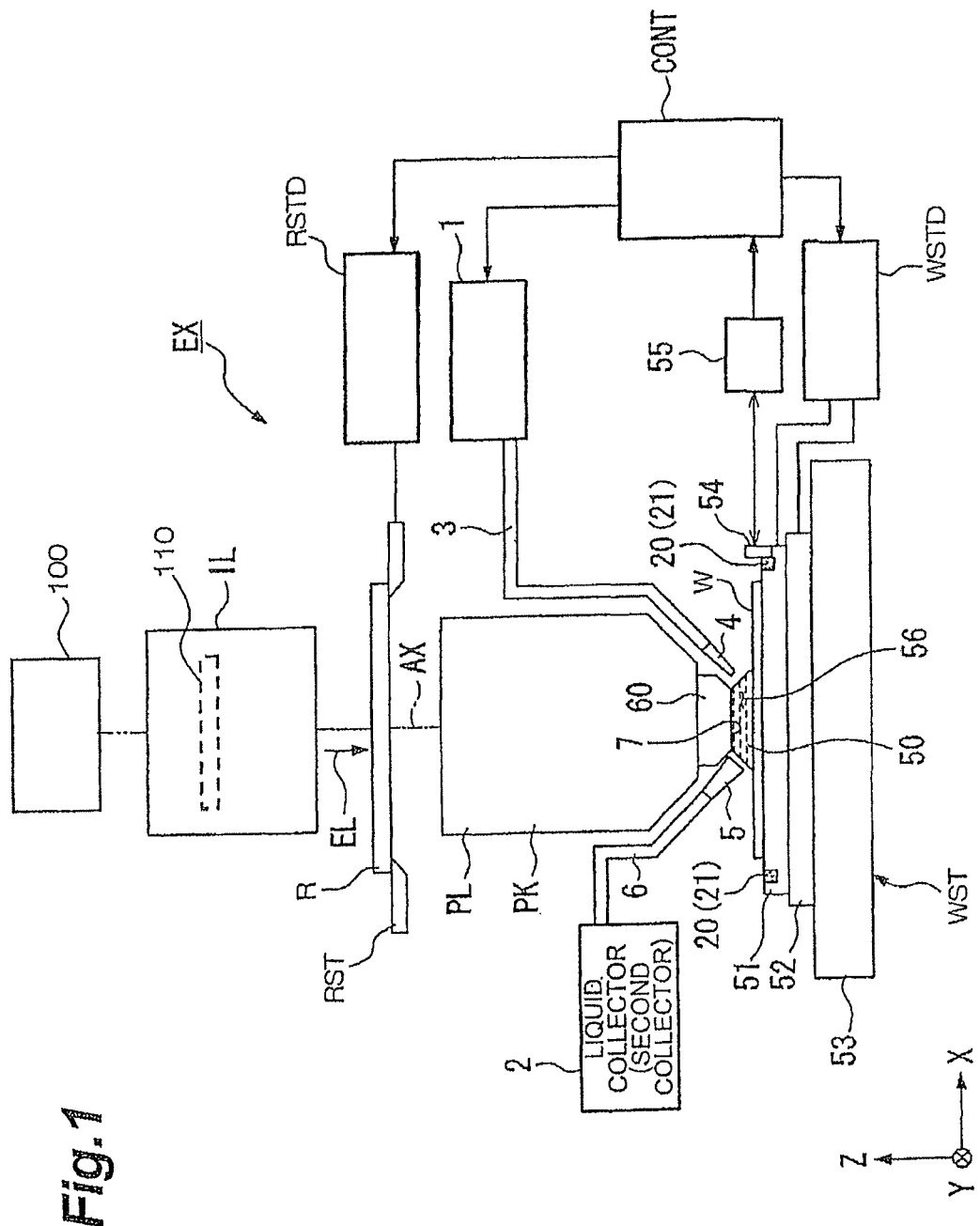
FIG. 1 is an illustration schematically showing a configuration of an exposure apparatus according to an embodiment of the embodiment.

In the projection optical system according to the first aspect of the embodiment, the medium having the refractive index larger than 1.1 is interposed in the optical path between the boundary lens and the image plane (second surface), thereby increasing the image-side numerical aperture NA. In passing, "Resolution Enhancement of 157-nm Lithography by Liquid Immersion" reported in "Massachusetts Institute of Technology" in "SPIE2002 Microlithography" by Mr. M. Switkes and Mr. M. Rothschild describes Fluorinert (Perfluoropolyethers: trade name of 3M, USA) and Deionized Water as candidates for media having the required transmittance for light of wavelength λ of not more than 200 nm.

In the projection optical system according to the first aspect of the embodiment, the optical surface on the object side (first surface side) of the boundary lens is provided with the positive refracting power, whereby the reflection loss is reduced on this optical surface and, in turn, the large effective image-side numerical aperture can be secured. In the optical system having the high-refractive-index material like liquid as the medium on the image side, it is feasible to increase the effective image-side numerical aperture to not less than 1.0 and, in turn, to enhance the resolution. However, where the projection magnification is constant, the object-side numerical aperture also increases with increase in the image-side numerical aperture; therefore, if the projection optical system is constructed of only refracting members, it will be difficult to satisfy the Petzval's condition and it will result in failing to avoid the increase in the scale of the optical system.

Therefore, the projection optical system according to the first aspect of the embodiment adopts the catadioptric system of the type comprising at least two reflecting mirrors, in which every transmitting member and every reflecting member with a refracting power (power) are arranged along the single optical axis and which has the effective imaging area of the predetermined shape not including the optical axis. In the projection optical system of this type, for example, through action of a concave reflecting mirror, it is feasible to well correct for the chromatic aberration and to readily satisfy the Petzval's condition to well correct for the curvature of field, and the scale of the optical system can be reduced.

The projection optical system of this type has the configuration wherein every transmitting member (lenses or the like) and every reflecting member with a power (concave reflecting mirrors or the like) are arranged along the single optical axis, which is preferable because the degree of difficulty in production is considerably lower than in a multi-axis configuration wherein the optical members are arranged along multiple optical axes. However, in the case of the single-axis configuration wherein the optical members are arranged along the single optical axis, the chromatic aberration tends to be difficult to well correct for, but this problem of correction for chromatic aberration can be overcome, for example, by use of laser light with a narrowed spectral width like ArF laser light.

In this manner, the first aspect of the embodiment can realize the relatively compact projection optical system having the excellent imaging performance as well corrected for the various aberrations such as chromatic aberration and curvature of field and being capable of securing the large effective image-side numerical aperture while well suppressing the reflection loss on the optical surfaces. Therefore, an exposure apparatus and exposure method using the projection optical system according to the first aspect of the embodiment are able to perform an exposure of a fine pattern to transcribe the pattern through the projection optical system having the excellent imaging performance and the large effective image-side numerical aperture and therefore the high resolution.

In the first aspect of the embodiment, the projection optical system is preferably arranged to have an even number of reflecting mirrors, i.e., to form the image of the first surface on the second surface through an even number of reflections. When the projection optical system in this configuration is applied, for example, to the exposure apparatus and exposure method, not a mirror image (a flipped image) but an unmirrored (unflipped) image (erect image or inverted image) of the mask pattern, is formed on the wafer, whereby the ordinary masks (reticles) can be used as in the case of the exposure apparatus equipped with the dioptric projection optical system.

In the first aspect of the embodiment, the projection optical system preferably comprises: a first imaging optical system comprising two mirrors, which forms an intermediate image of the first surface; and a second imaging optical system, which forms the intermediate image on the second surface; the second imaging optical system preferably comprises the following components in order of passage of a ray from the intermediate image side: a first field mirror of a concave shape; a second field mirror; a first lens unit comprising at least two negative lenses and having a negative refracting power; a second lens unit having a positive refracting power; an aperture stop; and a third lens unit having a positive refracting power.

In this configuration, the intermediate image of the first surface is formed in the first imaging optical system, and it is thus feasible to readily and securely achieve the optical path separation between the beam toward the first surface and the beam toward the second surface, even in the case where the numerical apertures are increased of the catadioptric projection optical system. Since the second imaging optical system comprises the first lens unit having the negative refracting power, the total length of the catadioptric projection optical system can be reduced, and adjustment for satisfying the Petzval's condition can be readily performed. Furthermore, the first lens unit relieves variation due to the difference of field angles of the beam expanded by the first field mirror, so as to suppress occurrence of aberration. Therefore, the good imaging performance can be achieved throughout the entire region in the exposure area, even in the case where the object-side and image-side numerical apertures of the catadioptric projection optical system are increased in order to enhance the resolution.

In the above-described configuration, preferably, the first imaging optical system comprises a fourth lens unit having a positive refracting power, a negative lens, a concave mirror, and an optical path separating mirror; and the first imaging optical system is arranged as follows: light traveling in the first imaging optical system passes through the fourth lens unit and the negative lens, is then reflected by the concave mirror, and passes again through the negative lens to be guided to the optical path separating mirror; the light reflected by the optical path separating mirror is reflected by the first field mirror and the second field mirror and thereafter directly enters the first lens unit in the second imaging optical system.

In this configuration, the projection optical system can be telecentric on the first surface side because the first imaging optical system comprises the fourth lens unit having the positive refracting power. Since the first imaging optical system comprises the negative lens and the concave mirror, adjustment for satisfying the Petzval's condition can be readily performed by adjusting the negative lens and the concave mirror.

In the first aspect of the embodiment, the projection optical system preferably comprises a first imaging optical system comprising at least six mirrors for forming a first intermediate image and a second intermediate image of the first surface; and a second imaging optical system, which relays the second intermediate image onto the second surface.

Since this configuration comprises at least six mirrors, the first intermediate image and the second intermediate image can be formed without increase in the total length of the catadioptric projection optical system, and the good imaging performance can be achieved throughout the entire region in the exposure area, even in the case where the object-side and the image-side numerical apertures of the catadioptric projection optical system are increased in order to enhance the resolution.

In the aforementioned configuration, preferably, the first intermediate image is formed between a mirror that light emerging from the first surface enters second and a mirror that the light emerging from the first surface enters fourth, out of the at least six mirrors in the first imaging optical system.

In this configuration, the first intermediate image is formed between the mirror that the light emerging from the first surface enters second and the mirror that the light emerging from the first surface enters fourth. Therefore, even in the case where the object-side and image-side numerical apertures of the catadioptric projection optical system are increased in order to enhance the resolution, it is feasible to readily and securely achieve the optical path separation between the beam toward the first surface and the beam toward the second surface and to achieve the good imaging performance throughout the entire region in the exposure area.

Incidentally, since it is necessary to form the intermediate image near the pupil position in order to construct the catadioptric projection optical system of the single optical axis according to the first aspect of the embodiment, it is desirable to construct the projection optical system as a reimaging optical system. In order to avoid mechanical interference between optical members while achieving the optical path separation with the intermediate image being formed near the pupil position of the first imaging, the pupil diameter of the first imaging needs to be set as small as possible even in the case where the object-side numerical aperture is large; therefore, the first imaging optical system with the small numerical aperture is desirably a catadioptric system.

In the first aspect of the embodiment, therefore, the projection optical system preferably comprises: a first imaging optical system comprising at least two reflecting mirrors, which forms an intermediate image of the first surface; and a second imaging optical system, which forms a final image on the second surface on the basis of a beam from the intermediate image. In this case, specifically, the first imaging optical system can be constructed using a first lens unit with a positive refracting power, a first reflecting mirror disposed in an optical path between the first lens unit and the intermediate image, and a second reflecting mirror disposed in an optical path between the first reflecting mirror and the intermediate image.

Preferably, the first reflecting mirror is a concave reflecting mirror disposed near a pupil plane of the first imaging optical system, and at least one negative lens is disposed in back-and-forth optical path (a double optical path) formed by the concave reflecting mirror. By this configuration wherein the negative lens is disposed in the back-and-forth optical path formed by the concave reflecting mirror in the first imaging optical system, it becomes feasible to well correct for the curvature of field while readily satisfying the Petzval's condition, and to well correct for the chromatic aberration as well.

The negative lens in the back-and-forth optical path is desirably disposed near the pupil position, but the clear aperture of the negative lens becomes smaller because the pupil diameter of the first imaging needs to be kept as small as possible; therefore, the fluence (=energy amount per unit area and unit pulse) tends to become higher at the negative lens. Therefore, if the negative lens is made of silica, a local index change or compaction will become likely to occur due to volumetric shrinkage under irradiation with laser light, and, in turn, the imaging performance of the projection optical system will degrade.

Likewise, the boundary lens located in the vicinity of the image plane also has a small clear aperture and the fluence is likely to become high there. Therefore, if the boundary lens is made of silica, it will result in likely causing the compaction and degrading the imaging performance. In the first aspect of the embodiment, the degradation of imaging performance due to the compaction can be avoided by a configuration wherein the negative lens disposed in the back-and-forth optical path formed by the concave reflecting mirror in the first imaging optical system and the boundary lens disposed in the vicinity of the image plane in the second imaging optical system are made of fluorite.

In the first aspect of the embodiment, the projection optical system desirably satisfies Condition (1) below. In Condition (1), F1 is the focal length of the first lens unit, and $Y_0$ a maximum image height on the second surface.

$$5 < F1/Y_0 < 15 \tag{1}$$

The range above the upper limit of Condition (1) is undesirable because the pupil diameter of the first imaging is too large to avoid mechanical interference between optical members as described above. On the other hand, the range below the lower limit of Condition (1) is undesirable because there occurs a large difference depending upon object heights among angles of incident light to the reflecting mirror (field angle difference) and it becomes difficult to achieve correction for aberrations such as coma and curvature of field. For better demonstrating the effect of the embodiment, the upper limit of Condition (1) is more preferably set to 13 and the lower limit thereof to 7.

In the first aspect of the embodiment, the first lens unit preferably comprises at least two positive lenses. This configuration permits the positive refracting power of the first lens unit to be set to a large value to readily satisfy Condition (1) and it is thus feasible to well correct for coma, distortion, astigmatism, and so on.

It is difficult to produce a reflecting mirror with high reflectance and high endurance, and use of many reflecting surfaces will result in loss in optical quantity. In the first aspect of the embodiment, therefore, where the projection optical system is applied, for example, to the exposure apparatus and exposure method, the second imaging optical system is preferably a dioptric system comprised of only a plurality of transmitting members, in view of improvement in throughput.

Fluorite is a crystal material having intrinsic birefringence, and a transmitting member made of fluorite is considerably affected by birefringence, particularly, for light of wavelength of not more than 200 nm. For this reason, an optical system including such fluorite transmitting members needs to suppress the degradation of the imaging performance due to birefringence by combining the fluorite transmitting members of different orientations of crystal axes, but even such countermeasures cannot completely suppress the performance degradation due to birefringence.

Furthermore, it is known that the refractive index distribution inside fluorite has high-frequency components, and the variation in refractive indices including such high-frequency components causes flare to easily degrade the imaging performance of the projection optical system; therefore, it is preferable to avoid use of fluorite as much as possible. For decreasing use of fluorite as much as possible, therefore, the embodiment is preferably arranged so that 70% or more of the transmitting members constituting the second imaging optical system of the dioptric system are made of silica.

In the first aspect of the embodiment, desirably, the effective imaging area has an arcuate shape and the projection optical system satisfies Condition (2) below. In Condition (2), R is a radius of curvature of an arc defining the effective imaging area, and $Y_0$ a maximum image height on the second surface as described previously.

$$1.05 < R/Y_0 < 12 \quad (2)$$

In the first aspect of the embodiment, the projection optical system has the effective imaging area of arcuate shape not including the optical axis, whereby the optical path separation can be readily achieved while avoiding the increase in the scale of the optical system. However, for example, where the projection optical system is applied to the exposure apparatus and exposure method, it is difficult to uniformly illuminate an illumination area of arcuate shape on the mask. Therefore, a method to be adopted is one of limiting an illumination beam of rectangular shape corresponding to a rectangular region including the area of the arcuate shape, by a field stop having an aperture (light transmitting portion) of arcuate shape. In this case, in order to reduce loss in light quantity due to the field stop, it is necessary to keep the radius R of curvature of the arc defining the effective imaging area as large as possible.

Namely, the range below the lower limit of Condition (2) is undesirable because the radius R of curvature is so small that the beam loss due to the field stop becomes so large as to decrease the throughput due to reduction of illumination efficiency. On the other hand, the range above the upper limit of Condition (2) is undesirable because the radius R of curvature is so large that the required aberration-corrected area becomes large in order to secure the effective imaging area in a required width for reduction in overrun length during scan exposure, so as to result in increase in the scale of the optical system. For better demonstrating the effect of the embodiment, the upper limit of Condition (2) is more preferably set to 8 and the lower limit thereof to 1.07.

In the catadioptric projection optical system of the aforementioned type, even in the case where the optical path to the image plane (second surface) is not filled with the medium like liquid, when the projection optical system satisfies Condition (2), it is feasible to avoid the reduction of throughput due to the decrease of illumination efficiency and to avoid the increase in the scale of the optical system due to the increase in the required aberration-corrected area. Where the projection optical system of the embodiment is applied to the exposure apparatus and exposure method, it is preferable to use, for example, ArF laser light (wavelength 193.306 nm) as the exposure light, in view of the transmittance of the medium (liquid or the like) filled between the boundary lens and the image plane, the degree of narrowing of the laser light, and so on.

The projection optical system according to the second aspect of the embodiment is a catadioptric projection optical system for forming an image of a first surface on a second surface, comprising: a first imaging optical system comprising two mirrors, which forms an intermediate image of the first surface; and a second imaging optical system, which forms the intermediate image on the second surface, wherein the second imaging optical system comprises the following components in order of passage of a ray from the intermediate image side: a first field mirror of a concave shape; a second field mirror; a first lens unit comprising at least two negative lenses and having a negative refracting power; a second lens unit having a positive refracting power; an aperture stop; and a third lens unit having a positive refracting power.

Since in this configuration the intermediate image of the first surface is formed in the first imaging optical system, it is feasible to readily and securely achieve the optical path separation between the beam toward the first surface and the beam toward the second surface, even in the case where the numerical apertures of the catadioptric projection optical system are increased. Since the second imaging optical system comprises the first lens unit having the negative refracting power, the total length of the catadioptric projection optical system can be decreased and the adjustment for satisfying the Petzval's condition can be readily performed. Furthermore, the first lens unit relieves the variation due to the difference of field angles of the beam expanded by the first field mirror, so as to suppress occurrence of aberration. Therefore, even in the case where the object-side and image-side numerical apertures of the catadioptric projection optical system are increased in order to enhance the resolution, good imaging performance can be achieved throughout the entire region in the exposure area.

In the projection optical system according to the second aspect of the embodiment, preferably, the first imaging optical system comprises a fourth lens unit having a positive refracting power, a negative lens, a concave mirror, and an optical path separating mirror; and the first imaging optical system is arranged as follows: light traveling in the first imaging optical system passes through the fourth lens unit and the negative lens, is then reflected by the concave mirror, and passes again through the negative lens to be guided to the optical path separating mirror; the light reflected by the optical path separating mirror is reflected by the first field mirror and the second field mirror and thereafter directly enters the first lens unit in the second imaging optical system.

Since in this configuration the first imaging optical system comprises the fourth lens unit having the positive refracting power, the projection optical system can be made telecentric on the first surface side. Since the first imaging optical system comprises the negative lens and the concave mirror, the adjustment for satisfying the Petzval's condition can be readily performed by adjusting the negative lens and the concave mirror.

In the projection optical system according to the second aspect of the embodiment, preferably, the first field mirror outputs light entering the first field mirror, so as to bend the light into a direction toward the optical axis of the catadioptric projection optical system.

In the projection optical system according to the second aspect of the embodiment, preferably, the second field mirror has a convex shape.

According to these configurations, a ray incident to the first field mirror is outputted as bent into a direction toward the optical axis of the catadioptric system, whereby the second field mirror can be constructed in a compact size even in the case where the numerical apertures of the catadioptric projection optical system are increased. Accordingly, the optical path separation between the beam toward the first surface and the beam toward the second surface can be readily performed even in the case where the object-side and image-side numerical apertures are increased in order to enhance the resolution.

In the projection optical system according to the second aspect of the embodiment, preferably, the two mirrors in the first imaging optical system are a mirror of a concave shape and a mirror of a convex shape which are arranged in order of incidence of light from the first surface, and wherein the second field mirror in the second imaging optical system is a mirror of a convex shape.

According to this configuration, the two mirrors in the first imaging optical system are of the concave shape and the convex shape, and the second field mirror has the convex shape; therefore, it is feasible to readily and securely guide the beam emerging from the first imaging optical system, to the second imaging optical system.

In the projection optical system according to the second aspect of the embodiment, the aperture stop is disposed between the first field mirror and the second surface, and the projection optical system satisfies the following condition:

0.17<Ma/L<0.6, where Ma is a distance on an optical axis between the first field mirror and the second surface, and L a distance between the first surface and the second surface.

According to this configuration, Ma/L is larger than 0.17, and it is thus feasible to avoid mechanical interference of the first field mirror with the first lens unit and with the second lens unit. Since Ma/L is smaller than 0.6, it is feasible to avoid an increase in the total length and an increase in the size of the catadioptric projection optical system.

In the projection optical system according to the second aspect of the embodiment, preferably, the first lens unit in the second imaging optical system has at least one aspherical lens.

According to this configuration, at least one of optical elements constituting the first lens unit is a lens of aspherical shape and thus good imaging performance can be achieved throughout the entire region in the exposure area, even in the case where the object-side and image-side numerical apertures are increased.

The projection optical system according to the third aspect of the embodiment is a catadioptric projection optical system, which forms an image of a first surface on a second surface, comprising: a first unit disposed in an optical path between the first surface and the second surface and having a positive refracting power; a second unit disposed in an optical path between the first unit and the second surface and comprising at least four mirrors; a third unit disposed in an optical path between the second unit and the second surface, comprising at least two negative lenses, and having a negative refracting power; and a fourth unit disposed in an optical path between the third unit and the second surface, comprising at least three positive lenses, and having a positive refracting power, wherein an intermediate image is formed in the second unit and wherein an aperture stop is provided in the fourth unit.

In the projection optical system according to the third aspect of the embodiment, the intermediate image of the first surface is formed in the second unit and it is thus feasible to readily and securely achieve the optical path separation between the beam toward the first surface and the beam toward the second surface, even in the case where the numerical apertures of the catadioptric projection optical system are increased. Since the projection optical system comprises the third unit having the negative refracting power, the total length of the catadioptric projection optical system can be decreased and the adjustment for satisfying the Petzval's condition can be readily performed. Therefore, the good imaging performance can be achieved throughout the entire region in the exposure area, even in the case where the object-side and image-side numerical apertures of the catadioptric projection optical system are increased in order to enhance the resolution.

In the projection optical system according to the third aspect of the embodiment, preferably, the second unit comprises the following components in order of incidence of light from the first surface: a first reflecting mirror of a concave shape; a second reflecting mirror of a convex shape; a third reflecting mirror of a concave shape; and a fourth reflecting mirror of a convex shape.

According to this configuration, the second unit comprises the concave mirror, the convex mirror, the concave mirror, and the convex mirror in order of incidence of light from the first surface, and it is thus feasible to readily and securely guide the beam emerging from the first imaging optical system, to the second imaging optical system.

In the projection optical system according to the third aspect of the embodiment, preferably, the second unit comprises at least one negative lens, and an optical element located nearest to the third unit in the optical path of the second unit is the fourth reflecting mirror or a double pass lens through which light passes twice.

According to this configuration, since the optical element located nearest to the third unit in the optical path of the second unit is the fourth reflecting mirror or the double pass lens through which the light passes twice, the adjustment for satisfying the Petzvalts condition can be readily performed by adjusting the lens in the third unit having the negative refracting power, and the fourth reflecting mirror or the double pass lens.

In the projection optical system according to the third aspect of the embodiment, preferably, the third reflecting mirror outputs light entering the third reflecting mirror, so as to bend the light into a direction toward the optical axis of the catadioptric projection optical system.

This configuration enables miniaturization of the fourth reflecting mirror because a ray incident to the third reflecting mirror is outputted as bent into a direction toward the optical axis of the catadioptric projection optical system. Therefore, it is feasible to readily and securely achieve the optical path separation between the beam toward the first surface and the beam toward the second surface, even in the case where the object-side and image-side numerical apertures are increased in order to enhance the resolution.

In the projection optical system according to the third aspect of the embodiment, the aperture stop is disposed between the third reflecting mirror and the second surface, and the projection optical system satisfies the following condition:

$$0.17 < Ma/L < 0.6,$$

where Ma is a distance on an optical axis between the third reflecting mirror and the second surface, and L a distance between the first surface and the second surface.

In this configuration, Ma/L is larger than 0.17, and it is thus feasible to avoid mechanical interference of the third reflecting mirror with the second unit and with the third unit. Since Ma/L is smaller than 0.6, it is feasible to avoid an increase in the total length and an increase in the size of the catadioptric projection optical system.

In the projection optical system according to the third aspect of the embodiment, the third unit comprises at least one aspherical lens. Since in this configuration at least one of optical elements constituting the third unit is the aspherical lens, good imaging performance can be achieved throughout the entire region in the exposure area, even in the case where the object-side and image-side numerical apertures are increased.

The projection optical system according to the fourth aspect of the embodiment is a catadioptric projection optical system, which forms an image of a first surface on a second surface, the projection optical system comprising: a first imaging optical system comprising at least six mirrors, which forms a first intermediate image and a second intermediate image of the first surface; and a second imaging optical system, which relays the second intermediate image onto the second surface.

Since the projection optical system according to the fourth aspect of the embodiment comprises at least six mirrors, the first intermediate image and the second intermediate image can be formed, without increase in the total length of the catadioptric projection optical system, and good imaging performance can be achieved throughout the entire region in the exposure area, even in the case where the object-side and image-side numerical apertures of the catadioptric projection optical system are increased in order to enhance the resolution.

In the projection optical system according to the fourth aspect of the embodiment, preferably, the first intermediate image is formed between a mirror that light emerging from the first surface enters second and a mirror that the light emerging from the first surface enters fourth, out of said at least six mirrors in the first imaging optical system.

In this configuration, the first intermediate image is formed between the mirror that the light emerging from the first surface enters second and the mirror that the light emerging from the first surface enters fourth. Therefore, it is feasible to readily and securely achieve the optical path separation between the beam toward the first surface and the beam toward the second surface and to obtain good imaging performance throughout the entire region in the exposure area, even in the case where the object-side and image-side numerical apertures of the catadioptric projection optical system are increased in order to enhance the resolution.

In the projection optical system according to the fourth aspect of the embodiment, preferably; the first imaging optical system comprises a field lens unit comprised of a transmitting optical element and having a positive refracting power, and the at least six mirrors are arranged so as to continuously reflect light transmitted by the field lens unit.

Since in this configuration the first imaging optical system comprises the field lens unit with the positive refracting power comprised of the transmitting optical element, distortion or the like can be corrected for by this field lens unit and the projection optical system can be made telecentric on the first surface side. Since no lens is disposed in optical paths between the at least six mirrors, it is feasible to secure a region for holding each mirror and to readily hold each mirror. Since the light is continuously reflected by each mirror, the Petzval's condition can be readily satisfied by adjusting each mirror.

In the projection optical system according to the fourth aspect of the embodiment, the first imaging optical system preferably comprises a field lens unit comprised of a transmitting optical element and having a positive refracting power, and the first imaging optical system preferably comprises at least one negative lens between a mirror that light emerging from the first surface enters first and a mirror that the light emerging from the first surface enters sixth, out of the at least six mirrors.

Since in this configuration the first imaging optical system comprises the field lens unit with the positive refracting power comprised of the transmitting optical element, the projection optical system can be made telecentric on the first surface side. Since the optical system comprises at least one negative lens between the mirror that the light emerging from the first surface enters first and the mirror that the light emerging from the first surface enters sixth, correction for chromatic aberration can be readily made by adjusting this negative lens and it is easy to make such adjustment as to satisfy the Petzval's condition.

In the projection optical system according to the fourth aspect of the embodiment, preferably, every optical element constituting the second imaging optical system is a transmitting optical element to form a reduced image of the first surface on the second surface.

This configuration is free of the optical path separation load because every optical element forming the second imaging optical system is a transmitting optical element. Therefore, the image-side numerical aperture of the catadioptric projection optical system can be increased and the reduced image can be formed at a high reduction rate on the second surface. It is also feasible to readily correct for coma and spherical aberration.

In the projection optical system according to the fourth aspect of the embodiment, preferably, the second imaging optical system comprises the following components in order of passage of light emerging from the first imaging optical system: a first lens unit having a positive refracting power; a second lens unit having a negative refracting power; a third lens unit having a positive refracting power; an aperture stop; and a fourth lens unit having a positive refracting power.

According to this configuration, the first lens unit with the positive refracting power, the second lens unit with the negative refracting power, the third lens unit with the positive refracting power, the aperture stop, and the fourth lens unit with the positive refracting power constituting the second imaging optical system advantageously function to satisfy the Petzval's condition. It is also feasible to avoid an increase in the total length of the catadioptric projection optical system.

In the projection optical system according to the fourth aspect of the embodiment, a mirror disposed at a position where light emerging from the first surface is most distant from the optical axis of the catadioptric projection optical system, out of the at least six mirrors is preferably a mirror of a concave shape, and the aperture stop is preferably disposed between the mirror of the concave shape and the second surface. Preferably, the projection optical system satisfies the following condition:

$$0.2 < Mb/L < 0.7,$$

where Mb is a distance on an optical axis between the mirror of the concave shape and the second surface and L a distance between the first surface and the second surface.

In this configuration, since Mb/L is larger than 0.2, it is feasible to avoid mechanical interference of the mirror of the concave shape located at the position most distant from the optical axis of the catadioptric projection optical system, with the first lens unit, the second lens unit, and the third lens unit. Since Mb/L is smaller than 0.7, it is feasible to avoid an increase in the total length and an increase in the size of the catadioptric projection optical system.

In the projection optical system according to the fourth aspect of the embodiment, preferably, the second lens unit and the fourth lens unit have at least one aspherical lens.

Since in this configuration at least one of optical elements constituting the second lens unit and the fourth lens unit is a lens of aspherical shape, it is feasible to readily make the aberration correction and to avoid an increase in the total length of the catadioptric projection optical system. Therefore, good imaging performance can be achieved throughout the entire region in the exposure area, even in the case where the object-side and image-side numerical apertures are increased.

The projection optical system according to the fourth aspect of the embodiment is preferably as follows: the catadioptric projection optical system is a thrice-imaging (three time) optical system, which forms the first intermediate image being an intermediate image of the first surface, and the second intermediate image being an image of the first intermediate image, in an optical path between the first surface and the second surface.

In this configuration, the projection optical system is the thrice-imaging optical system, whereby the first intermediate image is an inverted image of the first surface, the second intermediate image is an erect image of the first surface, and the image formed on the second surface is an inverted image. Therefore, in the case where the catadioptric projection optical system is mounted on the exposure apparatus and where an exposure is carried out with scanning of the first surface and the second surface, the scanning direction of the first surface can be made opposite to the scanning direction of the second surface, and it is easy to perform such adjustment as to decrease a change in the center of gravity of the entire exposure apparatus. It is also feasible to reduce vibration of the catadioptric projection optical system caused by the change in the center of gravity of the entire exposure apparatus, and good imaging performance can be achieved throughout the entire region in the exposure area.

The projection optical systems according to the second aspect to the fourth aspect of the embodiment are characterized in that a lens surface on the first surface side of a lens located nearest to the second surface out of lenses in the catadioptric projection optical system has a positive refracting power, and in that, where a refractive index of an atmosphere in the catadioptric projection optical system is 1, a medium having a refractive index larger than 1.1 is interposed in an optical path between the lens nearest to the second surface, and the second surface.

In this configuration, the medium having the refractive index larger than 1.1 is interposed in the optical path between the lens located nearest to the second surface in the catadioptric projection optical system and the second surface, the wavelength of exposure light in the medium is 1/n times that in air where the refractive index of the medium is n, and thus the resolution can be enhanced.

The projection optical systems according to the second aspect to the fourth aspect of the embodiment are preferably configured so that an optical axis of every optical element with a predetermined refracting power in the catadioptric projection optical system is arranged substantially on a single straight line, and so that a region of an image formed on the second surface by the catadioptric projection optical system is an off-axis region not including the optical axis.

According to this configuration, the optical axis of every optical element in the catadioptric projection optical system is arranged substantially on the single straight line, and it is thus feasible to reduce the degree of difficulty of production in production of the catadioptric projection optical system and to readily perform relative adjustment of each optical member.

The exposure apparatus according to the fifth aspect of the embodiment is an exposure apparatus for effecting an exposure of a pattern formed on a mask, onto a photosensitive substrate, comprising: an illumination system, which illuminates the mask set on the first surface; and the projection optical system according to any one of the first aspect to the fourth aspect of the embodiment, which forms an image of the pattern formed on the mask, on the photosensitive substrate set on the second surface.

According to this configuration, the exposure apparatus comprises the compact catadioptric projection optical system with the large numerical aperture, and thus the exposure apparatus is able to suitably perform an exposure of a fine pattern on the photosensitive substrate.

In the exposure apparatus according to the fifth aspect of the embodiment, preferably, the illumination system supplies illumination light which is s-polarized light with respect to the second surface. This configuration enhances the contrast of the image formed on the photosensitive substrate and secures a large depth of focus (DOE). Particularly, the projection optical systems according to the first aspect to the fourth aspect of the embodiment permit the optical path separation to be achieved without use of an optical path deflecting mirror (bending mirror) having a function of deflecting the optical axis. There is a high risk of causing a large phase difference between p-polarized light and s-polarized light reflected by the optical path deflecting mirror, and in use of the optical path deflecting mirror, it becomes difficult to supply illumination light of s-polarized light with respect to the second surface, because of this reflection phase difference; namely, there arises a problem that the illumination light is not s-polarized light on the second surface even through generation of polarization in the circumferential direction with respect to the optical axis of the illumination optical device. In contrast to it, this problem hardly occurs in the projection optical systems according to the first aspect to the fourth aspect of the embodiment.

In the exposure apparatus according to the fifth aspect of the embodiment, preferably, the projection exposure of the pattern of the mask onto the photosensitive substrate is performed while moving the mask and the photosensitive substrate along a predetermined direction relative to the projection optical system.

The exposure method according to the sixth aspect of the embodiment is an exposure method of effecting an exposure of a pattern formed on a mask, onto a photosensitive substrate, comprising: an illumination step of illuminating the mask on which the predetermined pattern is foamed; and an exposure step of performing an exposure of the pattern of the mask set on the first surface, onto the photosensitive substrate set on the second surface, using the projection optical system according to any one of the first aspect to the fourth aspect of the embodiment.

In this configuration, the exposure is performed by the exposure apparatus including the compact catadioptric projection optical system with the large numerical aperture, whereby a fine pattern can be suitably exposed.

Embodiments of the embodiment will be described below with reference to the drawings.

FIG. 1 is a schematic configuration diagram showing an embodiment of the exposure apparatus of the embodiment.

In FIG. 1, the exposure apparatus EX has a reticle stage RST supporting a reticle R (mask), a wafer stage WST supporting a wafer W as a substrate, an illumination optical system IL for illuminating the reticle R supported by the reticle stage RST, with exposure light EL, a projection optical system PL for performing a projection exposure of an image of a pattern on the reticle R illuminated with the exposure light EL, onto the wafer W supported by the wafer stage WST, a liquid supply device 1 for supplying a liquid 50 onto the wafer W, a recovery device 20 for collecting the liquid 50 flowing out of the wafer W, and a controller CONT for totally controlling the overall operation of the exposure apparatus EX.

The present embodiment will be described using as an example a case where the exposure apparatus EX is a scanning exposure apparatus for performing an exposure of a pattern formed on the reticle R, onto the wafer W while synchronously moving the reticle R and wafer W along a scanning direction (so called a scanning stepper). In the description below, a direction coinciding with the optical axis AX of the projection optical system PL is defined as a Z-axis direction, the synchronous movement direction (scanning direction) of the reticle R and wafer W in the plane normal to the Z-axis direction, as an X-axis direction, and a direction (non-scanning direction) normal to the Z-axis direction and the Y-axis direction as a Y-axis direction. Directions around the X-axis, around the Y-axis, and around the Z-axis are defined as θX, θY, and θZ directions, respectively. The "wafer" encompasses a semiconductor wafer coated with a resist, and the "reticle" encompasses a mask with a device pattern to be projected at an enlargement, reduction, or unit magnification onto the wafer.

The illumination optical system IL is a system for illuminating the reticle R supported by the reticle stage RST, with the exposure light EL, based on the exposure light from a light source 100 for supplying the illumination light in the ultraviolet region. The illumination optical system IL has an optical integrator for uniformizing the illuminance of a beam emitted from the light source 100, a condenser lens for condensing the exposure light EL from the optical integrator, a relay lens system, a variable field stop for defining an illumination area in a slit shape on the reticle R with the exposure light EL, and so on. Here the illumination optical system IL is provided with an s-polarized light converter 110 for converting linearly polarized light from the light source 100, into polarized light as s-polarized light with respect to the reticle R (wafer W), without substantial loss of light quantity. The s-polarized light converter of this type is disclosed, for example, in Japanese Patent No. 3246015.

A predetermined illumination area on the reticle R is illuminated with the exposure light EL of a uniform illuminance distribution by the illumination optical system IL. The exposure light EL emitted from the illumination optical system IL is, for example, deep ultraviolet light (DUV light) such as the emission lines (g-line, h-line, and i-line) in the ultraviolet region from a mercury lamp and KrF excimer laser light (wavelength 248 nm), or vacuum ultraviolet light (VUV light) such as ArF excimer laser light (wavelength 193 nm) and F2 laser light (wavelength 157 nm). The present embodiment is assumed to use the ArF excimer laser light.

The reticle stage RST is a stage supporting the reticle R and is two-dimensionally movable in the plane normal to the optical axis AX of the projection optical system PL, i.e., within the XY plane and finely rotatable in the θZ direction. The reticle stage RST is driven by a reticle stage driving device RSTD such as a linear motor. The reticle stage driving device RSTD is controlled by the controller CONT. The two-dimensional position and an angle of rotation of the reticle R on the reticle stage RST are measured in real time by a laser interferometer, and the result of the measurement is fed to the controller CONT. The controller CONT drives the reticle stage driving device RSTD on the basis of the measurement result of the laser interferometer to position the reticle R supported by the reticle stage RST.

The projection optical system PL is one for performing a projection exposure of a pattern on the reticle R at a predetermined projection magnification β onto the wafer W, and is composed of a plurality of optical elements (lenses), which are supported by a lens barrel PK as a metal member. In the present embodiment, the projection optical system PL is a reduction system with the projection magnification β of ¼ or ⅕, for example. The projection optical system PL may be either of a 1:1 system and an enlarging system. An optical element (lens) 60 is exposed from the lens barrel PK on the distal end side (wafer W side) of the projection optical system PL of the present embodiment. This optical element 60 is detachably (replaceably) attached to the lens barrel PK.

The wafer stage WST is a stage supporting the wafer W, and is provided with a Z-stage 51 holding the wafer W through the wafer holder, an XY stage 52 supporting the Z-stage 51, and a base 53 supporting the XY stage 52. The wafer stage WST is driven by a wafer stage driving device WSTD such as a linear motor. The wafer stage driving device WSTD is controlled by the controller CONT. As the Z-stage 51 is driven, the wafer W held by the Z-stage 51 is controlled as to the position in the Z-axis direction (focus position) and as to the position in the θX and θY directions. As the XY stage 52 is driven, the wafer W is controlled as to the position in the XY directions (the position in the directions substantially parallel to the image plane of the projection optical system PL). Namely, the Z-stage 51 controls the focus position and angle of inclination of the wafer W to match the surface of the wafer W with the image plane of the projection optical system PL by the autofocus method and autoleveling method, and the XY stage 52 positions the wafer W in the X-axis direction and in the Y-axis direction. It is needless to mention that the Z-stage and XY stage may be integrally arranged.

A moving mirror 54 is provided on the wafer stage WST (Z-stage 51). An interferometer 55 is disposed at the position opposite to the moving mirror 54. The two-dimensional position and the angle of rotation of the wafer W on the wafer stage WST are measured in real time by the laser interferometer 55, and the result of the measurement is fed to the controller CONT. The controller CONT drives the wafer stage driving device WSTD on the basis of the measurement result of the laser interferometer 55 to position the wafer W supported by the wafer stage WST.

The present embodiment adopts the liquid immersion method, in order to substantially shorten the exposure wavelength so as to improve the resolution and substantially widen the depth of focus. For this reason, the space between the surface of the wafer W and the end surface (lower face) 7 of the optical element (lens) 60 on the wafer W side of the projection optical system PL is filled with a predetermined liquid 50 at least during the period of transcribing the image of the pattern of the reticle R onto the wafer W. As described above, the lens 60 is exposed on the end surface side of the projection optical system PL and the liquid 50 is arranged in contact with only the lens 60. This prevents corrosion or the like of the lens barrel PK made of metal. Since the end surface 7 of the lens 60 is sufficiently smaller than the lens barrel PK of the projection optical system PL and the wafer W and since the liquid 50 is kept in contact with only the lens 60 as described above, the liquid 50 is arranged to be locally filled on the image plane side of the projection optical system PL. Namely, the liquid-immersed portion between the projection optical system PL and the wafer W is sufficiently smaller than the wafer W. The present embodiment uses pure water as the liquid 50. Pure water can transmit not only the ArF excimer laser light, but also the exposure light EL if the exposure light EL is the deep ultraviolet light (DUV light) such as the emission lines (g-line, h-line, and i-line) in the ultraviolet region emitted from a mercury lamp and the KrF excimer laser light (wavelength 248 nm), for example.

The exposure apparatus EX is provided with the liquid supplying device 1 for supplying the predetermined liquid 50 to the space 56 between the end surface (distal end face of lens 60) 7 of the projection optical system PL and the wafer W, and a liquid recovery device 2 as a second recovery device for collecting the liquid 50 in the space 56, i.e., the liquid 50 on the wafer W. The liquid supplying device 1 is a device for locally filling the space on the image plane side of the projection optical system PL with the liquid 50, and is provided with a tank for storing the liquid 50, a compression pump, and a temperature regulator for regulating the temperature of the liquid 50 to be supplied to the space 56. One end of supply tube 3 is connected to the liquid supplying device 1 and the other end of the supply tube 3 is connected to a supply nozzle 4. The liquid supplying device 1 supplies the liquid 50 to the space 56 through the supply tube 3 and supply nozzle 4.

The liquid recovery device 2 is provided with a suction pump, a tank for storing the collected liquid 50, and so on. One end of recovery tube 6 is connected to the liquid recovery device 2 and the other end of the recovery tube 6 is connected to a collection nozzle 5. The liquid recovery device 2 collects the liquid 50 in the space 56 through the collection nozzle 5 and recovery tube 6. For filling the space 56 with the liquid 50, the controller CONT drives the liquid supplying device 1 to supply the liquid 50 in a predetermined amount per unit time through the supply tube 3 and supply nozzle 4 to the space 56, and drives the liquid recovery device 2 to collect the liquid 50 in a predetermined amount per unit time through the collection nozzle 5 and recovery tube 6 from the space 56. This results in placing the liquid 50 in the space 56 between the end surface 7 of the projection optical system PL and the wafer W to form a liquid-immersed portion. Here the controller CONT can arbitrarily set the liquid supply amount per unit time to the space 56 by controlling the liquid supplying device 1, and can also arbitrarily set the liquid collection amount per unit time from on the wafer W by controlling the liquid recovery device 2.

Figure 2:
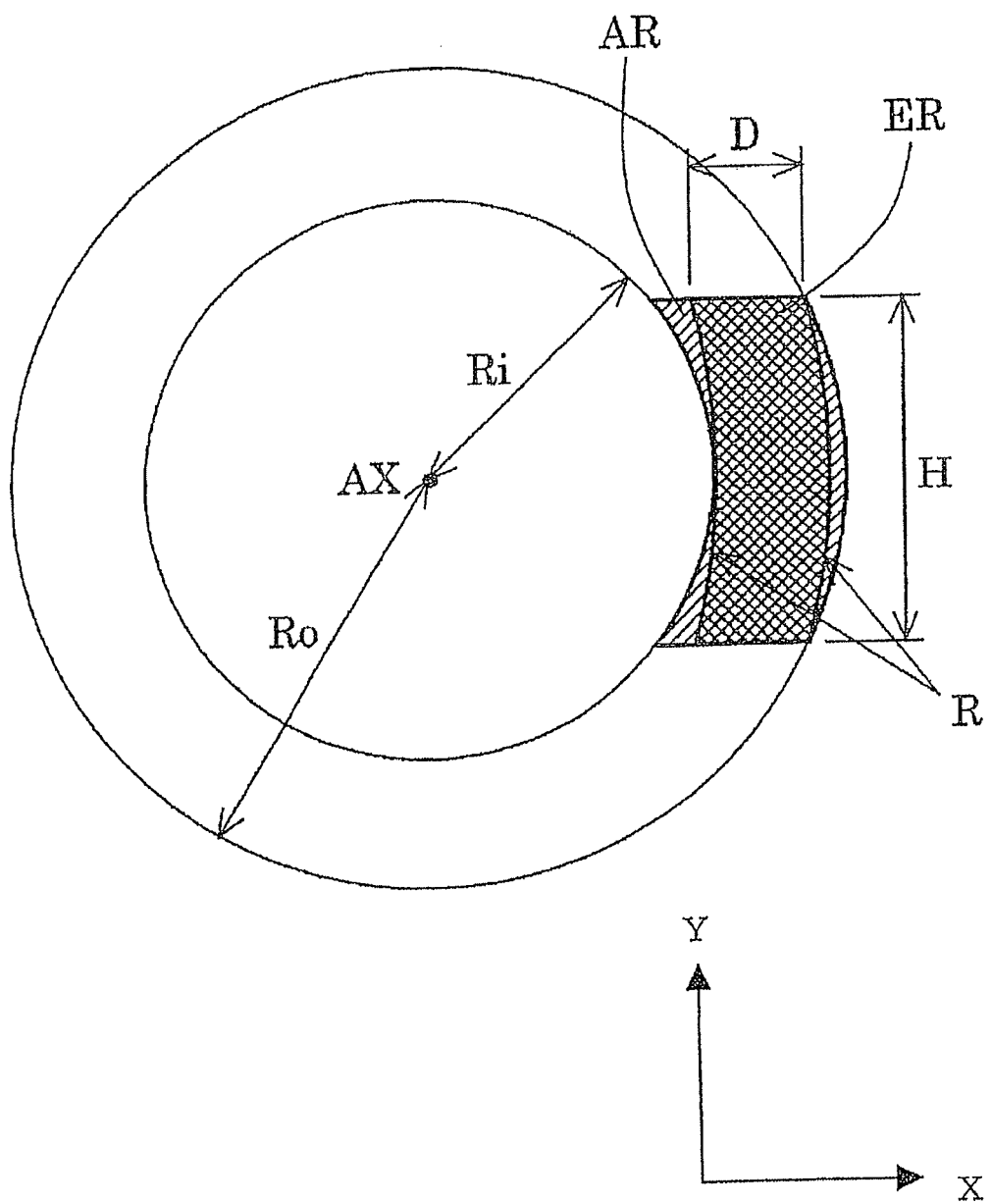
FIG. 2 is an illustration showing a positional relation between the optical axis and an effective exposure area of arcuate shape formed on a wafer in the embodiment.

FIG. 2 is an illustration showing a positional relation between the optical axis and an effective exposure area of arcuate shape formed on a wafer in the present embodiment. In the present embodiment, as shown in FIG. 2, a region well corrected for aberration, i.e., aberration-corrected region AR is defined in an arcuate shape by a circle with an outside radius (radius) Ro centered around the optical axis AX, a circle with an inside radius (radius) Ri centered around the optical axis AX, and two line segments parallel to the X-direction, spaced by a distance H. Then an effective exposure region (effective imaging area) ER is set in an arcuate shape by two arcs with a radius R of curvature spaced in the X-direction, and two line segments of the length D parallel with the X-direction as spaced by the distance H, so as to be substantially inscribed in the aberration-corrected region AR of arcuate shape.

In this manner, the entire effective imaging area ER of the projection optical system PL exists in the region off the optical axis AX, The size along the Y-direction of the effective imaging area ER of arcuate shape is H, and the size along the X-direction is D. Although not shown, the illumination area of arcuate shape (i.e., the effective illumination area) having the size and shape optically corresponding to the effective exposure region ER of arcuate shape is thus formed not including the optical axis AX, on the reticle R.

The exposure apparatus of the present embodiment is arranged so that the interior of the projection optical system PL is kept in an airtight state between an optical member located nearest to the reticle among the optical members forming the projection optical system PL (which is lens L11 in the first and second examples, lens L1 in the third and fifth examples, lens L21 in the fourth and sixth examples, or lens L51 in the seventh example) and a boundary lens Lb (lens L217 in the first and second examples, lens L18 in the third example, lens L36 in the fourth example, lens L20 in the fifth example, lens L41 in the sixth example, or lens L70 in the seventh example) and so that the gas inside the projection optical system PL is replaced with an inert gas such as helium gas or nitrogen, or the inside is kept in a substantially vacuum state. Furthermore, the members such as the reticle R and reticle stage RS are disposed in the narrow optical path between the illumination optical system IL and the projection optical system PL, and an interior of a casing (not shown) for hermetically enclosing the reticle R, the reticle stage RS, etc. is filled with an inert gas such as nitrogen or helium gas, or kept in a substantially vacuum state.

Figure 3:
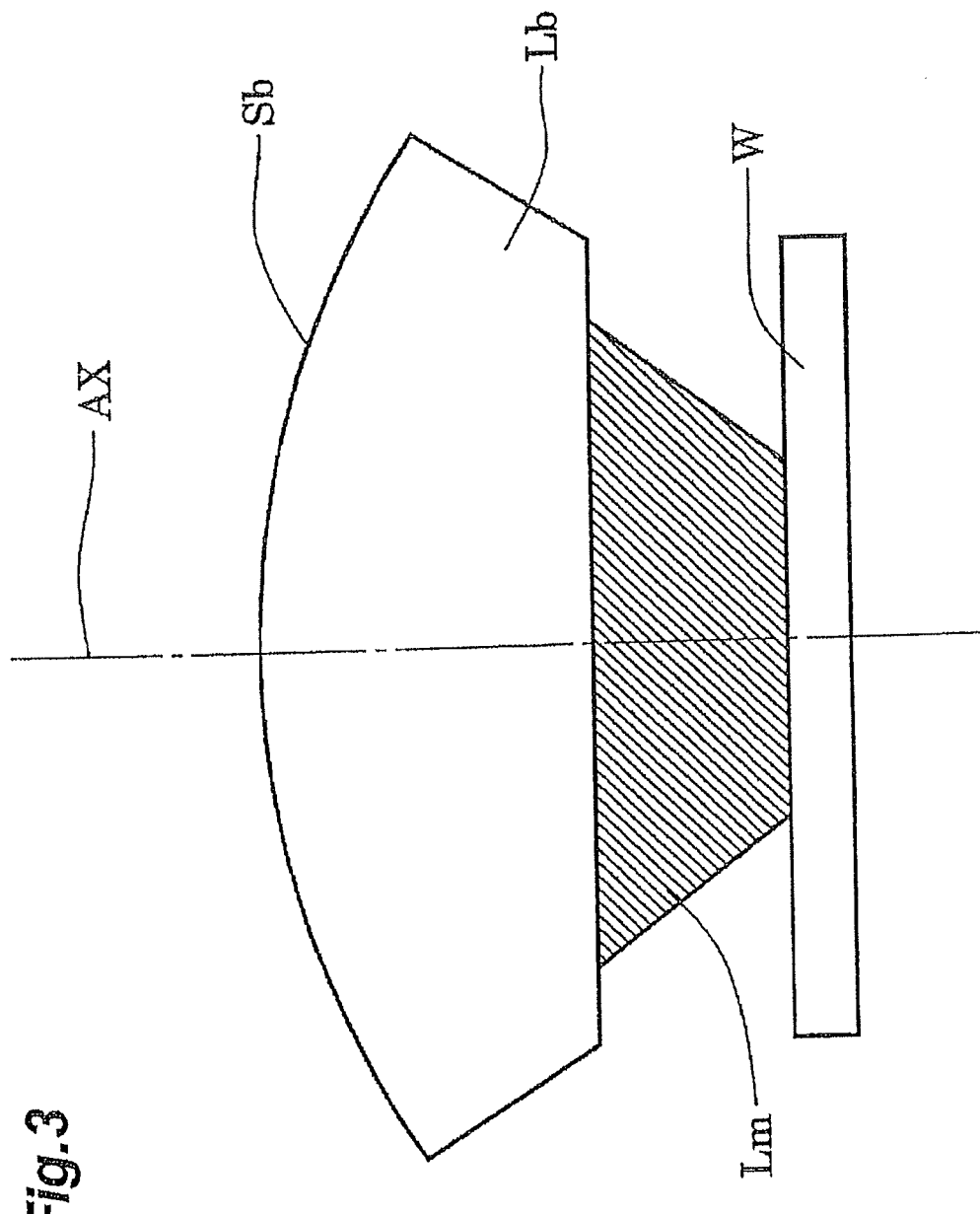
FIG. 3 is an illustration schematically showing a configuration between a boundary lens and a wafer in the first example of the embodiment.

FIG. 3 is an illustration schematically showing a configuration between the boundary lens and the wafer in the first example of the present embodiment. With reference to FIG. 3, the boundary lens Lb in the first example has a convex surface kept toward the reticle (first surface). In other words, the reticle-side surface Sb of the boundary lens Lb has a positive refracting power. The optical path between the boundary lens Lb and the wafer W is filled with a medium Lm having the refractive index larger than 1.1. In the first example, deionized water is used as the medium Lm.

Figure 4:
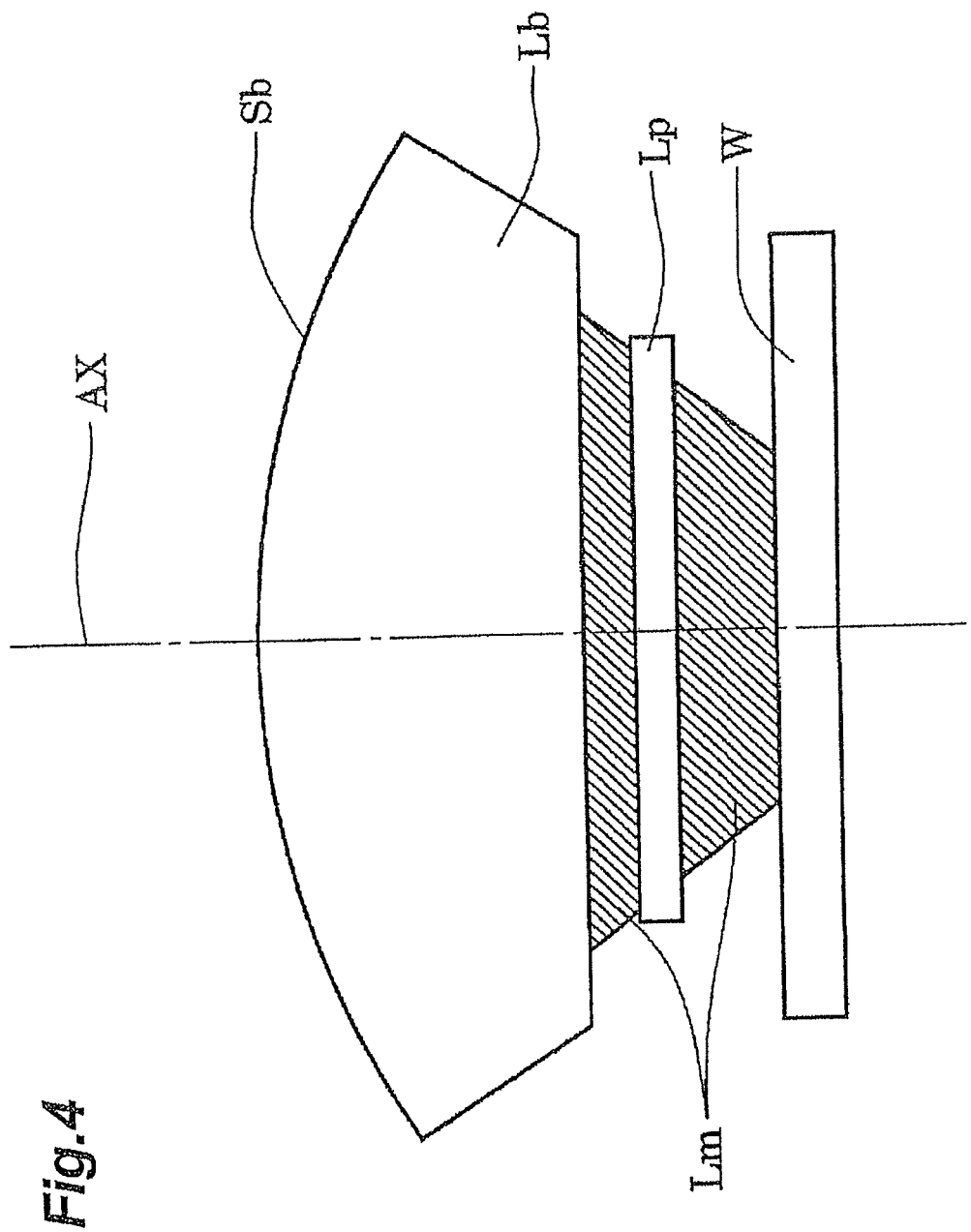
FIG. 4 is an illustration schematically showing a configuration between a boundary lens and a wafer in the second example of the embodiment.

FIG. 4 is an illustration schematically showing a configuration between the boundary lens and the wafer in the second example of the present embodiment. With reference to FIG. 4, the boundary lens Lb in the second example also has a convex surface kept toward the reticle and the reticle-side surface Sb thereof has a positive refracting power as in the first example. However, the second example is different from the first example in that a plane-parallel plate Lp is detachably arranged in the optical path between the boundary lens Lb and the wafer W and in that the optical path between the boundary lens Lb and the plane-parallel plate Lp and the optical path between the plane-parallel plate Lp and the wafer W are filled with the medium Lm having the refractive index larger than 1.1. In the second example deionized water is also used as the medium Lm as in the first example.

The present embodiment is arranged so that during an exposure by the step-and-scan method of performing a scanning exposure while moving the wafer W relative to the projection optical system PL, the liquid medium Lm is continuously filled in the optical path between the boundary lens Lb of the projection optical system PL and the wafer W from start to end of the scanning exposure. Another potential configuration is such that the wafer holder table WT is constructed in a chamber shape so as to accommodate the liquid (medium Lm) and that the wafer W is positioned and held by vacuum suction in the center of the inner bottom part thereof (in the liquid), as in the technology disclosed in Japanese Patent Application Laid-Open No. 10-303114, for example. In this configuration, the distal end of the lens barrel of the projection optical system PL is arranged to reach the inside of the liquid and, consequently, the wafer-side optical surface of the boundary lens Lb reaches the inside of the liquid.

In this manner, an atmosphere with little absorption of the exposure light is formed throughout the entire optical path from the light source 100 to the substrate P. As described above, the illumination area on the reticle R and the exposure region (i.e., the effective exposure region ER) on the wafer W are of the arcuate shape extending in the X-direction. Therefore, the positions of the reticle R and substrate W are controlled using the reticle stage controller RSTD, the substrate stage driving device, the laser interferometers, etc. to synchronously move (scan) the reticle stage RST and the substrate stage WS, in turn, the reticle R and substrate (wafer) W along the X-direction, whereby the scanning exposure of the reticle pattern is performed in the exposure region having a width equal to the Y-directional size H of the effective exposure region ER and a length according to a scan amount (movement amount) of the substrate W, on the substrate W.

In each example, an aspherical surface is expressed by mathematical expression (a) below, where y represents a height in a direction normal to the optical axis, z a distance (sag) along the optical axis from a tangent plane at an apex of the aspherical surface to a position on the aspherical surface at the height y, r a radius of curvature at the apex, κ a conical coefficient, and $C_n$ aspherical coefficients of order n. In each example, a lens surface formed in aspherical shape is provided with mark * on the right side to a surface number.

$$z=(y^2/r)/[1+\{1-(1+\kappa)\cdot y^2/r^2\}^{1/2}]+c_4\cdot y^4+c_6\cdot y^6+c_8\cdot y^8+c_{10}\cdot y^{10}+c_{12}\cdot y^{12}+c_{14}\cdot y^{14}+c_{16}\cdot y^{16}+c_{18}\cdot y^{18}+c_{20}\cdot y^{20}$$ (a)

In the first and second examples, the values of the aspherical coefficients $C_{16}$ to $C_{20}$ are 0, and thus the description thereof is omitted.

In each example, the projection optical system PL is composed of a first imaging optical system G1 for forming an intermediate image (or an optically conjugate point) of the pattern of the reticle R disposed on the object plane (first surface), and a second imaging optical system G2 for forming a reduced image (or an optically conjugate point) of the reticle pattern on the wafer W disposed on the image plane (second surface) on the basis of light from the intermediate image. Here the first imaging optical system G1 is a catadioptric system including a first concave reflecting mirror CM1 and a second concave reflecting mirror CM2, and the second imaging optical system G2 a dioptric system.

First Example

Figure 5:
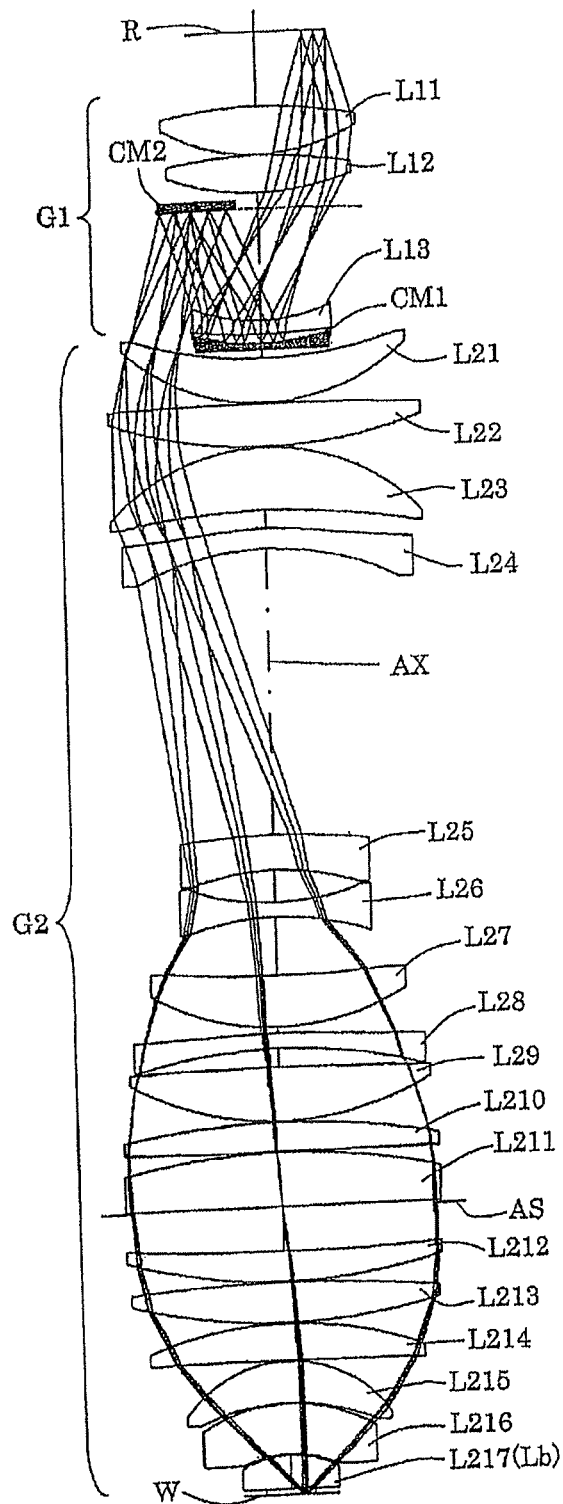
FIG. 5 is an illustration showing a lens configuration of a projection optical system according to the first example of the embodiment.

FIG. 5 is an illustration showing a lens configuration of the projection optical system according to the first example of the present embodiment. With reference to FIG. 5, in the projection optical system PL according to the first example, the first imaging optical system G1 is composed of the following components arranged in order from the reticle side along the traveling direction of light: a biconvex lens L11 whose convex surface of aspherical shape is kept toward the wafer; a biconvex lens L12; a negative meniscus lens L13 whose concave surface of aspherical shape is kept toward the reticle; and a first concave reflecting mirror CM1. In the first imaging optical system G1, a reflecting surface of second concave reflecting mirror CM2 for reflecting the light reflected by the first concave reflecting mirror CM1 and transmitted by the negative meniscus lens L13, toward the second imaging optical system G2 is placed in a region not including the optical axis AX between the biconvex lens L12 and the negative meniscus lens L13. Therefore, the biconvex lens L11 and the biconvex lens L12 constitute a first lens unit having a positive refracting power. The first concave reflecting mirror CM1 constitutes a concave reflecting mirror disposed near the pupil plane of the first imaging optical system G1.

On the other hand, the second imaging optical system G2 is composed of the following components in order from the reticle side along the traveling direction of light: a positive meniscus lens L21 whose concave surface is kept toward the reticle; a biconvex lens L22; a positive meniscus lens L23 whose concave surface of aspherical shape is kept toward the wafer; a negative meniscus lens L24 whose convex surface of aspherical shape is kept toward the reticle; a negative meniscus lens L25 whose convex surface is kept toward the reticle; a biconcave lens L26 whose concave surface of aspherical shape is kept toward the reticle; a positive meniscus lens L27 whose concave surface is kept toward the reticle; a negative meniscus lens L28 whose convex surface of aspherical shape is kept toward the reticle; a biconvex lens L29; a biconvex lens L210; a positive meniscus lens L211 whose convex surface is kept toward the reticle; an aperture stop AS; a positive meniscus lens L212 whose concave surface is kept toward the reticle; a biconvex lens L213; a positive meniscus lens L214 whose concave surface of aspherical shape is kept toward the wafer; a positive meniscus lens L215 whose convex surface is kept toward the reticle; a positive meniscus lens L216 whose concave surface of aspherical shape is kept toward the wafer; and a planoconvex lens L217 (boundary lens Lb) whose plane is kept toward the wafer.

In the first example, all the transmitting members (lenses) and all the reflecting members with a power (the first concave reflecting mirror CM1 and the second concave reflecting mirror CM2) constituting the projection optical system PL are arranged along the single optical axis AX. Specifically, 100% of the transmitting members forming the second imaging optical system G2 are made of silica. The optical path between the planoconvex lens L217 as the boundary lens Lb and the wafer W is filled with the medium Lm consisting of deionized water. In the first example, the light from the reticle R passes through the lenses L11 to L13 to enter the first concave reflecting mirror CM1. The light reflected by the first concave reflecting mirror CM1 travels via the lens L13 and the second concave reflecting mirror CM2 to form an intermediate image of the reticle R near the first concave reflecting mirror CM1. The light reflected by the second concave reflecting mirror CM2 travels through the lenses L21 to L217 (Lb) to form a reduced image of the reticle R on the wafer W.

In the first example, all the transmitting members (lenses) forming the projection optical system PL are made of silica ($SiO_2$). The lasing center wavelength of the ArF excimer laser light being the exposure light is 193.306 nm, and the refractive index of silica near 193.306 nm varies at a rate of $-1.591\times10^{-6}$ per wavelength change of +1 pm, and varies at a rate of $+1.591\times10^{-6}$ per wavelength change of −1 pm. In other words, the dispersion ($dn/d\lambda$) of the refractive index of silica is $-1.591\times10^{-6}$/pm near 193.306 nm. The refractive index of deionized water near 193.306 nm varies at a rate of $-2.6\times10^{-6}$ per wavelength change of +1 pm and varies at a rate of $+2.6\times10^{-6}$ per wavelength change of −1 pm. In other words, the dispersion ($dn/d\lambda$) of the refractive index of deionized water is $-2.6\times10^{-6}$/pm near 193.306 nm.

In the first example, the refractive index of silica for the center wavelength of 193.306 nm is 1.5603261, the refractive index of silica for 193.306 nm+0.1 pm=193.3061 nm is 1.560325941, and the refractive index of silica for 193.306 nm−0.1 pm=193.3059 nm is 1.560326259. The refractive index of deionized water for the center wavelength of 193.306 nm is 1.47, the refractive index of deionized water for 193.306 nm+0.1 pm=193.3061 nm is 1.46999974, and the refractive index of deionized water for 193.306 nm−0.1 pm=193.3059 nm is 1.47000026.

Table (1) below presents values of specifications of the projection optical system PL according to the first example. In Table (1), $\lambda$ represents the center wavelength of the exposure light, $\beta$ a projection magnification (imaging magnification of the entire system), NA the image-side (wafer-side) numerical aperture, Ro and Ri the outside radius and inside radius of the aberration-corrected region AR, H and D the Y-directional size and X-directional size of the effective exposure region ER, R the radius of curvature of the arc defining the effective exposure region ER (effective imaging area) of arcuate shape, and $Y_0$ the maximum image height. Each surface-number represents an order of a surface from the reticle side along the traveling direction of rays from the reticle surface being the object plane (first surface) to the wafer surface being the image plane (second surface), r a radius of curvature of each surface (radius of curvature at an apex: mm in the case of an aspherical surface), d an on-axis spacing or surface separation (mm) of each surface, and n the refractive index for the center wavelength.

The surface separation d changes its sign every reflection. Therefore, the sign of the surface separation d is negative in the optical path from the first concave reflecting mirror CM1 to the second concave reflecting mirror CM2, and positive in the other optical paths. The radius of curvature of each convex surface kept toward the reticle is positive, and the radius of curvature of each concave surface kept toward the reticle is negative, regardless of the direction of incidence of light. The notations in Table (1) also apply to Table (2) hereinafter.

TABLE 1

Principal Specification $\lambda$ = 193.306 nm
$\beta$ = +¼
NA = 1.04
Ro = 17.0 mm
Ri = 11.5 mm
H = 26.0 mm
D = 4.0 mm
R = 20.86 mm
$Y_0$ = 17.0 mm Specification of Optical Members

| Surface number | r | d | n | Optical Member |
|---|---|---|---|---|
| | (reticle surface) | 70.25543 | | |
| 1 | 444.28100 | 45.45677 | 1.5603261 | (L11) |
| 2* | −192.24078 | 1.00000 | | |
| 3 | 471.20391 | 35.53423 | 1.5603261 | (L12) |
| 4 | −254.24538 | 122.19951 | | |
| 5* | −159.65514 | 13.00000 | 1.5603261 | (L13) |
| 6 | −562.86259 | 9.00564 | | |
| 7 | −206.23868 | −9.00564 | | (CM1) |
| 8 | −562.86259 | −13.00000 | 1.5603261 | (L13) |
| 9* | −159.65514 | −107.19951 | | |
| 10 | 3162.83419 | 144.20515 | | (CM2) |
| 11 | −389.01215 | 43.15699 | 1.5603261 | (L21) |
| 12 | −198.92113 | 1.00000 | | |
| 13 | 3915.27567 | 42.01089 | 1.5603261 | (L22) |
| 14 | −432.52137 | 1.00000 | | |
| 15 | 203.16777 | 62.58039 | 1.5603261 | (L23) |
| 16* | 515.92133 | 18.52516 | | |
| 17* | 356.67027 | 20.00000 | 1.5603261 | (L24) |
| 18 | 269.51733 | 285.26014 | | |
| 19 | 665.61079 | 35.16606 | 1.5603261 | (L25) |
| 20 | 240.55938 | 32.43496 | | |
| 21* | −307.83344 | 15.00000 | 1.5603261 | (L26) |
| 22 | 258.17867 | 58.24284 | | |
| 23 | −1143.34122 | 51.43638 | 1.5603261 | (L27) |
| 24 | −236.25969 | 6.67292 | | |
| 25* | 1067.55487 | 15.00000 | 1.5603261 | (L28) |
| 26 | 504.02619 | 18.88857 | | |
| 27 | 4056.97655 | 54.00381 | 1.5603261 | (L29) |
| 28 | −283.04360 | 1.00000 | | |
| 29 | 772.31002 | 28.96307 | 1.5603261 | (L210) |
| 30 | −8599.87899 | 1.00000 | | |
| 31 | 667.92225 | 52.94747 | 1.5603261 | (L211) |
| 32 | 36408.68946 | 2.30202 | | |
| 33 | ∞ | 42.27703 | | (AS) |
| 34 | −2053.34123 | 30.00000 | 1.5603261 | (L212) |
| 35 | −514.67146 | 1.00000 | | |
| 36 | 1530.45141 | 39.99974 | 1.5603261 | (L213) |
| 37 | −540.23726 | 1.00000 | | |
| 38 | 370.56341 | 36.15464 | 1.5603261 | (L214) |
| 39* | 12719.40982 | 1.00000 | | |
| 40 | 118.92655 | 41.83608 | 1.5603261 | (L215) |
| 41 | 190.40194 | 1.00000 | | |
| 42 | 151.52892 | 52.42553 | 1.5603261 | (L216) |
| 43* | 108.67474 | 1.12668 | | |
| 44 | 91.54078 | 35.50067 | 1.5603261 | (L217:Lb) |
| 45 | ∞ | 6.00000 | 1.47 | (Lm) |
| | (Wafer surface) | | | |

(Aspherical data)

$2^{nd}$ surface $\kappa = 0$
$C_4 = -8.63025 \times 10^{-9}$   $C_6 = 2.90424 \times 10^{-13}$
$C_8 = 5.43348 \times 10^{-17}$   $C_{10} = 1.65523 \times 10^{-21}$
$C_{12} = 8.78237 \times 10^{-26}$   $C_{14} = 6.53360 \times 10^{-30}$ 5th surface and $9^{th}$ surface (same surface)

$\kappa = 0$
$C_4 = 7.66590 \times 10^{-9}$   $C_6 = 6.09920 \times 10^{-13}$
$C_8 = -6.53660 \times 10^{-17}$   $C_{10} = 2.44925 \times 10^{-20}$
$C_{12} = -3.14967 \times 10^{-24}$   $C_{14} = 2.21672 \times 10^{-28}$ TABLE 1-continued 16th surface $\kappa = 0$
$C_4 = -3.79715 \times 10^{-8}$  $C_6 = 2.19518 \times 10^{-12}$
$C_8 = -9.40364 \times 10^{-17}$  $C_{10} = 3.33573 \times 10^{-21}$
$C_{12} = -7.42012 \times 10^{-26}$  $C_{14} = 1.05652 \times 10^{-30}$ 17th surface $\kappa = 0$
$C_4 = -6.69596 \times 10^{-8}$  $C_6 = 1.67561 \times 10^{-12}$
$C_8 = -6.18763 \times 10^{-17}$  $C_{10} = 2.65428 \times 10^{-21}$
$C_{12} = -4.09555 \times 10^{-26}$  $C_{14} = 3.25841 \times 10^{-31}$ 21st surface $\kappa = 0$
$C_4 = -8.68772 \times 10^{-8}$  $C_6 = -1.30306 \times 10^{-12}$
$C_8 = -2.65902 \times 10^{-17}$  $C_{10} = -6.56830 \times 10^{-21}$
$C_{12} = 3.66980 \times 10^{-25}$  $C_{14} = -5.05595 \times 10^{-29}$ 25th surface $\kappa = 0$
$C_4 = -1.54049 \times 10^{-8}$  $C_6 = 7.71505 \times 10^{-14}$
$C_8 = 1.75760 \times 10^{-18}$  $C_{10} = 1.71383 \times 10^{-23}$
$C_{12} = 5.04584 \times 10^{-29}$  $C_{14} = 2.08622 \times 10^{-32}$ 39th surface $\kappa = 0$
$C_4 = -3.91974 \times 10^{-11}$  $C_6 = 5.90682 \times 10^{-14}$
$C_8 = 2.85949 \times 10^{-18}$  $C_{10} = -1.01828 \times 10^{-22}$
$C_{12} = 2.26543 \times 10^{-27}$  $C_{14} = -1.90645 \times 10^{-32}$ 43rd surface $\kappa = 0$
$C_4 = 8.33324 \times 10^{-8}$  $C_6 = 1.42277 \times 10^{-11}$
$C_8 = -1.13452 \times 10^{-15}$  $C_{10} = 1.18459 \times 10^{-18}$
$C_{12} = -2.83937 \times 10^{-22}$  $C_{14} = 5.01735 \times 10^{-26}$ (Values corresponding to Condition)

F1 = 164.15 mm
$Y_0$ = 17.0 mm
R = 20.86 mm
(1) F1/$Y_0$ = 9.66
(2) R/$Y_0$ = 1.227

Figure 6:
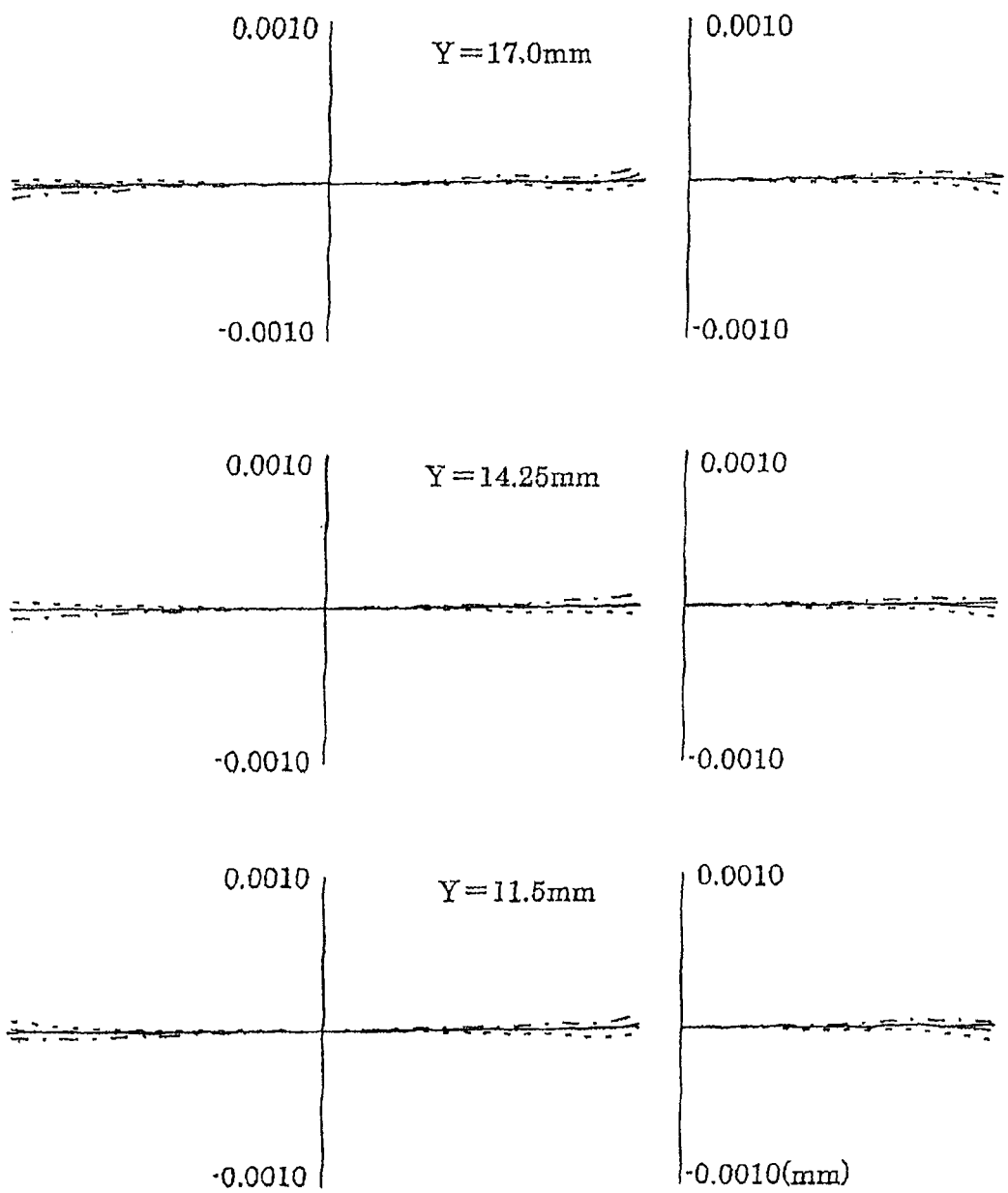
FIG. 6 is a diagram showing the transverse aberration in the first example.

FIG. 6 is a diagram showing the transverse aberration in the first example. In the aberration diagram, Y indicates the image height, each solid line the center wavelength of 193.3060 nm, each dashed line 193.306 nm+0.1 pm=193.3061 nm, and each chain line 193.306 nm−0.1 pm=193.3059 nm. The notations in FIG. 6 also apply to FIG. 8 hereinafter. As apparent from the aberration diagram of FIG. 6, though the first example secures the very large image-side numerical aperture (NA=1.04) and the relatively large effective exposure region ER, the chromatic aberration is well corrected for the exposure light with the wavelength band of 193.306 nm±0.1 pm.

Second Example

Figure 7:
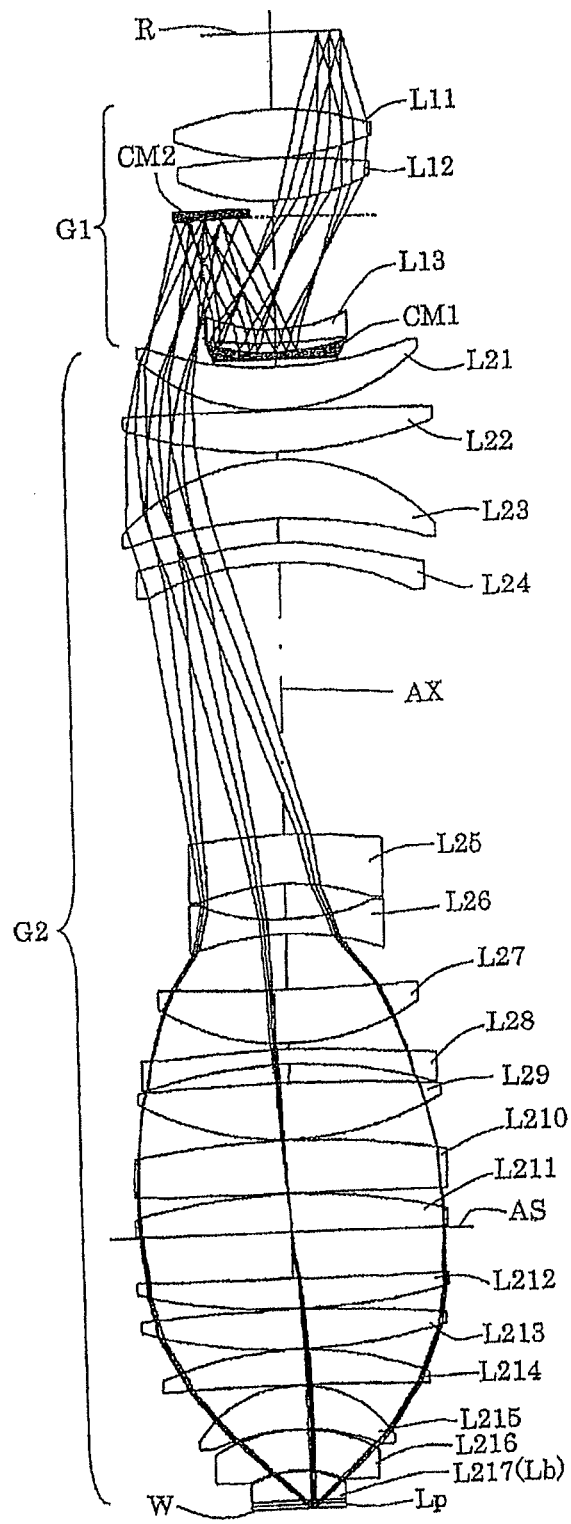
FIG. 7 is an illustration showing a lens configuration of a projection optical system according to the second example of the embodiment.

FIG. 7 is an illustration showing a lens configuration of the projection optical system according to the second example of the present embodiment. With reference to FIG. 7, in the projection optical system PL according to the second example, the first imaging optical system G1 is composed of the following components in order from the reticle side along the traveling direction of light: a biconvex lens L11 whose convex surface of aspherical shape is kept toward the wafer; a biconvex lens L12; a negative meniscus lens L13 whose concave surface of aspherical shape is kept toward the reticle; and a first concave reflecting mirror CM1. In the first imaging optical system G1, a reflecting surface of a second concave reflecting mirror CM2 for reflecting the light reflected by the first concave reflecting mirror CM1 and transmitted by the negative meniscus lens L13, toward the second imaging optical system G2 is placed in the region not including the optical axis AX between the biconvex lens L12 and the negative meniscus lens L13. Therefore, the biconvex lens L11 and the biconvex lens L12 constitute a first lens unit having a positive refracting power. The first concave reflecting mirror CM1 constitutes a concave reflecting mirror disposed near the pupil plane of the first imaging optical system G1.

On the other hand, the second imaging optical system G2 is composed of the following components in order from the reticle side along the traveling direction of light: a positive meniscus lens L21 whose concave surface is kept toward the reticle; a biconvex lens L22; a positive meniscus lens L23 whose concave surface of aspherical shape is kept toward the wafer; a negative meniscus lens L24 whose convex surface of aspherical shape is kept toward the reticle; a negative meniscus lens L25 whose convex surface is kept toward the reticle; a biconcave lens L26 whose concave surface of aspherical shape is kept toward the reticle; a positive meniscus lens L27 whose concave surface is kept toward the reticle; a negative meniscus lens L28 whose convex surface of aspherical shape is kept toward the reticle; a biconvex lens L29; a biconvex lens L210; a positive meniscus lens L211 whose convex surface is kept toward the reticle; an aperture stop AS; a positive meniscus lens L212 whose concave surface is kept toward the reticle; a biconvex lens L213; a positive meniscus lens L214 whose concave surface of aspherical shape is kept toward the wafer; a positive meniscus lens L215 whose convex surface is kept toward the reticle; a positive meniscus lens L216 whose concave surface of aspherical shape is kept toward the wafer; and a planoconvex lens L217 (boundary lens Lb) whose plane is kept toward the wafer.

In the second example, a plane-parallel plate Lp is disposed in the optical path between the planoconvex lens L217 as the boundary lens Lb and the wafer W. The medium Lm consisting of deionized water is filled in the optical path between the boundary lens Lb and the plane-parallel plate Lp and in the optical path between the plane-parallel plate Lp and the wafer W. In the second example, the transmitting members (lenses) constituting the projection optical system PL are made of silica or fluorite ($CaF_2$). Specifically, the lens L13, lens L216, and lens L217 (Lb) are made of fluorite, and the other lenses and plane-parallel plate Lp are made of silica. Namely, approximately 88% of the transmitting members forming the second imaging optical system G2 are made of silica.

Furthermore, in the second example all the transmitting members (lenses and plane-parallel plate) and all the reflecting members with a power (first concave reflecting mirror CM1 and second concave reflecting mirror CM2) forming the projection optical system PL are arranged along the single optical axis AX. In the second example, thus, the light from the reticle R travels through the lenses L11 to L13 to enter the first concave reflecting mirror CM1. The light reflected by the first concave reflecting mirror CM1 travels via the lens L13 and the second concave reflecting mirror CM2 to form an intermediate image of the reticle R near the first concave reflecting mirror CM1. The light reflected by the second concave reflecting mirror CM2 travels through the lenses L21-L217 (Lb) and the plane-parallel plate Lp to form a reduced image of the reticle R on the wafer W.

In the second example, the lasing center wavelength of the ArF excimer laser light being the exposure light is 193.306 nm, and the refractive index of silica near 193.306 nm varies at a rate of $-1.591 \times 10^{-6}$ per wavelength change of +1 pm and varies at a rate of $+1.591 \times 10^{-6}$ per wavelength change of −1 pm. In other words, the dispersion (dn/dλ) of the refractive index of silica near 193.306 nm is $-1.591 \times 10^{-6}$/pm. The refractive index of fluorite near 193.306 nm varies at a rate of $-0.980 \times 10^{-6}$ per wavelength change of +1 pm and varies at a rate of $+0.980 \times 10^{-6}$ per wavelength change of −1 pm. In other words, the dispersion (dn/dλ) of the refractive index of fluorite near 193.306 nm is $-0.980 \times 10^{-6}$/pm.

Furthermore, the refractive index of deionized water near 193.306 nm varies at a rate of $-2.6 \times 10^{-6}$ per wavelength change of +1 pm, and varies at a rate of $+2.6 \times 10^{-6}$ per wavelength change of −1 pm. In other words, the dispersion (dn/dλ) of the refractive index of deionized water near 193.306 nm is $-2.6 \times 10^{-6}$/pm. In the second example, thus, the refractive index of silica for the center wavelength of 193.306 nm is 1.5603261, the refractive index of silica for 193.306 nm+0.1 pm=193.3061 nm is 1.560325941, and the refractive index of silica for 193.306 nm−0.1 pm=193.3059 nm is 1.560326259.

The refractive index of fluorite for the center wavelength of 193.306 nm is 1.5014548, the refractive index of fluorite for 193.306 nm+0.1 pm=193.3061 nm is 1.501454702, and the refractive index of fluorite for 193.306 nm−0.1 pm=193.3059 nm is 1.501454898. Furthermore, the refractive index of deionized water for the center wavelength of 193.306 nm is 1.47, the refractive index of deionized water for 193.306 nm+0.1 pm=193.3061 nm is 1.46999974, and the refractive index of deionized water for 193.306 nm−0.1 pm=193.3059 nm is 1.47000026. Table (2) below presents values of specifications of the projection optical system PL in the second example.

TABLE 2

(Principal Specifications)

λ = 193.306 nm
β = +¼
NA = 1.04
Ro = 17.0 mm
Ri = 11.5 mm
H = 26.0 mm
D = 4.0 mm
R = 20.86 mm
Y₀ = 17.0 mm (Specifications of Optical Members)

| Surface Number | r | d | n | Optical member |
|---|---|---|---|---|
|  | (reticle surface) | 72.14497 |  |  |
| 1 | 295.66131 | 46.03088 | 1.5603261 | (L11) |
| 2* | −228.07826 | 1.02581 |  |  |
| 3 | 847.63618 | 40.34103 | 1.5603261 | (L12) |
| 4 | −207.90948 | 124.65407 |  |  |
| 5* | −154.57886 | 13.00000 | 1.5014548 | (L13) |
| 6 | −667.19164 | 9.58580 |  |  |
| 7 | −209.52775 | −9.58580 |  | (CM1) |
| 8 | −667.19164 | −13.00000 | 1.5014548 | (L13) |
| 9* | −154.57886 | −109.65407 |  |  |
| 10 | 2517.52751 | 147.23986 |  | (CM2) |
| 11 | −357.71318 | 41.75496 | 1.5603261 | (L21) |
| 12 | −196.81705 | 1.00000 |  |  |
| 13 | 8379.53651 | 40.00000 | 1.5603261 | (L22) |
| 14 | −454.81020 | 8.23083 |  |  |
| 15 | 206.30063 | 58.07852 | 1.5603261 | (L23) |
| 16* | 367.14898 | 24.95516 |  |  |
| 17* | 258.66863 | 20.00000 | 1.5603261 | (L24) |
| 18 | 272.27694 | 274.16477 |  |  |
| 19 | 671.42370 | 49.62123 | 1.5603261 | (L25) |

TABLE 2-continued

| 20 | 225.79907 | 35.51978 |  |  |
|---|---|---|---|---|
| 21* | −283.63484 | 15.10751 | 1.5603261 | (L26) |
| 22 | 261.37852 | 56.71822 |  |  |
| 23 | −1947.68869 | 54.63076 | 1.5603261 | (L27) |
| 24 | −227.05849 | 5.77639 |  |  |
| 25* | 788.97953 | 15.54026 | 1.5603261 | (L28) |
| 26 | 460.12935 | 18.83954 |  |  |
| 27 | 1925.75038 | 56.54051 | 1.5603261 | (L29) |
| 28 | −295.06884 | 1.00000 |  |  |
| 29 | 861.21046 | 52.50515 | 1.5603261 | (L210) |
| 30 | −34592.86759 | 1.00000 |  |  |
| 31 | 614.86639 | 37.34179 | 1.5603261 | (L211) |
| 32 | 39181.66426 | 1.00000 |  |  |
| 33 | ∞ | 46.27520 |  | (AS) |
| 34 | −11881.91854 | 30.00000 | 1.5603261 | (L212) |
| 35 | −631.95129 | 1.00000 |  |  |
| 36 | 1465.88641 | 39.89113 | 1.5603261 | (L213) |
| 37 | −542.10144 | 1.00000 |  |  |
| 38 | 336.45791 | 34.80369 | 1.5603261 | (L214) |
| 39* | 2692.15238 | 1.00000 |  |  |
| 40 | 112.42843 | 43.53915 | 1.5603261 | (L215) |
| 41 | 189.75478 | 1.00000 |  |  |
| 42 | 149.91358 | 42.41577 | 1.5014548 | (L216) |
| 43* | 107.28888 | 1.06533 |  |  |
| 44 | 90.28791 | 31.06087 | 1.5014548 | (L217:Lb) |
| 45 | ∞ | 1.00000 | 1.47 | (Lm) |
| 46 | ∞ | 3.00000 | 1.5603261 | (Lp) |
| 47 | ∞ | 5.00000 | 1.47 | (Lm) |
|  | (wafer surface) |  |  |  |

(Aspherical data)

2nd surface

κ = 0
$C_4 = 9.57585 \times 10^{-9}$        $C_6 = 7.09690 \times 10^{-13}$
$C_8 = 1.30845 \times 10^{-16}$       $C_{10} = -5.52152 \times 10^{-22}$
$C_{12} = 4.46914 \times 10^{-25}$    $C_{14} = -2.07483 \times 10^{-29}$ 5th surface and 9th surface (same surface)

κ = 0
$C_4 = 1.16631 \times 10^{-8}$        $C_6 = 6.70616 \times 10^{-13}$
$C_8 = -1.87976 \times 10^{-17}$      $C_{10} = 1.71587 \times 10^{-20}$
$C_{12} = -2.34827 \times 10^{-24}$   $C_{14} = 1.90285 \times 10^{-28}$ 16th surface κ = 0
$C_4 = -4.06017 \times 10^{-8}$       $C_6 = 2.22513 \times 10^{-12}$
$C_8 = -9.05000 \times 10^{-17}$      $C_{10} = 3.29839 \times 10^{-21}$
$C_{12} = -7.46596 \times 10^{-26}$   $C_{14} = 1.06948 \times 10^{-30}$ 17th surface κ = 0
$C_4 = -6.69592 \times 10^{-8}$       $C_6 = 1.42455 \times 10^{-12}$
$C_8 = -5.65516 \times 10^{-17}$      $C_{10} = 2.48078 \times 10^{-21}$
$C_{12} = -2.91653 \times 10^{-26}$   $C_{14} = 1.53981 \times 10^{-31}$ 21st surface κ = 0
$C_4 = -7.97186 \times 10^{-8}$       $C_6 = -1.32969 \times 10^{-12}$
$C_8 = -1.98377 \times 10^{-17}$      $C_{10} = -4.95016 \times 10^{-21}$
$C_{12} = 2.53886 \times 10^{-25}$    $C_{14} = -4.16817 \times 10^{-29}$ 25th surface κ = 0
$C_4 = -1.55844 \times 10^{-8}$       $C_6 = 7.27672 \times 10^{-14}$
$C_8 = 1.90600 \times 10^{-18}$       $C_{10} = 1.21465 \times 10^{-23}$
$C_{12} = -7.56829 \times 10^{-29}$   $C_{14} = 1.86889 \times 10^{-32}$ 39th surface κ = 0
$C_4 = -6.91993 \times 10^{-11}$      $C_6 = 7.80595 \times 10^{-14}$
$C_8 = 3.31216 \times 10^{-18}$       $C_{10} = -1.39159 \times 10^{-22}$
$C_{12} = 3.69991 \times 10^{-27}$    $C_{14} = -4.01347 \times 10^{-32}$ TABLE 2-continued 43rd surface κ = 0
$C_4 = 8.30019 \times 10^{-8}$    $C_6 = 1.24781 \times 10^{-11}$
$C_8 = -9.26768 \times 10^{-16}$   $C_{10} = 1.08933 \times 10^{-18}$
$C_{12} = -3.01514 \times 10^{-22}$  $C_{14} = 5.41882 \times 10^{-26}$ (Values corresponding to Condition)

F1 = 178.98 mm
$Y_0$ = 17.0 mm
R = 20.86 mm
(1) $F1/Y_0$ = 10.53
(2) $R/Y_0$ = 1.227

FIG. 8 is a diagram showing the transverse aberration in the second example. It is also apparent from the aberration diagram of FIG. 8, as was the case with the first example, that the second example also secures the very large image-side numerical aperture (NA=1.04) and the relatively large effective exposure region ER, while the chromatic aberration is well corrected for the exposure light with the wavelength band of 193.306 nm±0.1 pm.

In each example, as described above, the high image-side numerical aperture of 1.04 is secured for the ArF excimer laser light with the wavelength of 193.306 nm, and the effective exposure region (still exposure region) of arcuate shape of 26.0 mm×4.0 mm can be secured; therefore, the scanning exposure of the circuit pattern can be performed at high resolution within the exposure region of rectangular shape of 26 mm×33 mm, for example.

Figure 9:
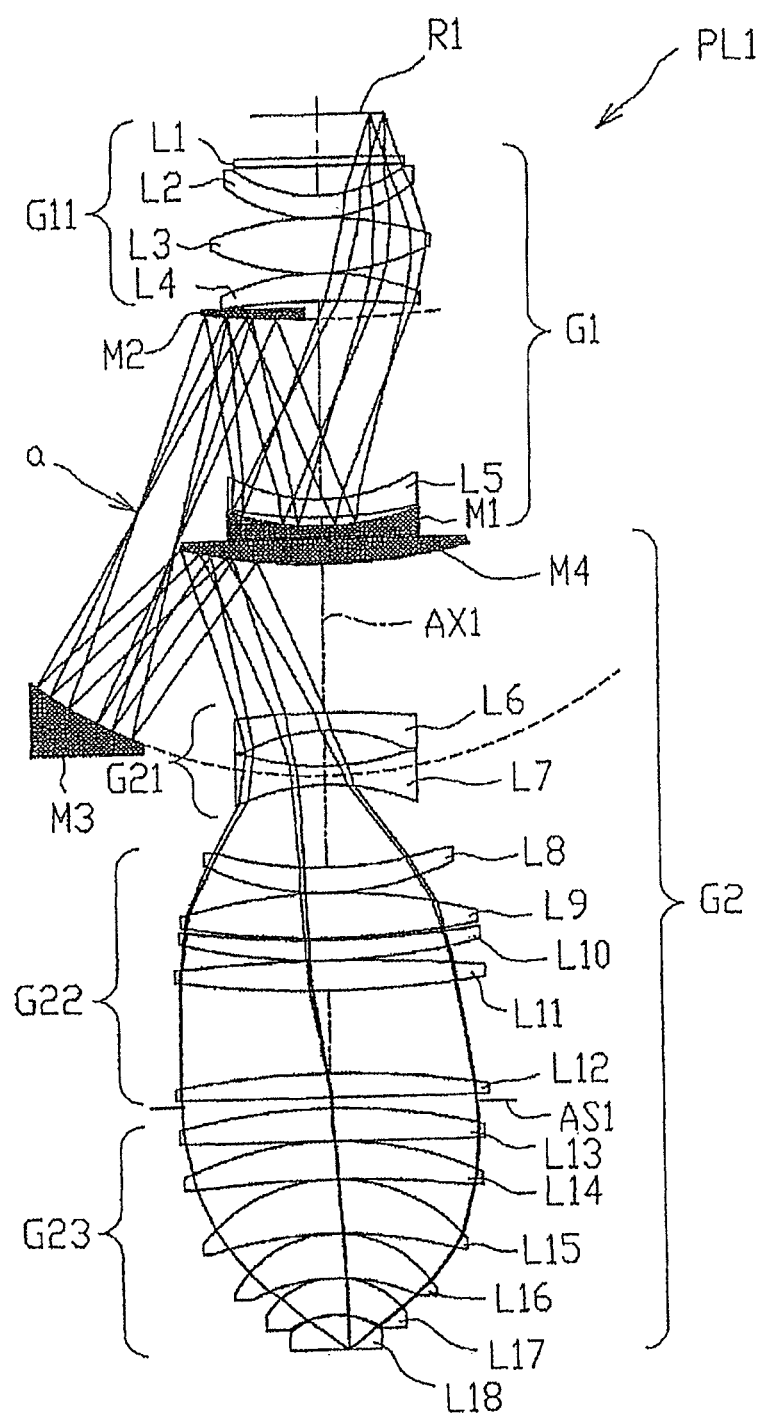
FIG. 9 is an illustration showing a lens configuration of a catadioptric projection optical system according to the third example.

Next, the third example of the embodiment will be described. FIG. 9 is an illustration showing a lens configuration of the catadioptric projection optical system according to the third example of the embodiment. The catadioptric projection optical system PL1 according to the third example is composed of the following optical systems in order from the object side (i.e., the reticle R1 side): a first imaging optical system G1 for forming an intermediate image of the reticle R1 located on the first surface; and a second imaging optical system G2 for forming an intermediate image of the reticle R1 on a wafer (not shown) located on the second surface.

The first imaging optical system G1 is composed of a lens unit with a positive refracting power (fourth lens unit or first unit) G11, after-described lens L5, and two reflecting mirrors M1, M2. The lens unit G11 functions for making the optical system telecentric on the reticle R1 side. The second imaging optical system G2 is composed of after-described two reflecting mirrors M3, M4, a lens unit with a negative refracting power (first lens unit or third unit) G21, a lens unit with a positive refracting power (second lens unit) G22, an aperture stop AS1, and a lens unit with a positive refracting power (third lens unit) G23. The lens unit G21 functions to adjust the magnification and to relieve the variation due to the difference of field angles of the beam expanded by the reflecting mirror M3, so as to suppress occurrence of aberration. The lens unit G22 functions to converge the diverging beam. The lens unit G23 functions to condense the beam so as to achieve the large numerical aperture on the wafer side.

Here the lens unit G11 is composed of the following components in order of passage of rays from the object side (reticle R1 side): a plane-parallel plate L1; a negative meniscus lens L2 whose concave surface of aspherical shape is kept toward the object side; a biconvex lens L3; and a positive meniscus lens L4 whose concave surface of aspherical shape is kept toward the wafer.

The beam transmitted by the positive meniscus lens L4 travels through the negative meniscus lens (negative lens) L5 with the concave surface kept toward the object, is reflected by the concave reflecting mirror (concave mirror or first reflecting mirror) M1 with the concave surface kept toward the object, passes again through the negative meniscus lens L5, and is reflected by the convex reflecting mirror (optical path separating mirror or second reflecting mirror) M2 with the convex surface kept toward the wafer. The negative meniscus lens L5 functions for satisfying the Petzval's condition.

The beam reflected by the convex reflecting mirror M2 forms an intermediate image of the reticle R1 at the position a shown in FIG. 9, in order to securely achieve the optical path separation between the beam toward the reticle R1 and the beam toward the wafer. Here the position a is located on or near a plane whose normal is the optical axis AX1 where the concave reflecting mirror M1 is placed.

Next, the beam reflected by the convex reflecting mirror M2 is incident to the concave reflecting mirror (first field mirror or third reflecting mirror) M3 with the concave surface kept toward the object, to be bent into a direction toward the optical axis AX1 of the catadioptric projection optical system PL1, and is outputted from the concave reflecting mirror M3. The beam emerging from the concave reflecting mirror M3 is quickly converged, is reflected by the convex reflecting mirror (second field mirror or fourth reflecting mirror) M4 with the convex surface kept toward the wafer, and is directly incident to the negative meniscus lens L6 forming the lens unit G21. The convex reflecting mirror M4 relieves the variation of the beam due to field angles expanded by the concave reflecting mirror M3, so as to suppress occurrence of aberration. The negative meniscus lens L5, concave reflecting mirror M1, convex reflecting mirror M2, concave reflecting mirror M3, and convex reflecting mirror M4 constitute a second unit.

The lens unit G21 is composed of the following components in order of passage of rays: a negative meniscus lens L6 whose convex surface of aspherical shape is kept toward the object; and a biconcave lens L7 whose concave surface of aspherical shape is kept toward the wafer. Since the negative meniscus lens L6 and the biconcave lens L7 have the lens surfaces of aspherical shape, good imaging performance can be achieved throughout the entire region in the exposure area, while securing the large numerical aperture on the image side of the catadioptric projection optical system PL1. The lens unit G22 is composed of the following components in order of passage of rays: a positive meniscus lens L8 whose concave surface of aspherical shape is kept toward the object; a biconvex lens L9; a positive meniscus lens L10 whose concave surface of aspherical shape is kept toward the object; a biconvex lens L11; and a biconvex lens L12. The lens unit G23 is composed of the following components in order of passage of rays: a positive meniscus lens L13 whose convex surface is kept toward the object; a positive meniscus lens L14 whose convex surface is kept toward the object; a positive meniscus lens L15 whose convex surface is kept toward the object; a positive meniscus lens L16 whose concave surface of aspherical shape is kept toward the wafer; a positive meniscus lens L17 whose concave surface of aspherical shape is kept toward the wafer; and a planoconvex lens L18 with a positive refracting power whose convex surface is kept toward the object. The lens unit G22, aperture stop AS1, and lens unit G23 constitute a fourth unit.

The catadioptric projection optical system PL1 is constructed to satisfy the condition of 0.17<Ma/L<0.6, where Ma is a distance on the optical axis AX1 between the reflecting mirror M3 and the aperture stop AS1, and L a distance between the reticle R1 and the wafer. When Ma/L satisfies the lower limit, it is feasible to avoid mechanical interference of the concave reflecting mirror M3 with the lens unit G21 and the lens unit G22. When Ma/L satisfies the upper limit, it is feasible to avoid an increase in the total length and an increase in the size of the catadioptric projection optical system PL1. For securely avoiding the mechanical interference and securely avoiding the increase in the total length and the increase in the size of the projection optical system, the projection optical system is further preferably constructed to satisfy the condition of 0.2<Ma/L<0.5.

When this catadioptric projection optical system PL1 of the present example is applied to the exposure apparatus, pure water with the refractive index of about 1.4 is interposed in the optical path between the lens L18 and the wafer, where the refractive index of the atmosphere in the catadioptric projection optical system PL1 is 1. Therefore, the wavelength of the exposure light in pure water is about 0.71 (1/1.4) times that in the atmosphere, whereby the resolution can be enhanced.

The optical axis AX1 of every optical element included in the catadioptric projection optical system PL1 and having the predetermined refracting power is placed substantially on the single straight line, and the region of the image formed on the wafer by the catadioptric projection optical system PL1 is the off-axis region not including the optical axis AX1. Therefore, it is feasible to reduce the degree of difficulty of production in production of the catadioptric projection optical system PL1 and to readily achieve relative adjustment of each optical member.

In the catadioptric projection optical system PL1 of the third example, since the intermediate image of the reticle R1 is formed in the first imaging optical system G1, it is feasible to readily and securely achieve the optical path separation between the beam toward the reticle R1 and the beam toward the wafer, even in the case where the numerical apertures of the catadioptric projection optical system PL1 are increased. Since the second imaging optical system G2 has the lens unit G21 with the negative refracting power, it is feasible to shorten the total length of the catadioptric projection optical system PL1 and to readily achieve the adjustment for satisfying the Petzval's condition. Furthermore, the lens unit G21 relieves the variation due to the difference of field angles of the beam expanded by the concave reflecting mirror M3, so as to suppress occurrence of aberration. Therefore, good imaging performance can be achieved throughout the entire region in the exposure area, even in the case where the reticle R1-side and wafer-side numerical apertures of the catadioptric projection optical system PL1 are increased in order to enhance the resolution.

Figure 10:
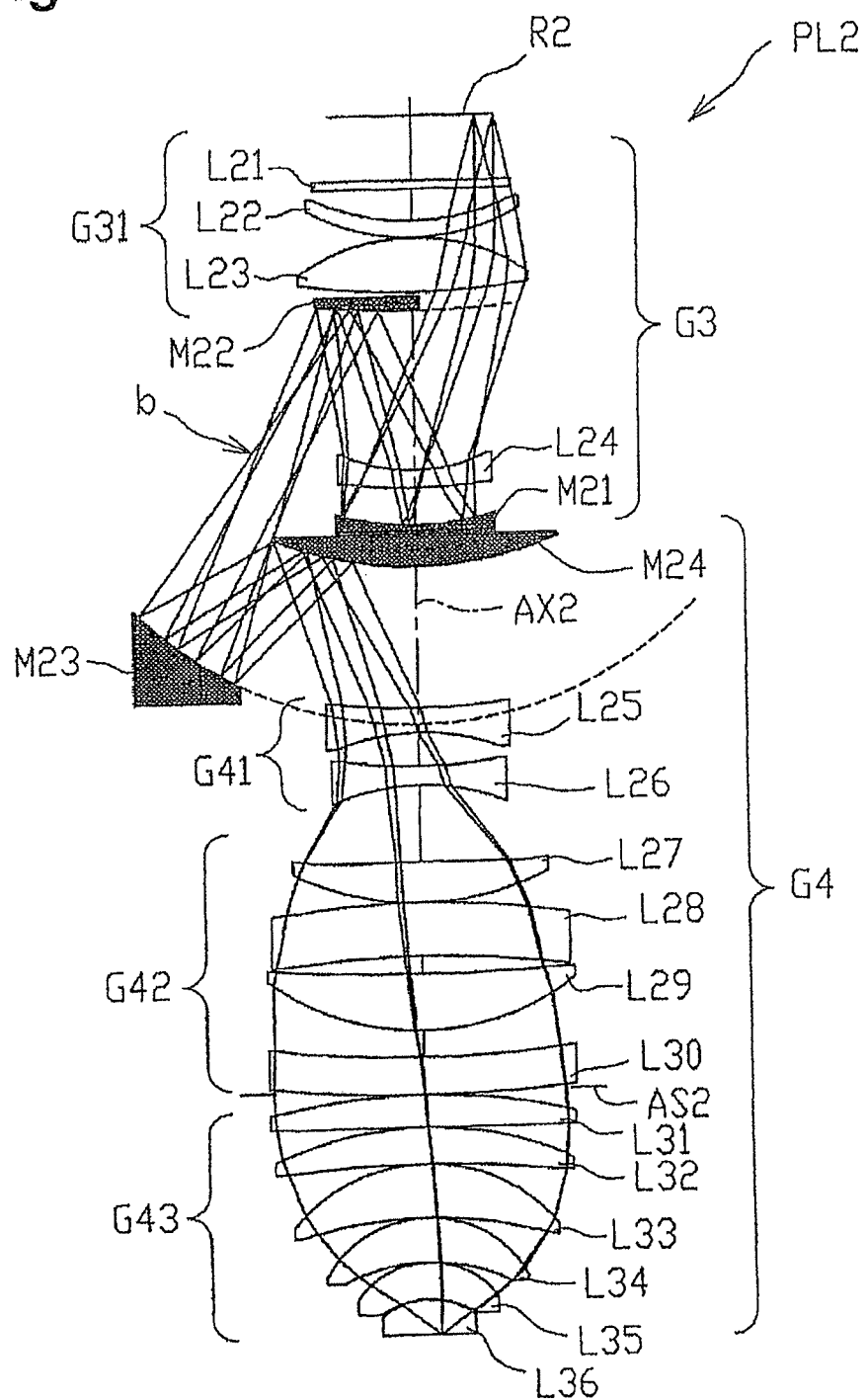
FIG. 10 is an illustration showing a lens configuration of a catadioptric projection optical system according to the fourth example.

Next, the fourth example of the embodiment will be described with reference to the drawing. FIG. 10 is an illustration showing a lens configuration of the catadioptric projection optical system according to the fourth example of the embodiment. The catadioptric projection optical system PL2 of the fourth example is composed of the following optical systems in order from the object side (i.e., the reticle R2 side): a first imaging optical system G3 for forming an intermediate image of reticle R2 located on the first surface; and a second imaging optical system G4 for forming an intermediate image of the reticle R2 on a wafer (not shown) located on the second surface.

The first imaging optical system G3 is composed of a lens unit with a positive refracting power (fourth lens unit or first unit) G31, after-described lens L24, and two reflecting mirrors M21, M22. The lens unit G31 functions for making the optical system telecentric on the reticle R2 side. The second imaging optical system G4 is composed of after-described two reflecting mirrors M23, M24, a lens unit with a negative refracting power (first lens unit or third unit) G41, a lens unit with a positive refracting power (second lens unit) G42, an aperture stop AS2, and a lens unit with a positive refracting power (third lens unit) G43. The lens unit G41 functions to adjust the magnification and to relieve the variation due to the difference of field angles of the beam expanded by the reflecting mirror M23, so as to suppress occurrence of aberration. The lens unit G42 functions to converge the diverging beam. The lens unit G43 condenses the beam so as to achieve a large numerical aperture on the wafer side.

Here the lens unit G31 is composed of the following components in order of passage of rays from the object side (reticle R2 side): a plane-parallel plate L21; a positive meniscus lens L22 whose concave surface of aspherical shape is kept toward the object; and a biconvex lens L23. The beam transmitted by the biconvex lens L23 passes through the negative meniscus lens (negative lens) L24 with the concave surface kept toward the object, is reflected by the concave reflecting mirror (concave reflecting mirror or first reflecting mirror) M21 with the concave surface of aspherical shape kept toward the object, passes again through the negative meniscus lens L24, and is then reflected by the convex reflecting mirror (optical path separating mirror or second reflecting mirror) M22 with the convex surface of aspherical shape kept toward the wafer. The negative meniscus lens L24 functions for satisfying the Petzval's condition.

The beam reflected by the convex reflecting mirror M22 forms an intermediate image of the reticle R2 at the position b shown in FIG. 10, in order to securely achieve the optical path separation between the beam toward the reticle R2 and the beam toward the wafer. Here the position b is located on or near a plane whose normal is the optical axis AX2 where the concave reflecting mirror M21 is placed.

Next, the beam reflected by the convex reflecting mirror M22 is incident to the concave reflecting mirror (first field mirror or third reflecting mirror) M23 with the concave surface kept toward the object, to be bent into a direction toward the optical axis AX2 of the catadioptric projection optical system PL2, and is reflected by the concave reflecting mirror M23. The beam reflected by the concave reflecting mirror M23 is quickly converged, is reflected by the convex reflecting mirror (second field mirror or fourth reflecting mirror) M24 with the convex surface of aspherical shape kept toward the wafer, and is directly incident to the biconcave lens L25 forming the lens unit G41. The convex reflecting mirror M24 relieves the variation of the beam due to the field angles expanded by the concave reflecting mirror M23, so as to suppress occurrence of aberration. The negative meniscus lens L24, concave reflecting mirror M21, convex reflecting mirror M22, concave reflecting mirror M23, and convex reflecting mirror M24 constitute a second unit.

The lens unit G41 is composed of the following components in order of passage of rays: a biconcave lens L25 whose concave surface of aspherical shape is kept toward the object; and a biconcave lens L26 whose concave surface of aspherical shape is kept toward the wafer. Since the biconcave lens L25 and the biconcave lens L26 have the lens surfaces of aspherical shape, it is feasible to achieve good imaging performance throughout the entire region in the exposure area, while achieving the large numerical aperture on the image side of the catadioptric projection optical system PL2.

The lens unit G42 is composed of the following components in order of passage of rays: a biconvex lens L27 whose convex surface of aspherical shape is kept toward the object; a negative meniscus lens L28 whose convex surface is kept toward the object; a positive meniscus lens L29 whose concave surface is kept toward the object; and a negative meniscus lens L30 whose convex surface of aspherical shape is kept toward the wafer. The lens unit G43 is composed of the following components in order of passage of rays: a positive meniscus lens L31 whose convex surface is kept toward the object; a positive meniscus lens L32 whose convex surface is kept toward the object; a positive meniscus lens L33 whose convex surface is kept toward the object; a positive meniscus lens L34 whose concave surface of aspherical shape is kept toward the wafer; a positive meniscus lens L35 whose concave surface of aspherical shape is kept toward the wafer; and a planoconvex lens L36 whose convex surface is kept toward the object. The lens unit G42, aperture stop AS2, and lens unit G43 constitute a fourth unit.

The catadioptric projection optical system PL2 is constructed so as to satisfy the condition of $0.17<M2a/L2<0.6$, where M2 is a distance on the optical axis AX2 between the reflecting mirror M23 and the aperture stop AS2, and L2 the distance between the reticle R2 and the wafer. When M2a/L2 satisfies the lower limit, it is feasible to avoid mechanical interference of the concave reflecting mirror M23 with the lens unit G41 and the lens unit G42. When M2a/L2 satisfies the upper limit, it is feasible to avoid an increase in the total length and an increase in the size of the catadioptric projection optical system PL2. For securely avoiding the mechanical interference and securely avoiding the increase in the total length and the increase in the size of the projection optical system, the projection optical system is more preferably constructed to satisfy the condition of $0.5<M2a/L2<0.2$.

When the catadioptric projection optical system PL2 of this example is applied to the exposure apparatus, pure water having the refractive index of about 1.4 is interposed in the optical path between the lens L36 and the wafer, where the refractive index of the atmosphere in the catadioptric projection optical system PL2 is 1. Therefore, the wavelength of the exposure light in pure water becomes about 0.71 (1/1.4) times that in the atmosphere, whereby the resolution can be enhanced.

The optical axis AX2 of every optical element included in the catadioptric projection optical system PL2 and having the predetermined refracting power is placed substantially on the single straight line, and the region of the image formed on the wafer by the catadioptric projection optical system PL2 is the off-axis region not including the optical axis AX2. Therefore, it is feasible to reduce the degree of difficulty of production in production of the catadioptric projection optical system PL2 and to readily achieve relative adjustment of each optical member.

Since the catadioptric projection optical system PL2 of the fourth example forms the intermediate image of the reticle R2 in the first imaging optical system G3, the optical path separation can be readily and securely achieved between the beam toward the reticle R2 and the beam toward the wafer, even in the case where the numerical apertures of the catadioptric projection optical system PL2 are increased. Since the second imaging optical system G4 has the lens unit G41 with the negative refracting power, it is feasible to shorten the total length of the catadioptric projection optical system PL2 and to readily achieve the adjustment for satisfying the Petzval's condition. Furthermore, the lens unit G41 relieves the variation due to the difference of field angles of the beam expanded by the concave reflecting mirror M23, so as to suppress occurrence of aberration. Therefore, good imaging performance can be achieved throughout the entire region in the exposure area, even in the case where the reticle R2-side and wafer-side numerical apertures of the catadioptric projection optical system PL2 are increased in order to enhance the resolution.

The catadioptric projection optical system PL1 of the third example described above is arranged so that the light reflected by the convex reflecting mirror M4 is incident to the lens unit G21, but the optical system may also be arranged so that a double pass lens is disposed between the convex reflecting mirror M4 and the lens unit G21. In this case, the light reflected by the concave reflecting mirror M3 passes through the double pass lens, is reflected by the convex reflecting mirror M4, passes again through the double pass lens, and then enters the lens unit G21. Similarly, the catadioptric projection optical system PL2 of the fourth example is arranged so that the light reflected by the convex reflecting mirror M24 is incident to the lens unit G41, but the optical system may also be arranged so that a double pass lens is disposed between the convex reflecting mirror M24 and the lens unit G41.

In the catadioptric projection optical systems PL1, PL2 of the respective examples described above, pure water was interposed between the lens located nearest to the wafer, and the wafer, and it is also possible to adopt a configuration wherein another medium having a refractive index larger than 1.1 is interposed, where the refractive index of the atmosphere in the catadioptric projection optical system PL1 or PL2 is 1.

Figure 11:
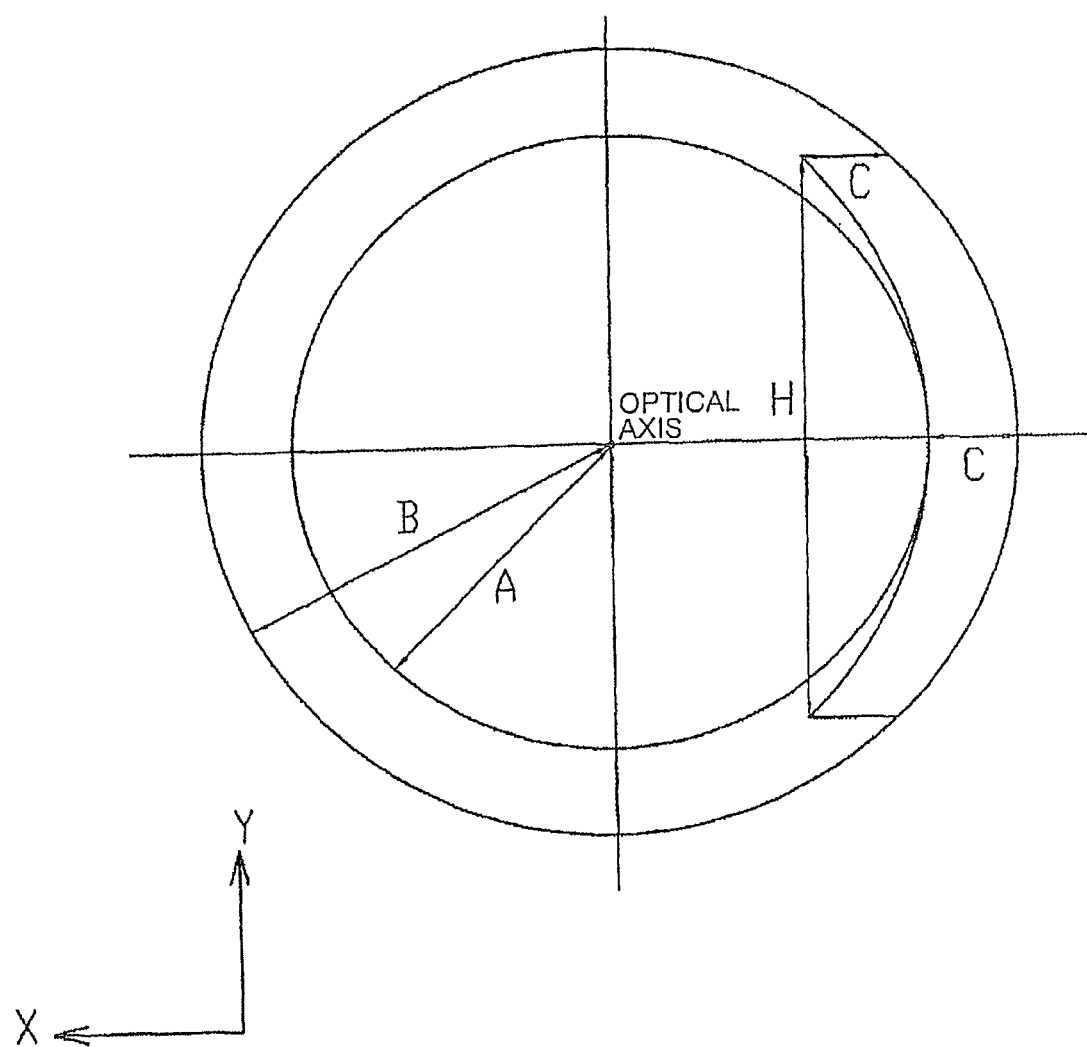
FIG. 11 is an illustration showing an exposure area on a wafer in the third and fourth examples.

Presented below are values of specifications of the catadioptric projection optical system PL1 according to the third example. In the specifications, as shown in FIG. 11, A represents a radius of a portion where the exposure light is blocked by the optical elements constituting the catadioptric projection optical system PL1, with the center on the optical axis AX1 of the catadioptric projection optical system PL1, B a radius of the maximum image height with the center on the optical axis AX1 of the catadioptric projection optical system PL1, H a length along the Y-direction of the effective exposure region, and C a length along the X-direction of the effective exposure region. In the specifications, NA represents the numerical aperture, d the surface separation, n the refractive index, and λ the center wavelength. Furthermore, in the specifications M represents the distance on the optical axis AX1 between the reflecting mirror M3 and the unrepresented wafer, and L the distance between the reticle R1 and the wafer.

Table 3 presents the specifications of the optical members of the catadioptric projection optical system PL1 according to the third example. In the specifications of the optical members in Table 3, each surface number in the first column indicates an order of a surface along the traveling direction of rays from the object side, the second column a radius of curvature of each surface (mm), the third column an on-axis spacing or surface separation (mm) of each surface, and the fourth column a glass material of each optical member.

Table 4 presents the aspherical coefficients of the lenses with a lens surface of aspherical shape and the reflecting mirrors used in the catadioptric projection optical system PL1 in the third example. In the aspherical coefficients of Table 4, aspherical surface numbers in the first column correspond to the surface numbers in the specifications of the optical members in Table 1. The second column represents the curvature of each aspherical surface (1/mm), the third column the conical coefficient k and the 12th-order aspherical coefficient, the fourth column the 4th-order and 0.14th-order aspherical coefficients, the fifth column the 6th-order and 16th-order aspherical coefficients, the sixth column the 8th-order and 18th-order aspherical coefficients, and the seventh column the 10th-order and 20th-order aspherical coefficients.

In the third and fourth examples, each aspherical surface is expressed by the aforementioned. Eq (a).

Third Example

Specifications

Image-side NA: 1.20
Exposure area: A=14 mm B=18 mm
H=26.0 mm C=4 mm
Imaging magnification: ¼
Center wavelength: 193.306 nm
Refractive index of silica: 1.5603261
Refractive index of fluorite: 1.5014548
Refractive index of liquid 1: 1.43664
Dispersion of silica $(dn/d\lambda)$: −1.591E-6/pm
Dispersion of fluorite $(dn/d\lambda)$: −0.980E-6/pm
Dispersion of liquid 1 $(dn/d\lambda)$: −2.6E-6/pm
Values corresponding to Condition Ma=374.65 mm L=1400 mm

TABLE 3

(Specifications of Optical Members)

| | #2 | #3 | #4 |
|---|---|---|---|
| #1 | ∞ | 50.0000 | |
| 1: | ∞ | 8.0000 | #5 |
| 2: | ∞ | 33.0000 | |
| 3: | ASP1 | 25.0422 | #5 |
| 4: | −163.96521 | 1.0000 | |
| 5: | 355.31617 | 60.7391 | #5 |
| 6: | −261.84115 | 1.0000 | |
| 7: | 277.33354 | 29.0109 | #5 |
| 8: | ASP2 | 224.5285 | |
| 9: | −176.61872 | 20.0000 | #5 |
| 10: | −515.60710 | 10.4614 | |
| 11: | ASP3 | −10.4614 | #6 |
| 12: | −515.60710 | −20.0000 | #5 |

TABLE 3-continued (Specifications of Optical Members)

| | #2 | #3 | #4 |
|---|---|---|---|
| 13: | −176.61872 | −204.5285 | |
| 14: | ASP4 | 518.3706 | #6 |
| 15: | −517.39842 | −241.3807 | #6 |
| 16: | −652.07494 | 171.3807 | #6 |
| 17: | ASP5 | 20.0000 | #5 |
| 18: | 171.59382 | 41.4743 | |
| 19: | −245.94525 | 20.0000 | #5 |
| 20: | ASP6 | 95.1415 | |
| 21: | ASP7 | 28.3218 | #5 |
| 22: | −273.72261 | 1.0000 | |
| 23: | 578.31684 | 49.6079 | #5 |
| 24: | −908.96420 | 1.0000 | |
| 25: | ASP8 | 23.1140 | #5 |
| 26: | −713.30127 | 1.0000 | |
| 27: | 1494.96847 | 33.6453 | #5 |
| 28: | −1392.26668 | 100.2723 | |
| 29: | 1382.10341 | 24.7691 | #5 |
| 30: | −2944133.03600 | 5.3079 | |
| 31: | ∞ | 6.0869 | #7 |
| 32: | 596.90080 | 37.1298 | #5 |
| 33: | 524859.29548 | 1.0000 | |
| 34: | 367.83725 | 41.0495 | #5 |
| 35: | 1341.09674 | 1.0000 | |
| 36: | 180.61255 | 61.4605 | #5 |
| 37: | 464.28786 | 1.0000 | |
| 38: | 125.76761 | 49.2685 | #5 |
| 39: | ASP9 | 1.0000 | |
| 40: | 89.27467 | 40.3615 | #5 |
| 41: | ASP10 | 1.1254 | |
| 42: | 79.35451 | 37.7011 | #5 |
| 43: | ∞ | 1.0000 | #8 |
| #9 | ∞ | | |

1: 1st surface
2: Radius of curvature
3: Surface spacing
4: Medium
5: silica glass
6: reflecting mirror
7: aperture stop
8: pure water
9: 2nd surface

1: 1st surface
2: Radius of curvature
3: Surface spacing
4: Medium
5: silica glass
6: reflecting mirror
7: aperture stop
8: pure water
9: 2nd surface

TABLE 4

(Aspherical Coefficients)

| | k | | c4 | c6 | c8 | c10 |
|---|---|---|---|---|---|---|
| #12 | #13 | c12 | c14 | c16 | c18 | c20 |
| ASP1 | −0.00714775 | 0.00000E+00 | 3.70121E-08 | 4.46586E-13 | 1.04583E-17 | 6.87573E-21 |
| | | −5.81072E-25 | 5.12583E-29 | 0.00000E+00 | 0.00000E+00 | 0.00000E+00 |
| ASP2 | 0.00091632 | 0.00000E+00 | 2.33442E-08 | −7.41117E-13 | 5.08507E-17 | −4.32871E-21 |
| | | 1.56850E-25 | −1.33250E-30 | 0.00000E+00 | 0.00000E+00 | 0.00000E+00 |
| ASP3 | −0.00346903 | 0.00000E+00 | −1.67447E-09 | −6.49516E-14 | −5.93050E-19 | −8.10217E-23 |
| | | 3.21506E-27 | −6.92598E-32 | 0.00000E+00 | 0.00000E+00 | 0.00000+00 |
| ASP4 | −0.00076630 | 0.00000E+00 | 3.06927E-10 | 4.69465E-14 | −6.39759E-19 | 2.45900E-23 |
| | | −8.28832E-28 | 1.58122E-32 | 0.00000E+00 | 0.00000E+00 | 0.00000E+00 |
| ASP5 | 0.00125662 | 0.00000E+00 | 1.03544E-08 | −1.28243E-12 | −3.97225E-17 | −8.03173E-21 |
| | | 3.90718E-25 | 1.64002E-30 | 0.00000E+00 | 0.00000E+00 | 0.00000E+00 |

TABLE 4-continued (Aspherical Coefficients)

| #12 | #13 | k<br>c12 | c4<br>c14 | c6<br>c16 | c8<br>c18 | c10<br>c20 |
|---|---|---|---|---|---|---|
| ASP6 | 0.00507634 | 0.00000E+00<br>1.41136E−25 | 1.00543E−08<br>−6.70515E−30 | −3.32807E−12<br>0.00000E+00 | −1.38706E−17<br>0.00000E+00 | 2.64276E−21<br>0.00000E+00 |
| ASP7 | −0.00253727 | 0.00000E+00<br>3.11154E−27 | −3.94919E−10<br>−4.99394E−31 | 9.50312E−14<br>0.00000E+00 | −1.02163E−18<br>0.00000E+00 | −1.22600E−22<br>0.00000E+00 |
| ASP8 | −0.00025661 | 0.00000E+00<br>5.86934E−28 | −9.13443E−09<br>−7.10478E−33 | −8.61174E−14<br>0.00000E+00 | 4.52406E−19<br>0.00000E+00 | −2.29061E−23<br>0.00000E+00 |
| ASP9 | 0.00458263 | 0.00000E+00<br>−2.22512E−25 | 2.66745E−08<br>1.68093E−20 | −3.15468E−13<br>0.00000E+00 | 7.16318E−17<br>0.00000E+00 | 1.41053E−21<br>0.00000E+00 |
| ASP10 | 0.01117107 | 0.00000E+00<br>−1.59072E−22 | 2.45701E−07<br>1.41579E−25 | 4.19793E−11<br>0.00000E+00 | 4.83523E−15<br>0.00000E+00 | 2.02242E−18<br>0.00000E+00 |

12: Aspherical surface number
13: Curvature

Figure 12:
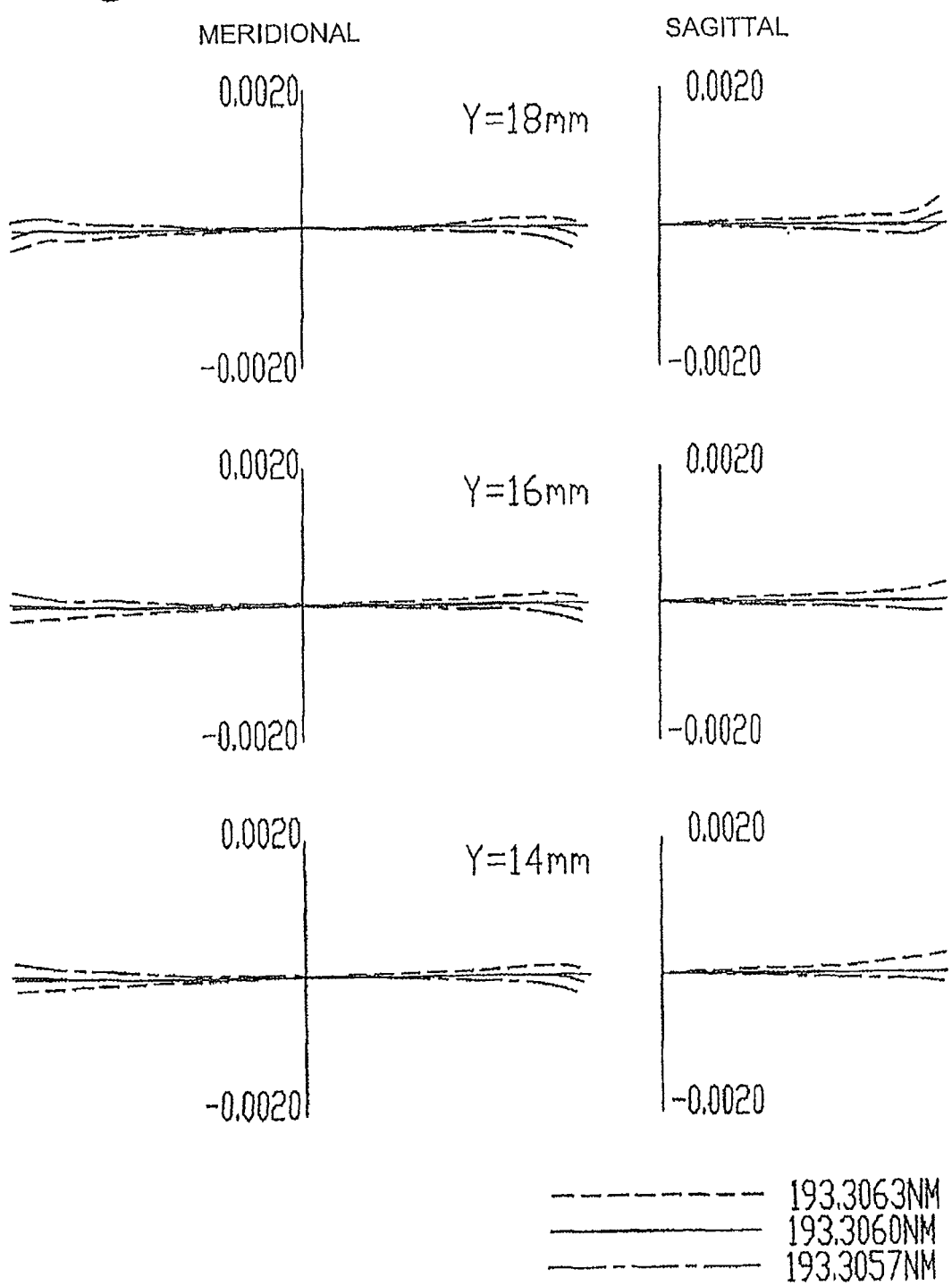
FIG. 12 is a transverse aberration diagram showing the transverse aberration in the meridional direction and in the sagittal direction of the catadioptric projection optical system in the third example.

FIG. 12 is a transverse aberration diagram showing the transverse aberration in the meridional direction and in the sagittal direction of the catadioptric projection optical system PL1 according to the present example. In FIG. 12, Y indicates the image height, each dashed line the transverse aberration at the wavelength of 193.3063 nm, each solid line the transverse aberration at the wavelength of 193.3060 nm, and each chain line the transverse aberration at the wavelength of 193.3057 nm. As shown in the transverse aberration diagram of FIG. 12, the catadioptric projection optical system PL1 of the present example has the large numerical aperture and is corrected in a good balance for aberration throughout the entire exposure area though it has no large optical element.

The values of specifications of the catadioptric projection optical system PL2 according to the fourth example will be presented below. Table 5 presents the specifications of the optical members of the catadioptric projection optical system PL2 in the fourth example. Table 6 presents the aspherical coefficients of the lenses with a lens surface of aspherical shape and the reflecting mirrors used in the catadioptric projection optical system PL2 according to the fourth example. The specifications, the specifications of the optical members, and the aspherical coefficients will be described with use of the same reference symbols as those used in the description of the specifications of the catadioptric projection optical system PL1 in the third example.

Fourth Example

Specifications

Image-side NA: 1.20
Exposure area: A=13.5 mm B=17.5 mm
H=26.0 mm C=4 mm
Imaging magnification: ⅕
Center wavelength: 193.306 nm
Refractive index of silica: 1.5603261
Refractive index of fluorite: 1.5014548
Refractive index of liquid 1: 1.43664
Dispersion of silica (dr/dλ): −1.591E−6/pm
Dispersion of fluorite (dn/dλ): −0.980E−6/pm
Dispersion of liquid 1 (dn/dλ): −2.6E−6/pm
Values corresponding to Condition Ma=424.85 mm
L=1400 mm

TABLE 5

(Specifications of Optical Members)

| | #2 | #3 | #4 |
|---|---|---|---|
| #1 | ∞ | 74.5841 | |
| 1: | ∞ | 8.0000 | #5 |
| 2: | ∞ | 33.0000 | |
| 3: | ASP1 | 22.9375 | #5 |
| 4: | −238.83712 | 1.0000 | |
| 5: | 226.68450 | 59.5357 | #5 |
| 6: | −908.69406 | 202.7480 | #6 |
| 7: | −165.20501 | 20.0000 | #5 |
| 8: | −669.93146 | 45.4417 | |
| 9: | ASP2 | −45.4417 | #6 |
| 10: | −669.93146 | −20.0000 | #5 |
| 11: | −165.20501 | −182.7480 | |
| 12: | ASP3 | 476.5531 | #6 |
| 13: | −410.99944 | −182.7518 | #6 |
| 14: | ASP4 | 164.9642 | #6 |
| 15: | ASP5 | 28.4827 | #5 |
| 16: | 239.45495 | 38.2383 | |
| 17: | −497.63245 | 20.0000 | #5 |
| 18: | ASP6 | 89.6638 | |
| 19: | ASP7 | 48.7904 | #5 |
| 20: | −290.43245 | 1.0000 | |
| 21: | 1036.93127 | 60.0000 | #5 |
| 22: | 1015.63994 | 19.7285 | |
| 23: | −2533.07822 | 63.4343 | #5 |
| 24: | −278.02969 | 31.4485 | |
| 25: | −1388.36824 | 40.8485 | #5 |
| 26: | ASP8 | 1.0000 | |
| 27: | ∞ | 1.0000 | #7 |
| 28: | 479.05778 | 35.6437 | #5 |
| 29: | 1637.29836 | 1.0000 | |
| 30: | 329.32813 | 44.1312 | #5 |
| 31: | 1053.37530 | 1.0000 | |
| 32: | 200.35146 | 57.3982 | #5 |
| 33: | 515.50441 | 1.0000 | |
| 34: | 118.38756 | 60.5521 | #5 |
| 35: | ASP9 | 1.0000 | |
| 36: | 81.03425 | 37.8815 | #14 |
| 37: | ASP10 | 1.0000 | |
| 38: | 81.71932 | 35.7388 | #14 |
| 39: | ∞ | 1.0000 | #8 |
| #9 | ∞ | | |

1: 1st surface
2: Radius of curvature
3: Surface spacing
4: Medium
5: silica glass
6: reflecting mirror
7: aperture stop
8: pure water
9: 2nd surface
14: Fluorite

TABLE 6

(Aspherical Coefficients)

| #12 | #13 | k<br>c12 | c4<br>c14 | c6<br>c16 | c8<br>c18 | c10<br>c20 |
|---|---|---|---|---|---|---|
| ASP1 | −0.00388454 | 0.00000E+00 | 2.22245E−08 | 1.47956E−13 | −1.47977E−17 | 1.83827E−21 |
|  |  | −3.79672E−26 | 6.22409E−31 | 0.00000E+00 | 0.00000E+00 | 0.00000E+00 |
| ASP2 | −0.00372368 | 0.00000E+00 | −1.37639E−09 | −9.27463E−14 | −2.38568E−18 | −4.78730E−22 |
|  |  | 4.14849E−26 | −2.22906E−30 | 0.00000E+00 | 0.00000E+00 | 0.00000E+00 |
| ASP3 | −0.00090790 | 0.00000E+00 | −4.17158E−09 | 1.53090E−13 | −4.47592E−18 | 4.58099E−22 |
|  |  | −2.64998E−26 | 6.12220E−31 | 0.00000E+00 | 0.00000E+00 | 0.00000E+00 |
| ASP4 | −0.00254948 | 0.00000E+00 | 1.56073E−09 | 1.95837E−14 | 1.84638E−18 | −8.80727E−23 |
|  |  | 1.81493E−27 | −1.48191E−32 | 0.00000E+00 | 0.00000E+00 | 0.00000E+00 |
| ASP5 | −0.00102929 | 0.00000E+00 | −3.82817E−11 | 1.56504E−13 | −2.89929E−16 | 1.68400E−20 |
|  |  | −5.96465E−25 | 1.20191E−29 | 0.00000E−00 | 0.00000E+00 | 0.00000E+00 |
| ASP6 | 0.00541154 | 0.00000E+00 | 3.81649E−08 | −1.10034E−12 | −3.69090E−16 | 1.33858E−20 |
|  |  | 6.34523E−25 | −3.45549E−29 | 0.00000E+00 | 0.00000E+00 | 0.00000E+00 |
| ASP7 | 0.00102903 | 0.00000E+00 | −3.14004E−08 | 2.67908E−13 | −1.32597E−17 | 2.02315E−22 |
|  |  | −5.49818E−27 | −4.97090E−32 | 0.00000E+00 | 0.00000E+00 | 0.00000E+00 |
| ASP8 | −0.00012579 | 0.00000E+00 | −5.21260E−09 | −2.97679E−14 | −4.97667E−19 | 1.15081E−23 |
|  |  | −9.40202E−29 | 5.04787E−34 | 0.00000E−00 | 0.00000E+00 | 0.00000E+00 |
| ASP9 | 0.00403277 | 0.00000E+00 | 4.99776E−08 | −8.99272E−13 | 6.60787E−17 | 4.38434E−22 |
|  |  | −4.24581E−26 | 4.81058E−30 | 0.00000E−00 | 0.00000E+00 | 0.00000E+00 |
| ASP10 | 0.01060914 | 0.00000E+00 | 2.60785E−07 | 4.78050E−11 | 5.21548E−15 | 1.26891E−18 |
|  |  | 1.53552E−22 | 4.32477E−26 | 0.00000E−00 | 0.00000E+00 | 0.00000E+00 |

12: Aspherical surface number
13: Curvature

Figure 13:
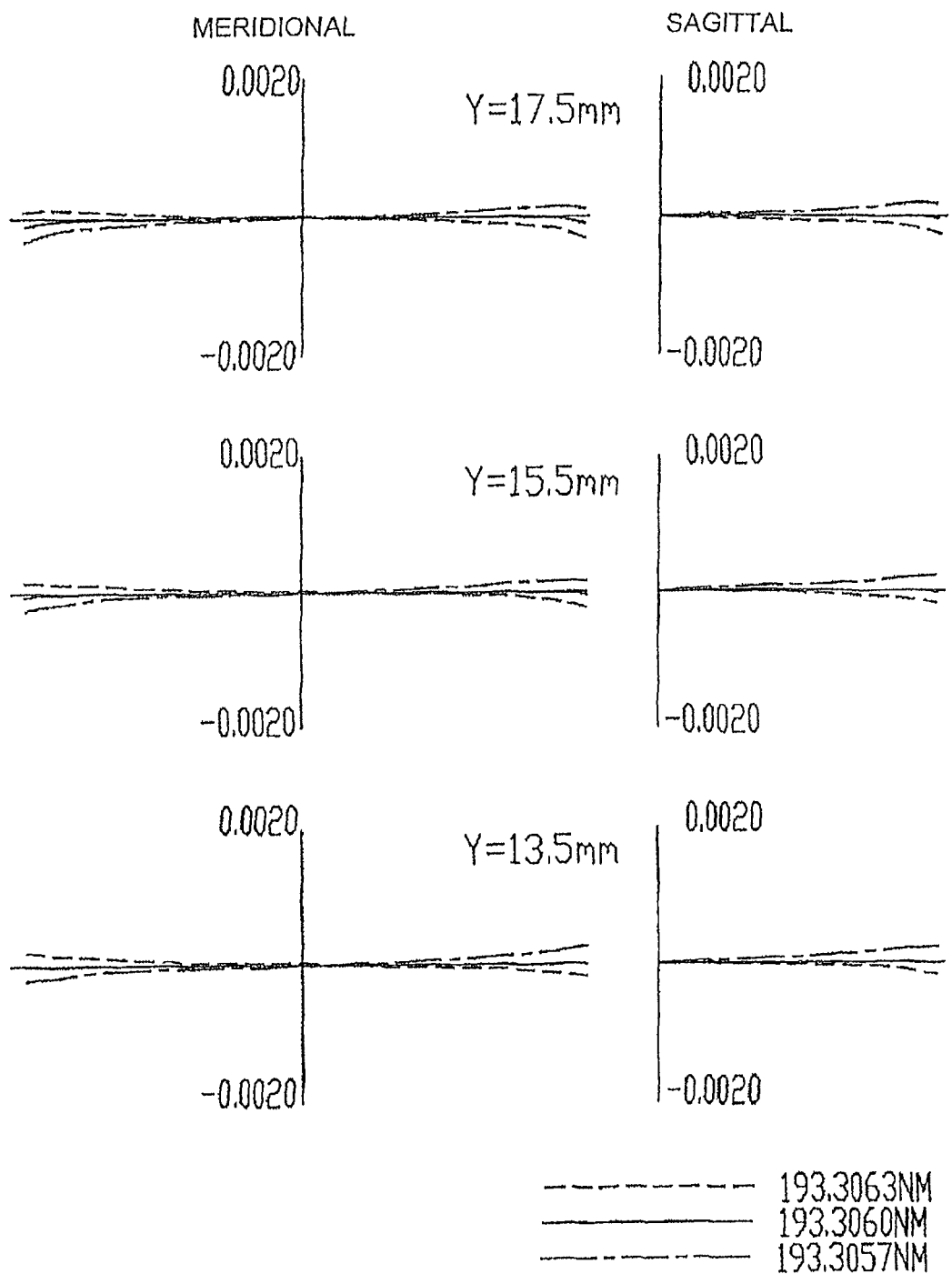
FIG. 13 is a transverse aberration diagram showing the transverse aberration in the meridional direction and in the sagittal direction of the catadioptric projection optical system in the fourth example.

FIG. 13 is a transverse aberration diagram showing the transverse aberration in the meridional direction and in the sagittal direction of the catadioptric projection optical system PL2 according to the present example. In FIG. 13, Y indicates the image height, each dashed line the transverse aberration at the wavelength of 193.3063 nm, each solid line the transverse aberration at the wavelength of 193.3060, and each chain line the transverse aberration at the wavelength of 193.3057 nm. As shown in the transverse aberration diagram of FIG. 13, the catadioptric projection optical system PL2 of the present example has the large numerical aperture and is corrected in a good balance for aberration throughout the entire exposure area though it has no large optical element.

Figure 14:
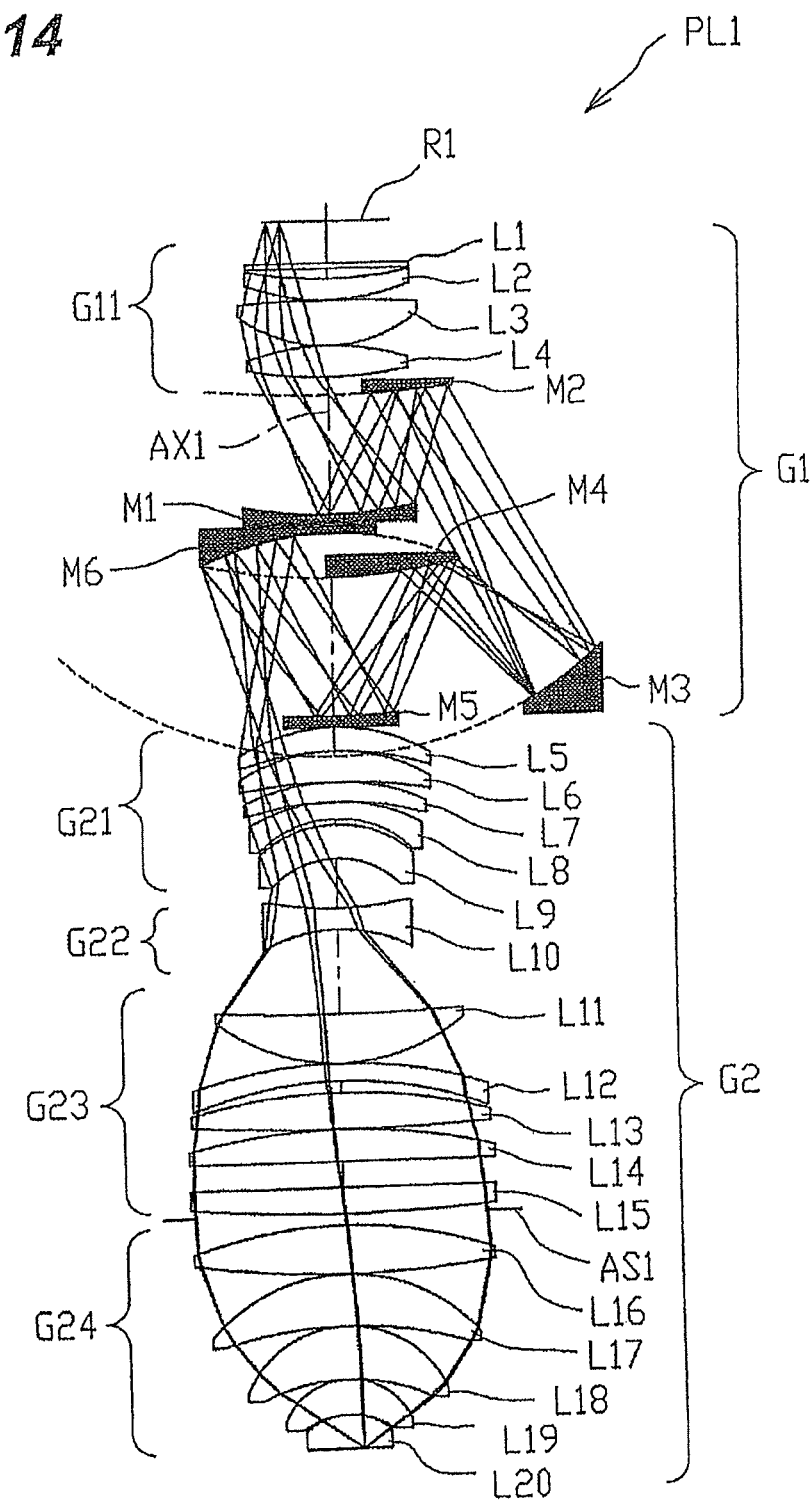
FIG. 14 is an illustration showing a lens configuration of a catadioptric projection optical system according to the fifth example.

The fifth example of the embodiment will be described below with reference to the drawing. FIG. 14 is an illustration showing a lens configuration of the catadioptric projection optical system according to the fifth example of the embodiment. The catadioptric projection optical system PL1 of the fifth example is comprised of the following optical systems in order from the object side (i.e., the reticle R1 side): a first imaging optical system G1 for forming a first intermediate image and a second intermediate image of the reticle R1 located on the first surface; and a second imaging optical system G2 for relaying the second intermediate image of the reticle R1 onto a wafer (not shown) located on the second surface.

The first imaging optical system G1 is composed of a lens unit with a positive refracting power (field lens unit) G11, and after-described six reflecting mirrors M1-M6. The lens unit G11 functions to correct for distortion and others and to make the optical system telecentric on the reticle R1 side. The lens unit G11 functions to keep the size of the image of the reticle R1 unchanged even if the reticle R1 is placed with deviation from the desired position in the direction of the optical axis AX1; therefore, the performance of the catadioptric projection optical system PL1 can be maintained high.

The second imaging optical system G2 is entirely composed of transmitting optical elements and is composed of a lens unit with a positive refracting power (first lens unit) G21, a lens unit with a negative refracting power (second lens unit) G22, a lens unit with a positive refracting power (third lens unit) G23, an aperture stop AS1, and a lens unit with a positive refracting power (fourth lens unit) G24. Since the second imaging optical system G2 is entirely composed of the transmitting optical elements, it is free of the optical path separation load; therefore, the image-side numerical aperture of the catadioptric projection optical system PL1 can be set large and a reduced image can be formed at a high reduction rate on the wafer located on the second surface. The lens units G21-G24 advantageously function for satisfying the Petzval's condition. The configuration of the lens units G21-G24 is able to avoid an increase in the total length of the catadioptric projection optical system PL1. The lens units G21-G23 are effective to correction for various aberrations such as coma.

Here the lens unit G11 is composed of the following components in order of passage of rays from the object side (reticle R1 side): a plane-parallel plate L1; a positive meniscus lens L2 whose concave surface of aspherical shape is kept toward the object; a biconvex lens L3; and a biconvex lens L4. The beam transmitted by the biconvex lens L4 is reflected by the concave reflecting mirror M1 whose concave surface of aspherical shape is kept toward the object, the convex reflecting mirror M2 whose convex surface of aspherical shape is kept toward the wafer, and the concave reflecting mirror M3 whose concave surface is kept toward the object, to form the first intermediate image. The beam reflected by the reflecting mirror M3 is reflected by the convex reflecting mirror M4 whose convex surface is kept toward the wafer, the concave reflecting mirror M5 whose concave surface of aspherical shape is kept toward the object, and the concave reflecting mirror M6 whose concave surface is kept toward the wafer.

Since the beam is continuously reflected by the reflecting mirrors M1-M6 without intervention of any lens, the Petzval's condition can be readily met by adjustment of each reflecting mirror M1-M6. A region for holding each reflecting mirror M1-M6 can be secured and it is easy to hold each reflecting mirror M1-M6. The curvature of field can be readily corrected for by changing the radius of curvature of each reflecting mirror M1-M6. The beam reflected by the reflecting mirror M6 forms the second intermediate image.

In this case, the concave reflecting mirror M3 is placed at the position most distant from the optical axis AX1 and the beam can be focused by this concave reflecting mirror M3; therefore, the beam can be set largely apart from the optical axis AX1 of the catadioptric projection optical system PL1, without intervention of any lens between the reflecting mirrors M1-M6, whereby interference can be avoided between beams. When the beam is continuously reflected by the four reflecting mirrors M3-M6, it is feasible to avoid an increase in the total length of the catadioptric projection optical system PL1.

The lens unit G21 is composed of the following components in order of passage of rays: a positive meniscus lens L5 whose convex surface is kept toward the object; a positive meniscus lens L6 whose concave surface of aspherical shape is kept toward the wafer; a positive meniscus lens L7 whose convex surface is kept toward the object; a negative meniscus lens L8 whose convex surface is kept toward the object; and a negative meniscus lens L9 whose convex surface of aspherical shape is kept toward the object. The lens unit G22 is composed of a biconcave lens L10 whose concave surface of aspherical shape is kept toward the wafer. The lens unit G23 is composed of the following components in order of passage of rays: a planoconvex lens L11 whose plane of aspherical shape is kept toward the object; a negative meniscus lens L12 whose convex surface is kept toward the object; a biconvex lens L13; a positive meniscus lens L14 whose convex surface is kept toward the object; and a biconvex lens L15.

The lens unit G24 is composed of: a biconvex lens L16; a positive meniscus lens L17 whose convex surface is kept toward the object; a positive meniscus lens L18 whose concave surface of aspherical shape is kept toward the wafer; a positive meniscus lens L19 whose concave surface of aspherical shape is kept toward the wafer; and a planoconvex lens L20 whose convex surface is kept toward the object.

The catadioptric projection optical system PL1 is constructed to satisfy the condition of 0.2<Mb/L<0.7, where M is a distance on the optical axis AX1 between the reflecting mirror M3 and the aperture stop AS1, and L the distance between the reticle R1 and the wafer. When Mb/L is smaller than the lower limit, it becomes difficult to place and keep the lenses L5-L15 constituting the lens units G21-G23 indispensable for correction for various aberrations, particularly, coma, at their accurate positions. Namely, when Mb/L satisfies the lower limit, it is feasible to avoid mechanical interference of the concave reflecting mirror M3 with the lens units G21-G23. When Mb/L satisfies the upper limit, it is feasible to avoid an increase in the total length and an increase in the size of the catadioptric projection optical system PL1. For more accurately place and keep each lens L5-L15 and securely avoiding the increase in the total length of the catadioptric projection optical system PL1, the projection optical system is more preferably constructed to satisfy the condition of 0.25<Mb/L<0.6.

In this fifth example the first intermediate image is formed between the reflecting mirror M3 and the reflecting mirror M4, but the first intermediate image may be formed in any optical path between the reflecting mirror M2 and the reflecting mirror M4.

Figure 15:
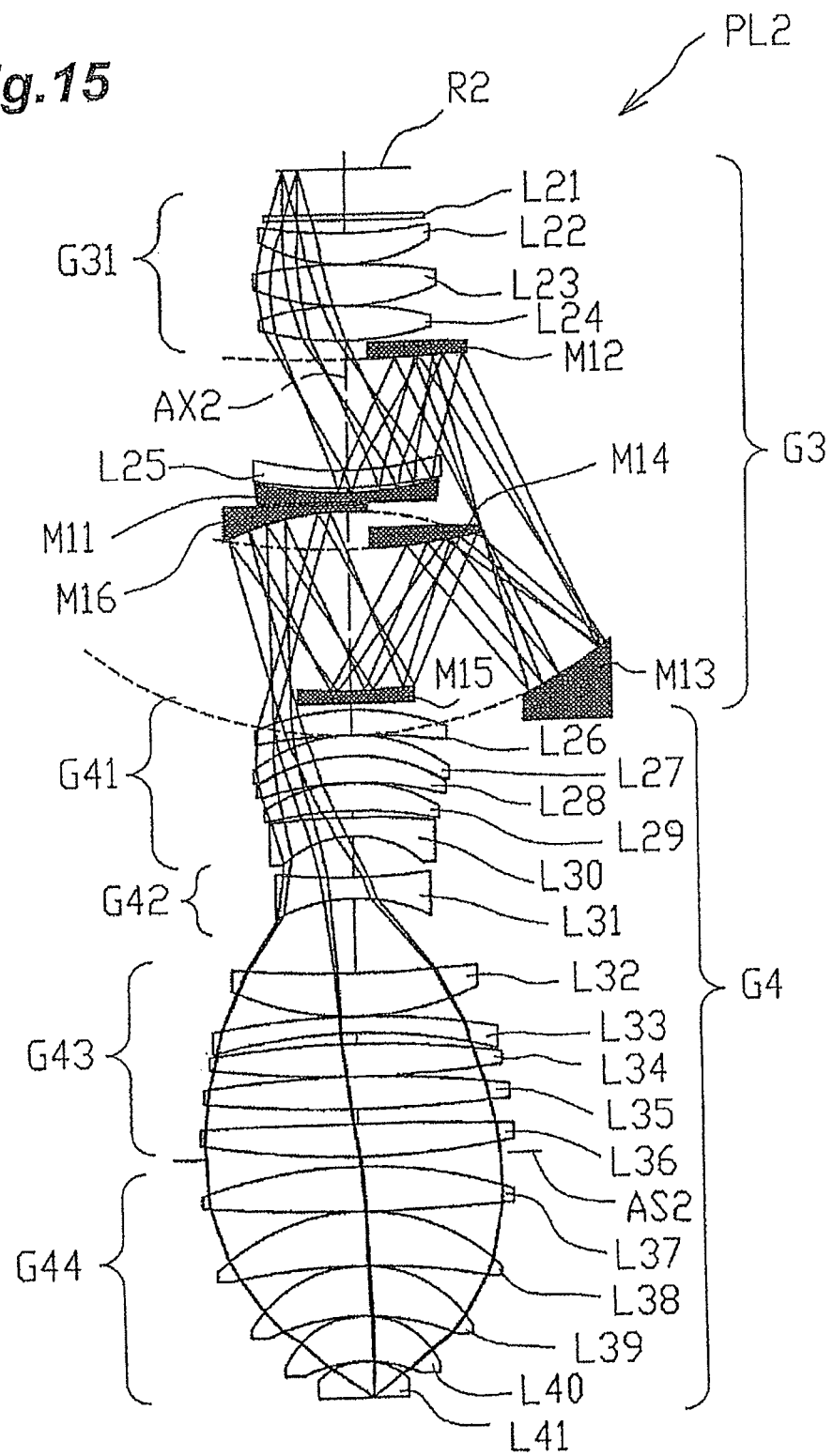
FIG. 15 is an illustration showing a lens configuration of a catadioptric projection optical system according to the sixth example.

Next, the sixth example of the embodiment will be described with reference to the drawing. FIG. 15 is an illustration showing a lens configuration of the catadioptric projection optical system according to the sixth example of the embodiment. The catadioptric projection optical system PL2 of the sixth example is comprised of the following optical systems in order from the object side (i.e., the reticle R2 side): a first imaging optical system G3 for forming a first intermediate image and a second intermediate image of the reticle R2 located on the first surface; and a second imaging optical system G4 for relaying the second intermediate image of the reticle R2 onto a wafer (not shown) located on the second surface.

The first imaging optical system G3 is composed of a lens unit with a positive refracting power (field lens unit) G31, after-described lens L25, and six reflecting mirrors M11-M16. The lens unit G31 functions to correct for distortion and others and to make the optical system telecentric on the reticle R2 side. The lens unit G31 functions to keep the size of the image of the reticle R2 unchanged even if the reticle R2 is placed with deviation from the desired position in the optical-axis direction; therefore, the performance of the catadioptric projection optical system PL2 can be maintained high.

The second imaging optical system G4 is entirely composed of transmitting optical elements and is composed of a lens unit with a positive refracting power (first lens unit) G41, a lens unit with a negative refracting power (second lens unit) G42, a lens unit with a positive refracting power (third lens unit) G43, an aperture stop AS2, and a lens unit with a positive refracting power (fourth lens unit) G44. The second imaging optical system G4 is free of the optical path separation load because it is entirely composed of the transmitting optical elements; therefore, the image-side numerical aperture of the catadioptric projection optical system PL2 can be set large and a reduced image can be formed at a high reduction rate on the wafer located on the second surface. The lens units G41-G44 advantageously function for satisfying the Petzval's condition. The configuration of the lens units G41-G44 effectively avoids an increase in the total length of the catadioptric projection optical system PL2. The lens units G41-G43 can correct for various aberrations such as coma.

Here the lens unit G31 is composed of the following components in order of passage of rays from the object side (reticle R2 side): a plane-parallel plate L21; a positive meniscus lens L22 whose concave surface of aspherical shape is kept toward the object; a biconvex lens L23; and a biconvex lens L24. The beam transmitted by the biconvex lens L24 passes through the negative meniscus lens (negative lens) L25 with the concave surface kept toward the object, is reflected by the concave reflecting mirror M11 with the concave surface of aspherical shape kept toward the object, and passes again through the negative meniscus lens L25. The beam transmitted by the negative meniscus lens L25 is reflected by the convex reflecting mirror M12 with the convex surface of aspherical shape kept toward the wafer, to form the first intermediate image. The beam reflected by the reflecting mirror M12 is reflected by the concave reflecting mirror M13 with the concave surface kept toward the object, the convex reflecting mirror M14 with the convex surface kept toward the wafer, the concave reflecting mirror M15 with the concave surface of aspherical shape kept toward the object, and the concave reflecting mirror M16 with the concave surface kept toward the wafer. By adjusting the negative meniscus lens L25, it is feasible to readily correct for chromatic aberration and to readily satisfy the Petzval's condition. By changing the radius of curvature of each reflecting mirror M11-M16, it is feasible to readily correct for curvature of field. The beam reflected by the reflecting mirror M16 forms the second intermediate image.

In this case, the concave reflecting mirror M13 is placed at the position most distant from the optical axis AX2, and the beam can be focused by this concave reflecting mirror M13; therefore, the beam can be set largely apart from the optical axis AX2 of the catadioptric projection optical system PL2, without intervention of any lens between the four reflecting mirrors M13-M16, and it is feasible to avoid interference between beams. By continuously reflecting the beam by the four reflecting mirrors M13-M16, it is feasible to avoid an increase in the total length of the catadioptric projection optical system PL2.

The lens unit G41 is composed of the following components in order of passage of rays: a positive meniscus lens L26 whose convex surface is kept toward the object; a positive meniscus lens L27 whose concave surface of aspherical shape is kept toward the wafer; a positive meniscus lens L28 whose convex surface is kept toward the object; a positive meniscus lens L29 whose concave surface of aspherical shape is kept toward the wafer; and a negative meniscus lens L30 whose convex surface is kept toward the object.

The lens unit G42 is composed of a biconcave lens L31 formed in the aspherical shape on the wafer side. The lens unit G43 is composed of the following components in order of passage of rays: a biconvex lens L32 formed in the aspherical shape on the object side; a negative meniscus lens L33 whose convex surface is kept toward the object; a biconvex lens L34; a biconvex lens L35; and a biconvex lens L36. The lens unit G44 is composed of a biconvex lens L37; a positive meniscus lens L38 whose convex surface is kept toward the object; a positive meniscus lens L39 whose concave surface of aspherical shape is kept toward the wafer; a positive meniscus lens L40 whose concave surface of aspherical shape is kept toward the wafer; and a plano-convex lens L41 whose convex surface is kept toward the object.

The catadioptric projection optical system PL2 is constructed to satisfy the condition of $0.2 < M2b/L2 < 0.7$, where M2$b$ is a distance on the optical axis AX2 between the reflecting mirror M13 and the aperture stop AS2, and L2 the distance between the reticle R2 and the wafer. When M2$b$/L2 is smaller than the lower limit, it becomes difficult to place and keep each of the lenses L26-L36 constituting the lens units G41-G43 indispensable for correction for various aberrations, particularly, coma, at an accurate position. Namely, when M2$b$/L2 satisfies the lower limit, it is feasible to avoid mechanical interference of the concave reflecting mirror M13 with the lens units G41-G43. When M2$b$/L2 satisfies the upper limit, it is feasible to avoid an increase in the total length and an increase in the size of the catadioptric projection optical system PL2. For placing and keeping each lens L26-L36 at a more accurate position and securely avoiding the increase in the total length of the catadioptric projection optical system PL2, the optical system is more preferably constructed to satisfy the condition of $0.25 < M2b/L2 < 0.6$.

In the sixth example, the first intermediate image is formed between the reflecting mirror M12 and the reflecting mirror M13, but the first intermediate image may be formed in any optical path between the reflecting mirror M12 and the reflecting mirror M14.

Figure 16:
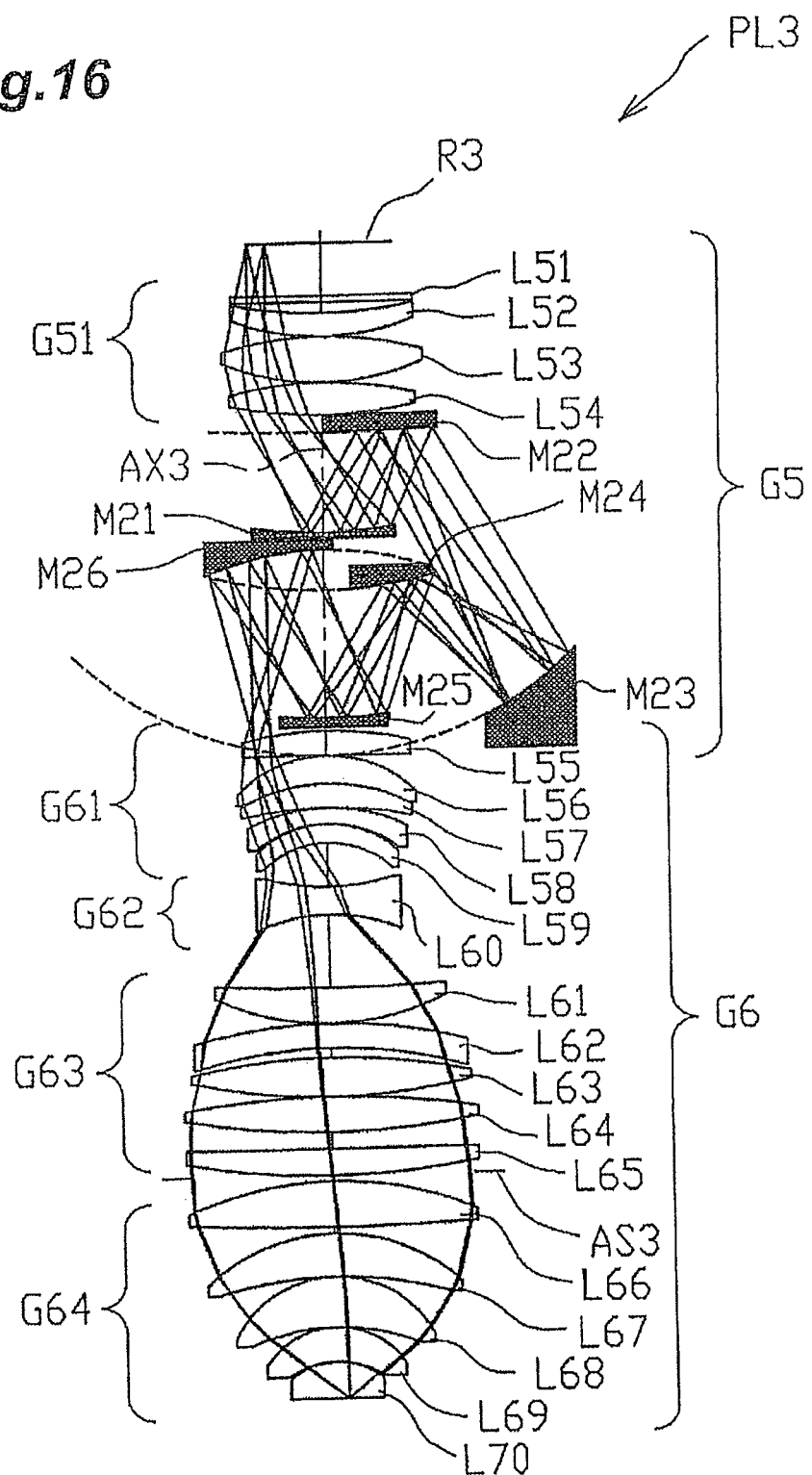
FIG. 16 is an illustration showing a lens configuration of a catadioptric projection optical system according to the seventh example.

Next, the seventh example of the embodiment will be described with reference to the drawing. FIG. 16 is an illustration showing a lens configuration of the catadioptric projection optical system according to the seventh example of the embodiment. The catadioptric projection optical system PL3 of the seventh example is comprised of the following optical systems in order from the object side (i.e., the reticle R3 side): a first imaging optical system G5 for forming a first intermediate image and a second intermediate image of the reticle R3 located on the first surface; and a second imaging optical system G6 for relaying the second intermediate image of the reticle R3 onto a wafer (not shown) located on the second surface.

The first imaging optical system G5 is composed of a lens unit with a positive refracting power (field lens unit) G51, and after-described six reflecting mirrors M21-M26. The lens unit G51 functions to correct for distortion and others and to make the optical system telecentric on the reticle R2 side. The lens unit G51 functions to keep the size of the image of the reticle R3 unchanged even if the reticle R3 is placed with deviation from the desired position in the direction of the optical-axis AX3; therefore, the performance of the catadioptric projection optical system PL3 can be maintained high.

The second imaging optical system G6 is entirely composed of transmitting optical elements, and is composed of a lens unit with a positive refracting power (first lens unit) G61; a lens unit with a negative refracting power (second lens unit) G62; a lens unit with a positive refracting power (third lens unit) G63; an aperture stop AS3; and a lens unit with a positive refracting power (fourth lens unit) G64. Since the second imaging optical system G6 is entirely constructed of the transmitting optical elements, it is free of the optical path separation load; therefore, the image-side numerical aperture of the catadioptric projection optical system PL3 can be set large and a reduced image can be formed at a high reduction rate on the wafer located on the second surface. The lens units G61-G64 advantageously function for satisfying the Petzval's condition. The configuration of the lens units G61-G64 effectively avoids an increase in the total length of the catadioptric projection optical system PL3. The lens units G61-G63 can correct for various aberrations such as coma.

Here the lens unit G51 is composed of the following components in order of passage of rays from the object side (reticle R3 side): a plane-parallel plate L51; a positive meniscus lens L52 whose concave surface of aspherical shape is kept toward the object; a biconvex lens L53; and a biconvex lens L54. The beam transmitted by the biconvex lens L54 is reflected by the concave reflecting mirror M21 with the concave surface of aspherical shape kept toward the object, the convex reflecting mirror M22 with the convex surface of aspherical shape kept toward the wafer, and the concave reflecting mirror M23 with the concave surface kept toward the object, to form the first intermediate image. The beam reflected by the reflecting mirror M23 is reflected by the convex reflecting mirror M24 with the convex surface kept toward the wafer, the convex reflecting mirror M25 with the convex surface of aspherical shape kept toward the object, and the concave reflecting mirror M26 with the concave surface kept toward the wafer.

Since the beam is continuously reflected by the reflecting mirrors M21-M26 without intervention of any lens, it is feasible to readily satisfy the Petzval's condition through adjustment of each reflecting mirror M21-M26. In addition, a region for holding each reflecting mirror M21-M26 can be secured, and the curvature of field can be readily corrected for by changing the radius of curvature of each reflecting mirror M21-M26. The beam reflected by the reflecting mirror M26 forms the second intermediate image.

In this case, the concave reflecting mirror M23 is located at the position most distant from the optical axis AX3, and the beam can be focused by this concave reflecting mirror M23; therefore, the beam can be set largely apart from the optical axis AX3 of the catadioptric projection optical system PL3, without intervention of any lens between the reflecting mirrors M21-M26, and it is feasible to avoid interference between beams. Since the beam is continuously reflected by the four reflecting mirrors M23-M26, it is feasible to avoid an increase in the total length of the catadioptric projection optical system PL3.

The lens unit G61 is composed of the following components in order of passage of rays: a biconvex lens L55; a positive meniscus lens L56 whose concave surface of aspherical shape is kept toward the wafer; a positive meniscus lens L57 whose convex surface is kept toward the object; a negative meniscus lens L58 whose convex surface is kept toward the object; and a negative meniscus lens L59 whose convex surface of aspherical shape is kept toward the object. The lens unit G62 is composed of a biconcave lens L60 whose concave surface of aspherical shape is kept toward the wafer. The lens unit G63 is composed of the following components in order of passage of rays: a biconvex lens L61 whose convex surface of aspherical shape is kept toward the object; a negative meniscus lens L62 whose convex surface is kept toward the object; a biconvex lens L63; a biconvex lens L64; and a positive meniscus lens L65 whose concave surface is kept toward the object.

The lens unit G64 is composed of the following components in order of passage of rays: a biconvex lens L66; a positive meniscus lens L67 whose convex surface is kept toward the object; a positive meniscus lens L68 whose concave surface of aspherical shape is kept toward the wafer; a positive meniscus lens L69 whose concave surface of aspherical shape is kept toward the wafer; and a planoconvex lens L70 whose convex surface is kept toward the object.

The catadioptric projection optical system PL3 is constructed to satisfy the condition of 0.2<M3/L3<0.7, where M3 is a distance on the optical axis AX3 between the reflecting mirror M23 and the aperture stop AS3, and L3 the distance between the reticle R3 and the wafer. When M3/L3 is smaller than the lower limit, it becomes difficult to place and keep each of the lenses L55-L65 constituting the lens units G61-G63 indispensable for correction for various aberrations, particularly, coma, at an accurate position. Namely, when M3/L3 satisfies the lower limit, it is feasible to avoid mechanical interference of the concave reflecting mirror M23 with the lens units G61-G63. When M3/L3 satisfies the upper limit, it is feasible to avoid an increase in the total length and an increase in the size of the catadioptric projection optical system PL3. For placing and keeping each lens L55-L70 at a more accurate position and securely avoiding the increase in the total length of the catadioptric projection optical system PL3, the optical system is more preferably constructed to satisfy the condition of 0.25<M3/L3<0.6.

In this seventh example, the first intermediate image is formed between the reflecting mirror M23 and the reflecting mirror M24, but the first intermediate image may be formed in any optical path between the reflecting mirror M22 and the reflecting mirror M24.

In application of the catadioptric projection optical systems PL1-PL3 of the fifth to seventh examples to the exposure apparatus, pure water (deionized water) with the refractive index of about 1.4 is interposed in the optical path between the planoconvex lens L20, L41, or L70 and the wafer, where the refractive index of the atmosphere in the catadioptric projection optical system PL1-PL3 is 1. Therefore, the wavelength of the exposure light in pure water is about 0.71 (1/1.4) times that in the atmosphere, whereby the resolution can be enhanced.

The optical axis AX1-AX3 of every optical element included in the catadioptric projection optical system PL1-PL3 and having the predetermined refracting power is arranged substantially on the single straight line, and the region of the image formed on the wafer by the catadioptric projection optical system PL1-PL3 is the off-axis region not including the optical axis AX1-AX3. Therefore, it is feasible to reduce the degree of difficulty of production in production of the catadioptric projection optical system PL1-PL3 and to readily achieve relative adjustment of each optical element.

Since the catadioptric projection optical system PL1-PL3 according to the fifth to the seventh examples includes the six reflecting mirrors M1-M6, M11-M16, M21-M26, it is feasible to readily and securely achieve the optical path separation between the beam toward the reticle R1-R3 and the beam toward the wafer, without an increase in the total length of the catadioptric projection optical system PL1-PL3, even in the case where the reticle R1-R3-side and wafer-side numerical apertures of the catadioptric projection optical system PL1-PL3 are increased in order to enhance the resolution.

The catadioptric projection optical system PL1-PL3 according to the fifth to seventh examples is a thrice-imaging optical system for forming the first intermediate image and the second intermediate image, in which the first intermediate image is an inverted image of the reticle R1-R3, the second intermediate image is an erect image of the reticle R1-R3, and the image formed on the wafer is an inverted image. Therefore, in the case where the catadioptric projection optical system PL1-PL3 is mounted on the exposure apparatus and where the exposure is carried out with scanning of the reticle R1-R3 and the wafer, the scanning direction of the reticle R1-R3 can be opposite to that of the wafer, and it is feasible to readily achieve such adjustment as to decrease a change in the center of gravity of the entire exposure apparatus. It is also feasible to reduce vibration of the catadioptric projection optical system PL1-PL3 due to the change in the center of gravity of the entire exposure apparatus and to achieve good imaging performance throughout the entire region in the exposure area.

In the catadioptric projection optical system PL1, PL3 of each of the above examples, pure water (deionized water) is interposed between the lens located nearest to the wafer, and the wafer, but another medium having the refractive index larger than 1.1 may be interposed, where the refractive index of the atmosphere in the catadioptric projection optical system PL1-PL3 is 1.

Next, values of specifications of the catadioptric projection optical system PL1 according to the fifth example shown in FIG. 14 will be presented. In the specifications, as shown in FIG. 11 described above, A represents a radius of a portion where the exposure light is blocked by the optical elements constituting the catadioptric projection optical system PL1, with the center on the optical axis AX1 of the catadioptric projection optical system PL1, B a radius of the maximum image height with the center on the optical axis AX1 of the catadioptric projection optical system PL1, H a length along the Y-direction of the effective exposure region, and C a length along the X-direction of the effective exposure region. In the specifications, NA indicates the numerical aperture, d the surface separation, n the refractive index, and λ the center wavelength. Furthermore, in the specifications, M indicates the distance on the optical axis AX1 between the concave reflecting mirror M3 and the unrepresented wafer, and L the distance between the reticle R1 and the wafer.

Table 7 presents the specifications of the optical members of the catadioptric projection optical system PL1 according to the fifth example. In the specifications of the optical members of Table 7, each surface number in the first column is an order of a surface along the traveling direction of rays from the object side, the second column a radius of curvature of each surface (mm), the third column an on-axis spacing or surface separation (mm) of each surface, and the fourth column a glass material of each optical member.

Table 8 presents the aspherical coefficients of the lenses with the lens surface of aspherical shape and the reflecting mirrors used in the catadioptric projection optical system PL1 according to the fifth example. In the aspherical coefficients of Table 8, aspherical surface numbers in the first column correspond to the surface numbers in the specifications of the optical members of Table 7. The second column represents the curvature of each aspherical surface (1/mm), the third column the conical coefficient k and the 12th-order aspherical coefficient, the fourth column the 4th-order and 14th-order aspherical coefficients, the fifth column the 6th-order and 16th-order aspherical coefficients, the sixth column the 8th-order and 18th-order aspherical coefficients, and the seventh column the 10th-order and 20th-order aspherical coefficients.

In the fifth to seventh examples, each aspherical surface is expressed by Eq (a) described above.

Fifth Example

Specifications

Image-side NA: 1.20
Exposure area: A=14 mm B=18 mm H=26.0 mm C=4 mm
Imaging magnification: ¼
Center wavelength: 193.306 nm
Refractive index of silica: 1.5603261
Refractive index of fluorite: 1.5014548
Refractive index of liquid 1: 1.43664
Dispersion of silica $(dn/d\lambda)$: $-1.591 \times 10^{-6}$/pm
Dispersion of fluorite $(dn/d\lambda)$: $-0.980 \times 10^{-6}$/pm
Dispersion of pure water (deionized water) $(dn/d\lambda)$: $-2.6 \times 10^{-6}$/pm
Values corresponding to Condition Mb=524.49 mm L=1400 mm

TABLE 7

| (Specifications of Optical Members) | | | |
|---|---|---|---|
| | #2 | #3 | #15 |
| #1 | ∞ | 45.0000 | |
| 1: | ∞ | 8.0000 | #5 |

TABLE 7-continued

| (Specifications of Optical Members) | | | |
|---|---|---|---|
| | #2 | #3 | #15 |
| 2: | ∞ | 9.4878 | |
| 3: | ASP1 | 25.3802 | #5 |
| 4: | −244.04741 | 1.9583 | |
| 5: | 2654.01531 | 49.2092 | #5 |
| 6: | −150.85154 | 1.1545 | |
| 7: | 294.54453 | 34.3095 | #5 |
| 8: | −572.08259 | 156.2051 | |
| 9: | ASP2 | −136.2051 | #6 |
| 10: | ASP3 | 412.6346 | #6 |
| 11: | −418.20026 | −205.0204 | #6 |
| 12: | −604.04130 | 160.2153 | #6 |
| 13: | ASP4 | −211.6245 | #6 |
| 14: | 320.60531 | 226.6245 | |
| 15: | 224.13260 | 25.2194 | #5 |
| 16: | 346.75878 | 1.0000 | |
| 17: | 215.47954 | 34.3600 | #5 |
| 18: | ASP5 | 1.0000 | |
| 19: | 266.87857 | 19.9995 | #5 |
| 20: | 329.19442 | 1.0000 | |
| 21: | 196.43240 | 20.0000 | #5 |
| 22: | 115.87410 | 6.4756 | |
| 23: | ASP6 | 39.3045 | #5 |
| 24: | 99.87482 | 55.9109 | |
| 25: | −412.64757 | 24.7282 | #5 |
| 26: | ASP7 | 94.8545 | |
| 27: | ASP8 | 57.3966 | #5 |
| 28: | −227.16104 | 1.0000 | |
| 29: | 504.83819 | 20.0000 | #5 |
| 30: | 407.86902 | 12.3535 | |
| 31: | 595.98854 | 43.0398 | #5 |
| 32: | −2001.40538 | 1.0000 | |
| 33: | 711.19871 | 32.6046 | #5 |
| 34: | 8598.79354 | 32.0466 | |
| 35: | 36209.93141 | 30.0000 | #5 |
| 36: | −1731.78793 | 1.0000 | |
| 37: | ∞ | 12.6069 | #8 |
| 38: | 503.84491 | 53.3626 | #5 |
| 39: | −1088.61181 | 1.0000 | |
| 40: | 192.53858 | 61.7603 | #5 |
| 41: | 521.19424 | 1.0000 | |
| 42: | 122.79200 | 59.8433 | #5 |
| 43: | ASP9 | 1.0000 | |
| 44: | 79.97315 | 39.6326 | #14 |
| 45: | ASP10 | 1.0000 | |
| 46: | 84.68828 | 36.1715 | #14 |
| 47: | ∞ | 1.0000 | #8 |
| #9 | ∞ | 0.0000 | |

1: 1st surface
2: Radius of curvature (mm)
3: Surface spacing (mm)
5: silica glass
6: reflecting mirror
7: aperture stop
8: pure water
9: 2nd surface
14: Fluorite
15: Name of glass material

TABLE 8

| (Aspherical Coefficients) | | | | | | |
|---|---|---|---|---|---|---|
| | k | | c4 | c6 | c8 | c10 |
| # 12 | # 13 | c12 | c14 | c16 | c18 | c20 |
| ASP1 | −0.00059023 | 0.00000E+00 | −2.87641E−08 | −1.70437E−11 | 2.46285E−15 | −2.74317E−19 |
| | | 2.07022E−23 | −7.79530E−28 | 0.00000E+00 | 0.00000E+00 | 0.00000E+00 |
| ASP2 | −0.00205780 | 0.00000E+00 | 2.50612E−09 | 2.95240E−14 | 4.37607E−18 | −5.55238E−22 |
| | | 3.88749E−26 | −1.13016E−30 | 0.00000E+00 | 0.00000E+00 | 0.00000E+00 |

TABLE 8-continued (Aspherical Coefficients)

| # 12 | # 13 | k<br>c12 | c4<br>c14 | c6<br>c16 | c8<br>c18 | c10<br>c20 |
|---|---|---|---|---|---|---|
| ASP3 | −0.00058562 | 0.00000E+00<br>−1.45573E−27 | −6.92554E−09<br>2.27951E−32 | 1.39659E−13<br>0.00000E+00 | −1.09871E−18<br>0.00000E+00 | 3.37519E−23<br>0.00000E+00 |
| ASP4 | −0.00123249 | 0.00000E+00<br>−5.95219E−24 | 1.93713E−09<br>3.41899E−28 | 1.07185E−12<br>0.00000E+00 | −3.34552E−16<br>0.00000E+00 | 3.54315E−20<br>0.00000E+00 |
| ASP5 | 0.00020189 | 0.00000E+00<br>−3.23126E−24 | 1.37544E−07<br>6.76814E−29 | −1.06394E−11<br>0.00000E+00 | 7.70843E−17<br>0.00000E+00 | 4.90298E−20<br>0.00000E+00 |
| ASP6 | 0.00588235 | 0.00000E+00<br>−9.45408E−24 | 2.41559E−07<br>3.57981E−28 | −1.03766E−11<br>0.00000E+00 | −6.75114E−17<br>0.00000E+00 | 1.11214E−19<br>0.00000E+00 |
| ASP7 | 0.00664255 | 0.00000E+00<br>−2.81549E−24 | 2.62150E−08<br>6.89450E−30 | −9.25480E−12<br>0.00000E+00 | −1.77845E−16<br>0.00000E+00 | 5.60675E−20<br>0.00000E+00 |
| ASP8 | 0.00000000 | 0.00000E+00<br>−5.07100E−27 | −1.26430E−08<br>1.49848E−31 | 1.64939E−13<br>0.00000E+00 | −6.24373E−18<br>0.00000E+00 | 2.07576E−22<br>0.00000E+00 |
| ASP9 | 0.00345726 | 0.00000E+00<br>1.49819E−25 | 5.92282E−08<br>1.10869E−30 | −1.56640E−12<br>0.00000E+00 | 1.38582E−18<br>0.00000E+00 | −4.07966E−21<br>0.00000E+00 |
| ASP10 | 0.01038095 | 0.00000E+00<br>3.23667E−22 | 2.42802E−07<br>−9.21777E−26 | 4.29662E−11<br>0.00000E+00 | 1.62230E−15<br>0.00000E+00 | 6.50272E−19<br>0.00000E+00 |

12: Aspherical surface number
13: Curvature

Figure 17:
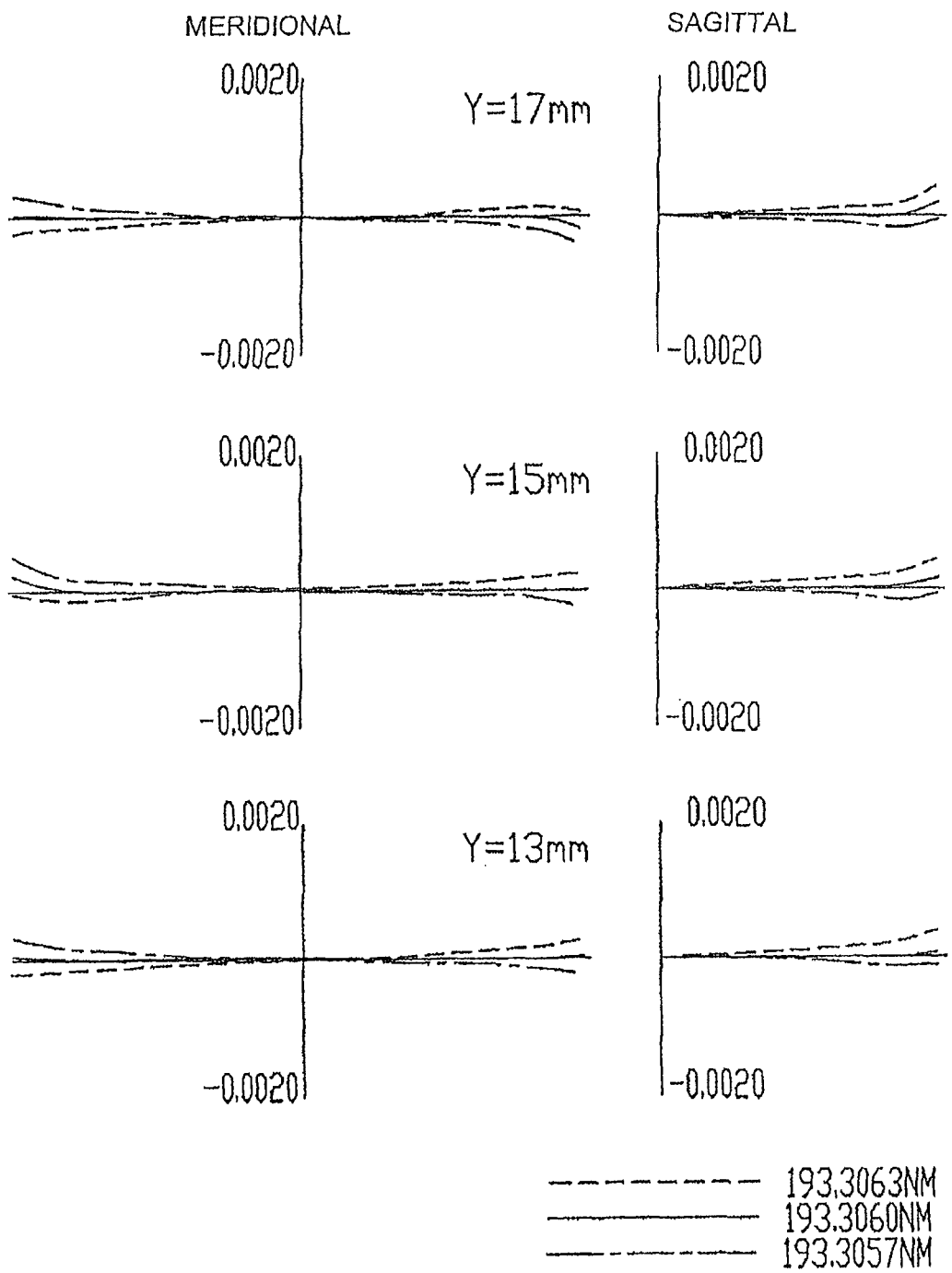
FIG. 17 is a transverse aberration diagram showing the transverse aberration in the meridional direction and in the sagittal direction of the catadioptric projection optical system in the fifth example.

FIG. 17 is a transverse aberration diagram showing the transverse aberration in the meridional direction and in the sagittal direction of the catadioptric projection optical system PL1 according to the present example. In FIG. 17, Y indicates the image height, each dashed line the transverse aberration at the wavelength of 193.3063 nm, each solid line the transverse aberration at the wavelength of 193.3060 nm, and each chain line the transverse aberration at the wavelength of 193.3057 nm. As shown in the transverse aberration diagram of FIG. 17, the catadioptric projection optical system PL1 of the present example has the large numerical aperture and is corrected in a good balance for aberration throughout the entire exposure area though it has no large optical element.

Next, the specifications of the catadioptric projection optical system PL2 according to the sixth example shown in FIG. 15 will be presented. Table 9 presents the specifications of the optical members of the catadioptric projection optical system PL2 according to the sixth example. Table 10 presents the aspherical coefficients of the lenses with the lens surface of aspherical shape and the reflecting mirrors used in the catadioptric projection optical system PL2 according to the sixth example. In the specifications, the specifications of the optical members, and the aspherical coefficients, the description will be given using the same symbols as those in the description of the catadioptric projection optical system PL1 according to the fifth example.

Sixth Example

Specifications

Image-side NA: 1.20
Exposure area: A=13 mm B=17 mm
H=26.0 mm C=4 mm
Imaging magnification: ¼
Center wavelength: 193.306 nm
Refractive index of silica: 1.5603261
Refractive index of fluorite: 1.5014548
Refractive index of liquid 1: 1.43664
Dispersion of silica (dn/dλ): $-1.591 \times 10^{-6}$/pm
Dispersion of fluorite (dn/dλ): $-0.980 \times 10^{-6}$/pm
Dispersion of pure water (deionized water) (dn/dλ): $-2.6 \times 10^{-6}$/pm Values corresponding to Condition Mb=482.14 mm L=1400 mm

TABLE 9

(Specifications of Optical Members)

|  | #2 | #3 | #15 |
|---|---|---|---|
| #1 | ∞ | 50.9535 |  |
| 1: | ∞ | 8.0000 | #5 |
| 2: | ∞ | 12.7478 |  |
| 3: | ASP1 | 32.5506 | #5 |
| 4: | −184.43053 | 1.0000 |  |
| 5: | 532.87681 | 45.9762 | #5 |
| 6: | −271.53626 | 1.3173 |  |
| 7: | 374.46315 | 38.0103 | #5 |
| 8: | −361.42951 | 147.1771 |  |
| 9: | −380.08052 | 20.0000 | #5 |
| 10: | −594.49774 | 5.5356 |  |
| 11: | ASP2 | −5.5356 | #6 |
| 12: | −594.49774 | −20.0000 | #5 |
| 13: | −389.08052 | −127.0301 |  |
| 14: | ASP3 | 430.8932 | #6 |
| 15: | −450.43913 | −215.6393 | #6 |
| 16: | −704.67689 | 163.6052 | #6 |
| 17: | ASP4 | −206.3833 | #6 |
| 18: | 317.07489 | 228.3275 | #6 |
| 19: | 248.60032 | 30.8186 | #5 |
| 20: | 964.03405 | 1.0000 |  |
| 21: | 170.07823 | 20.0000 | #5 |
| 22: | ASP5 | 1.0778 |  |
| 23: | 174.13726 | 29.8902 | #5 |
| 24: | 294.93424 | 1.0798 |  |
| 25: | 160.77849 | 33.1276 | #5 |
| 26: | ASP6 | 9.4275 |  |
| 27: | 1185.57325 | 20.0000 | #5 |
| 28: | 103.90360 | 46.9708 |  |
| 29: | −676.67026 | 24.5184 | #5 |
| 30: | ASP7 | 83.5410 |  |
| 31: | ASP8 | 47.4275 | #5 |
| 32: | −317.19307 | 1.0000 |  |
| 33: | 688.27957 | 20.0000 | #5 |
| 34: | 513.64357 | 11.2866 |  |
| 35: | 883.25368 | 40.1774 | #5 |
| 36: | −959.41738 | 1.0000 |  |
| 37: | 1222.93397 | 34.5841 | #5 |
| 38: | −1403.11949 | 16.9031 |  |
| 39: | 2169.40706 | 37.3055 | #5 |
| 40: | −889.78387 | 1.0000 |  |

TABLE 9-continued (Specifications of Optical Members)

| | #2 | #3 | #15 |
|---|---|---|---|
| 41: | ∞ | 9.8461 | #7 |
| 42: | 458.32781 | 52.3568 | #5 |
| 43: | −1741.66958 | 1.0000 | |
| 44: | 215.86566 | 59.3939 | #5 |
| 45: | 659.70674 | 1.0000 | |
| 46: | 134.64784 | 58.8510 | #5 |
| 47: | ASP9 | 1.0004 | |
| 48: | 96.99608 | 49.9011 | #5 |
| 49: | ASP10 | 1.0194 | |
| 50: | 80.22245 | 40.8996 | #5 |
| 51: | ∞ | 1.0000 | |
| #9 | ∞ | | |

1: 1st surface
2: Radius of curvature (mm)
3: Surface spacing (mm)
5: silica glass
6: reflecting mirror
7: aperture stop
8: pure water
9: 2nd surface
14: Fluorite
15: Name of glass material

TABLE 10

(Aspherical Coefficients)

| #12 | #13 | k / c12 | c4 / c14 | c6 / c16 | c8 / c18 | c10 / c20 |
|---|---|---|---|---|---|---|
| ASP1 | −0.00057910 | 0.00000E+00 | −9.03366E−08 | 3.28394E−12 | −4.08402E−18 | 2.52900E−20 |
| | | −9.19294E−25 | 2.02082E−30 | 0.00000E+00 | 0.00000E+00 | 0.00000E+00 |
| ASP2 | −0.00243076 | 0.00000E+00 | 3.35976E−09 | 2.88286E−14 | 8.73468E−18 | −7.00411E−22 |
| | | 4.21327E−26 | −9.88714E−31 | 0.00000E+00 | 0.00000E+00 | 0.00000E+00 |
| ASP3 | −0.00032257 | 0.00000E+00 | −6.53400E−09 | 1.15038E−13 | −9.61655E−19 | 8.51651E−23 |
| | | −3.17817E−27 | 4.60017E−32 | 0.00000E+00 | 0.00000E+00 | 0.00000E+00 |
| ASP4 | −0.00058501 | 0.00000E+00 | 2.54270E−09 | 0.81523E−13 | −1.08474E−16 | 6.27615E−21 |
| | | −7.45415E−25 | 6.45741E−29 | 0.00000E+00 | 0.00000E+00 | 0.00000E+00 |
| ASP5 | 0.00574270 | 0.00000E+00 | 2.69000E−08 | −1.93073E−12 | −2.23058E−16 | 2.03519E−20 |
| | | −2.27002E−24 | 8.48621E−29 | 0.00000E+00 | 0.00000E+00 | 0.00000E+00 |
| ASP6 | 0.00281530 | 0.00000E+00 | −7.99356E−08 | 1.14147E−11 | −4.87397E−16 | 6.76022E−20 |
| | | −3.55808E−24 | 1.84260E−28 | 0.00000E+00 | 0.00000E+00 | 0.00000E+00 |
| ASP7 | 0.00667798 | 0.00000E+00 | −1.01256E−08 | −5.60515E−12 | −6.85243E−17 | 2.18957E−20 |
| | | −1.24639E−24 | −1.61382E−29 | 0.00000E+00 | 0.00000E+00 | 0.00000E+00 |
| ASP8 | 0.00000970 | 0.00000E+00 | −1.68383E−08 | 1.90215E−13 | −8.11478E−18 | 3.37339E−22 |
| | | −1.15048E−26 | 5.21646E−31 | 0.00000E+00 | 0.00000E+00 | 0.00000E+00 |
| ASP9 | 0.00313892 | 0.00000E+00 | 4.21089E−08 | −8.07510E−13 | 5.31944E−17 | −4.15094E−22 |
| | | −5.28946E−27 | 1.60853E−30 | 0.00000E+00 | 0.00000E+00 | 0.00000E+00 |
| ASP10 | 0.00959788 | 0.00000E+00 | 2.16924E−07 | 3.52791E−11 | 1.11831E−15 | 1.12987E−18 |
| | | −4.81835E−23 | 1.62262E−26 | 0.00000E+00 | 0.00000E+00 | 0.00000E+00 |

12: Aspherical surface number
13: Curvature

Figure 18:
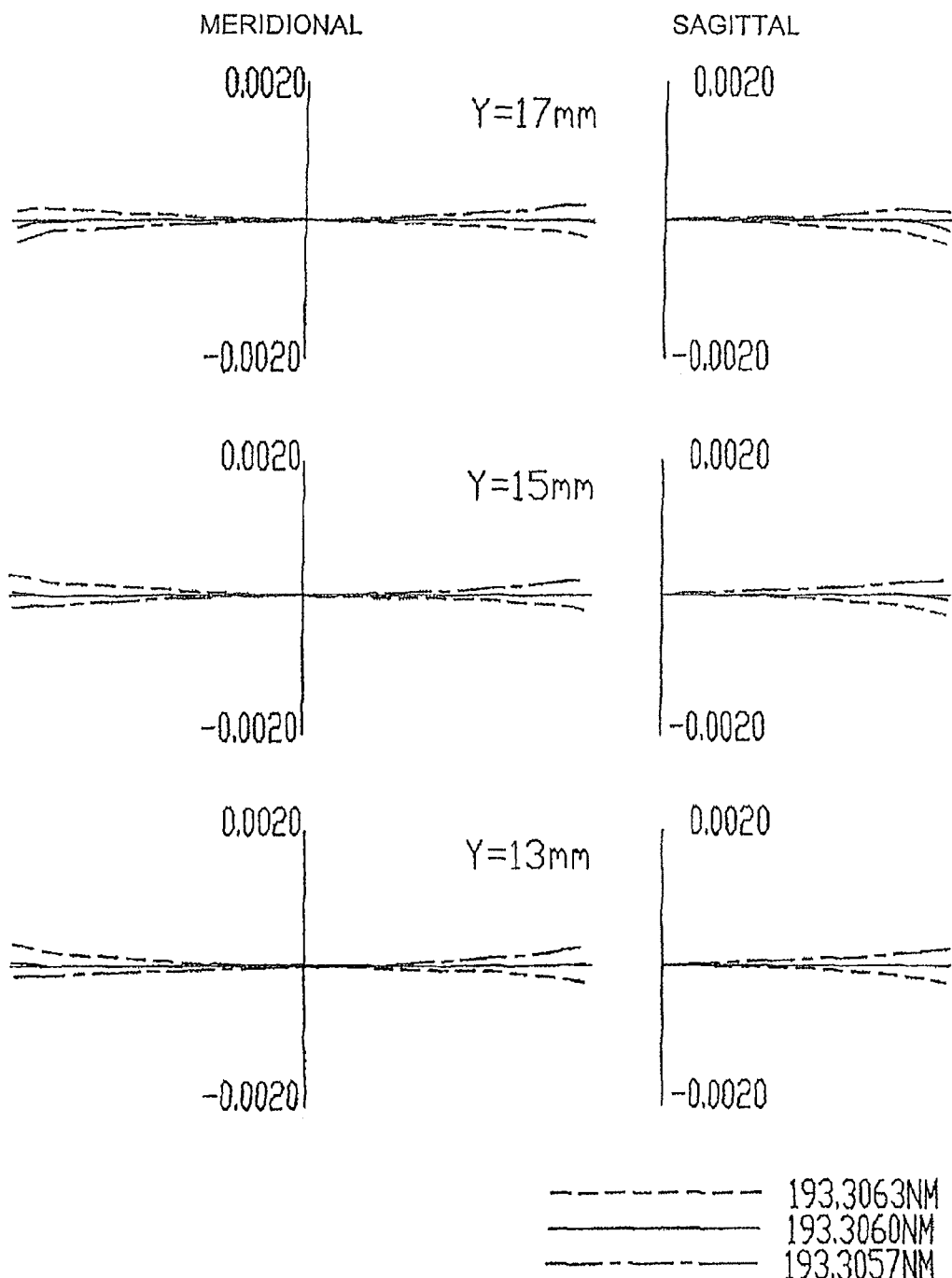
FIG. 18 is a transverse aberration diagram showing the transverse aberration in the meridional direction and in the sagittal direction of the catadioptric projection optical system in the sixth example.

FIG. 18 is a transverse aberration diagram showing the transverse aberration in the meridional direction and in the sagittal direction of the catadioptric projection optical system PL2 according to the present example. In FIG. 18, Y indicates the image height, each dashed line the wavelength of 193.3063 nm, each solid line the wavelength of 193.3060 nm, and each chain line the wavelength of 193.3057 nm. As shown in the transverse aberration diagram of FIG. 18, the catadioptric projection optical system PL2 of the present example has the large numerical aperture and is corrected in a good balance for aberration throughout the entire exposure area though it has no large optical element.

Next, the specifications of the catadioptric projection optical system PL3 according to the seventh example shown in FIG. 16 will be presented. Table 11 presents the specifications of the optical members of the catadioptric projection optical system PL3 according to the seventh example. Table 12 presents the aspherical coefficients of the lenses with the lens surface of aspherical shape and the reflecting mirrors used in the catadioptric projection optical system PL3 according to the seventh example. In the specifications, the specifications of the optical members, and the aspherical coefficients, the description will be given using the same symbols as those in the description of the catadioptric projection optical system PL1 according to the fifth example.

Seventh Example

Specifications

Image-side NA: 1.20
Exposure area: A=13 mm B=17 mm
H=26.0 mm C=4 mm
Imaging magnification: 1/5
Center wavelength; 193.306 nm
Refractive index of silica: 1.5603261
Refractive index of fluorite: 1.5014548
Refractive index of liquid 1: 1.43664
Dispersion of silica (dn/dλ): −1.591×10$^{-6}$/pm
Dispersion of fluorite (dn/dλ): −0.980×10$^{-6}$/pm
Dispersion of pure water (deionized water) (dn/dλ): −2.6×10$^{-6}$/pm
Condition Mb=508.86 mm L=1400 mm

TABLE 11

(Specifications of Optical Members)

| | #2 | #3 | #15 |
|---|---|---|---|
| #1 | | 63.0159 | |
| 1: | ∞ | 8.0000 | #5 |
| 2: | ∞ | 11.6805 | |
| 3: | ASP1 | 30.7011 | #5 |
| 4: | −244.82575 | 1.0000 | |
| 5: | 520.72375 | 50.6283 | #5 |

TABLE 11-continued (Specifications of Optical Members)

| | #2 | #3 | #15 |
|---|---|---|---|
| 6: | −283.00136 | 1.0000 | |
| 7: | 455.76731 | 37.0794 | #5 |
| 8: | −509.23840 | 143.7025 | |
| 9: | ASP2 | −123.7025 | #6 |
| 10: | ASP3 | 394.2980 | #6 |
| 11: | −398.57468 | −201.7192 | #6 |
| 12: | −485.11237 | 157.8027 | #6 |
| 13: | ASP4 | −206.6789 | #6 |
| 14: | 329.37813 | 221.6789 | #6 |
| 15: | 411.95851 | 28.1592 | #5 |
| 16: | −3890.38387 | 1.1778 | |
| 17: | 141.65647 | 33.4870 | #5 |
| 18: | ASP5 | 1.0000 | |
| 19: | 216.09570 | 28.6534 | #5 |
| 20: | 461.77835 | 1.0000 | |
| 21: | 202.12479 | 20.2182 | #5 |
| 22: | 117.79321 | 2.6054 | |
| 23: | ASP6 | 20.0000 | #5 |
| 24: | 98.31887 | 51.9992 | |
| 25: | −251.39135 | 35.2622 | #5 |
| 26: | ASP7 | 89.1855 | |
| 27: | ASP8 | 42.0591 | #5 |
| 28: | −303.33648 | 2.1164 | |
| 29: | 606.18864 | 28.5148 | #5 |
| 30: | 488.85229 | 11.9006 | |
| 31: | 811.09260 | 45.2273 | #5 |
| 32: | −813.38538 | 1.0000 | |
| 33: | 1012.41934 | 42.1336 | #5 |
| 34: | −973.64830 | 21.5611 | |
| 35: | −32382.97410 | 29.5159 | #5 |
| 36: | −1075.05682 | 1.0000 | |
| 37: | ∞ | 6.3302 | #7 |
| 38: | 371.59007 | 56.0505 | #5 |
| 39: | −4689.87645 | 9.3746 | |
| 40: | 204.82419 | 53.7618 | #5 |
| 41: | 494.59116 | 1.0000 | |
| 42: | 125.95227 | 57.4813 | #5 |
| 43: | ASP9 | 1.0101 | |
| 44: | 92.58526 | 43.4772 | #5 |
| 45: | ASP10 | 1.0360 | |
| 46: | 85.28679 | 42.2466 | #5 |
| 47: | ∞ | 1.0000 | #8 |
| #9 | ∞ | | |

1: 1st surface
2: Radius of curvature (mm)
3: Surface spacing (mm)
5: silica glass
6: reflecting mirror
7: aperture stop
8: pure water
9: 2nd surface
14: Fluorite
15: Name of glass material

TABLE 12

(Aspherical Coefficients)

| #12 | #13 | k<br>c12 | c4<br>c14 | c6<br>c16 | c8<br>c18 | c10<br>c20 |
|---|---|---|---|---|---|---|
| ASP1 | −0.0004476 | 0.00000E+00<br>4.25382E−26 | −6.28600E−08<br>−8.36739E−30 | 2.01003E−12<br>0.00000E+00 | −1.86171E−16<br>0.00000E+00 | 4.72866E−21<br>0.00000E+00 |
| ASP2 | −0.0019308 | 0.00000E+00<br>−9.28498E−26 | 5.30847E−09<br>2.73795E−30 | 2.32487E−13<br>0.00000E+00 | −9.96057E−18<br>0.00000E+00 | 1.35214E−21<br>0.00000E+00 |
| ASP3 | 0.0000635 | 0.00000E+00<br>1.55922E−27 | −1.46917E−08<br>−1.05341E−32 | 2.39879E−13<br>0.00000E+00 | 1.88016E−18<br>0.00000E+00 | −1.08670E−22<br>0.00000E+00 |
| ASP4 | −0.0009742 | 0.00000E+00<br>−2.44697E−24 | 2.25661E−09<br>2.57932E−28 | 8.15504E−13<br>0.00000E+00 | −1.75777E−16<br>0.00000E+00 | 1.64720E−20<br>0.00000E+00 |
| ASP5 | 0.0045455 | 0.00000E+00<br>−2.71916E−25 | 7.76937E−08<br>−2.25230E−30 | −8.42991E−12<br>0.00000E+00 | 3.25677E−16<br>0.00000E+00 | 8.77802E−23<br>0.00000E+00 |
| ASP6 | 0.0078125 | 0.00000E+00<br>1.70711E−23 | 1.83201E−07<br>−1.55669E−27 | −2.17156E−11<br>0.00000E+00 | 1.87637E−15<br>0.00000E+00 | −2.53394E−19<br>0.00000E+00 |
| ASP7 | 0.0063619 | 0.00000E+00<br>−2.26908E−24 | 3.50299E−09<br>3.14291E−29 | −5.60629E−12<br>0.00000E+00 | −2.85922E−18<br>0.00000E+00 | 2.57458E−20<br>0.00000E+00 |
| Asp8 | 0.0001516 | 0.00000E+00<br>−9.28797E−27 | −1.73728E−08<br>3.18623E−31 | 2.07225E−13<br>0.00000E+00 | −7.88040E−18<br>0.00000E+00 | 2.99860E−22<br>0.00000E+00 |
| ASP9 | 0.0037449 | 0.00000E+00<br>−6.11068E−26 | 4.54024E−08<br>4.37709E−30 | −8.98172E−13<br>0.00000E+00 | 6.42893E−17<br>0.00000E+00 | 5.94025E−22<br>0.00000E+00 |
| ASP10 | 0.0093466 | 0.00000E+00<br>7.23960E−23 | 2.17665E−07<br>−1.19099E−26 | 2.75156E−11<br>0.00000E+00 | 1.89892E−15<br>0.00000E+00 | 3.45960E−19<br>0.00000E+00 |

12: Aspherical surface number
13: Curvature

Figure 19:
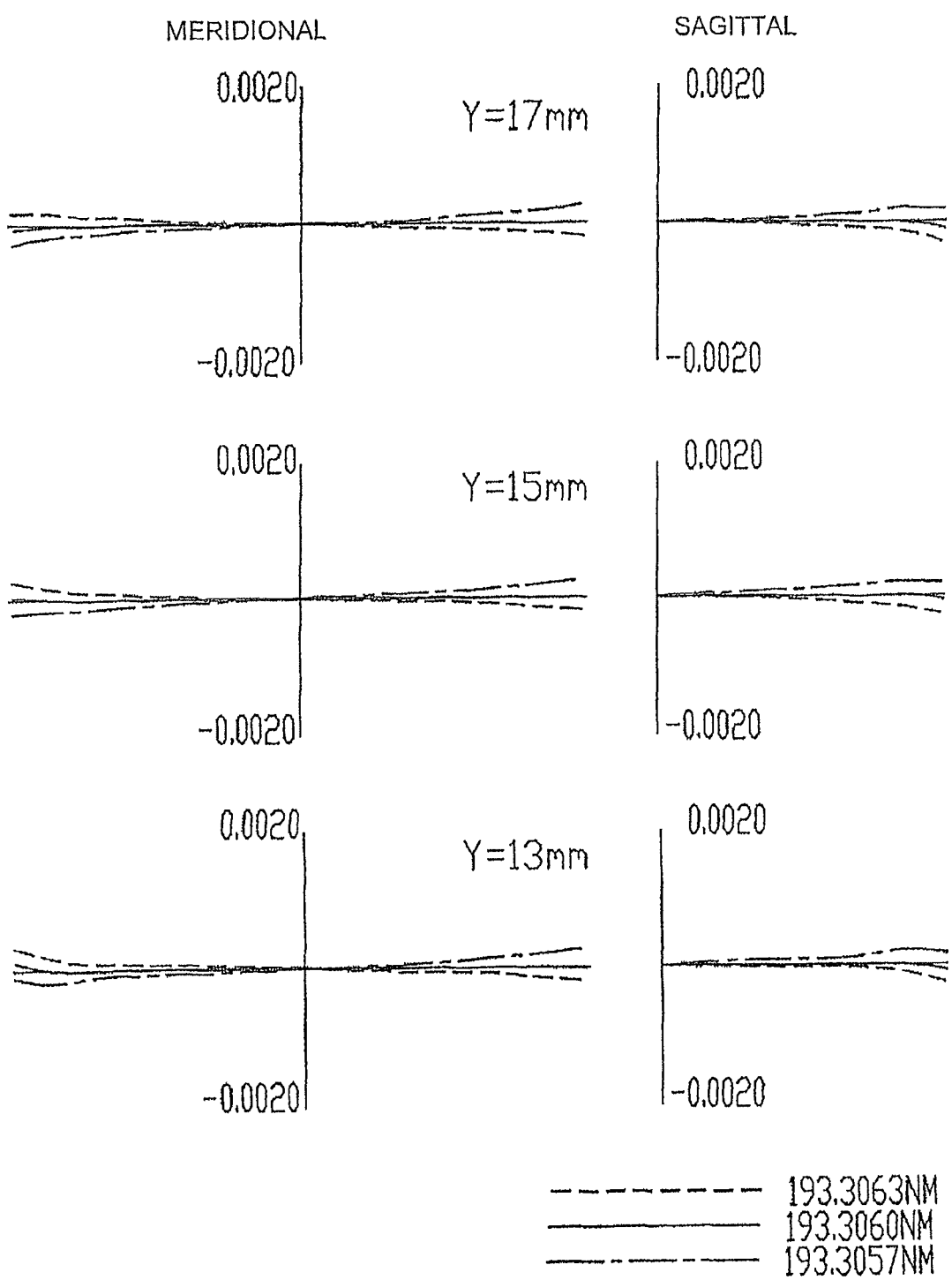
FIG. 19 is a transverse aberration diagram showing the transverse aberration in the meridional direction and in the sagittal direction of the catadioptric projection optical system in the seventh example.

FIG. 19 is a transverse aberration diagram showing the transverse aberration in the meridional direction and in the sagittal direction of the catadioptric projection optical system PL3 according to the present example. In FIG. 19, Y indicates the image height, each dashed line the wavelength of 193.3063 nm, each solid line the wavelength of 193.3060 nm, and each chain line the wavelength of 193.3057 nm. As shown in the transverse aberration diagram of FIG. 19, the catadioptric projection optical system PL3 of the present example has the large numerical aperture and is corrected in a good balance for aberration throughout the entire exposure area though it has no large optical element.

The projection optical systems of the respective examples described above can be applied each to the projection exposure apparatus shown in FIG. 1. The projection exposure apparatus shown in FIG. 1 is able to increase the effective numerical aperture on the wafer W side to 1.0 or more and to enhance the resolution, because pure water with the refractive index of about 1.4 for the exposure light is interposed between the projection optical system PL and the wafer W. Since the projection exposure apparatus shown in FIG. 1 has the projection optical system PL consisting of the catadioptric projection optical system according to each of the aforementioned examples, it is able to readily and securely achieve the optical path separation between the beam toward the reticle and the beam toward the wafer in the projection optical system PL, even in the case where the reticle-side and wafer-side numerical apertures are increased. Therefore, good imaging performance can be achieved throughout the entire region in the exposure area and a fine pattern can be suitably exposed.

Since the projection exposure apparatus shown in FIG. 1 uses the ArF excimer laser light as the exposure light, pure water is supplied as the liquid for liquid immersion exposure. Pure water is easily available in large quantity in semiconductor manufacturing facilities and others and has the advantage of no adverse effect on the photoresist on the substrate (wafer) W, the optical elements (lenses), and others. Since pure water has no adverse effect on environments and contains an extremely low amount of impurities, we can also expect the action of cleaning the surface of the wafer W and the surface of the optical element located on the end surface of the projection optical system PL.

Pure water (water) is said to have the refractive index n of about 1.44 for the exposure light of the wavelength of approximately 193 nm. In the case where the ArF excimer laser light (wavelength 193 nm) is used as a light source of exposure light, the wavelength is reduced to 1/n, i.e., about 134 nm on the substrate to achieve a high resolution. Furthermore, the depth of focus is increased to about n times or about 1.44 times that in air.

The liquid can also be another medium having the refractive index larger than 1.1 for the exposure light. In this case, the liquid can be any liquid that is transparent to the exposure light, has the refractive index as high as possible, and is stable against the projection optical system PL and the photoresist on the surface of the wafer W.

Where the $F_2$ laser light is used as the exposure light, the liquid can be a fluorinated liquid, for example, such as fluorinated oils and perfluorinated polyethers (PFPE), which can transmit the $F_2$ laser light.

The present invention is also applicable to the exposure apparatus of the twin stage type provided with two stages independently movable in the XY directions while separately carrying their respective substrates to be processed, such as wafers, as disclosed in Japanese Patent Applications Laid-Open No. 10-163099, Laid-Open No. 10-214783, Jp-A-2000-505958, and so on.

When the liquid immersion method is applied as described above, the numerical aperture (NA) of the projection optical system PL can be 0.9 to 1.3. In cases where the numerical aperture (NA) of the projection optical system PL is so large as described, use of randomly polarized light conventionally applied as the exposure light can degrade the imaging performance by virtue of its polarization effect, and it is thus desirable to use polarized illumination. A preferred configuration in those cases is such that linearly polarized illumination is effected in alignment with the longitudinal direction of line patterns of line-and-space patterns on the reticle (mask) R so that diffracted light of the s-polarized component (component in the polarization direction along the longitudinal direction of the line patterns) is more emitted from the patterns of the reticle (mask) R. When the liquid fills the space between the projection optical system PL and the resist applied on the surface of the wafer W, the transmittance becomes higher on the resist surface for the diffracted light of the s-polarized component contributing to improvement in contrast than in the case, where air (gas) fills the space between the projection optical system PL and the resist applied on the surface of the wafer W. For this reason, the high imaging performance can also be achieved even in the case where the numerical aperture (NA) of the projection optical system PL exceeds 1.0. It is more effective to use the phase shift mask, the oblique incidence illumination method (particularly, the dipole illumination) in alignment with the longitudinal direction of line patterns as disclosed in Japanese Patent Application Laid-Open No. 6-188169, etc. properly in combination.

The exposure apparatus of the aforementioned embodiment can produce microdevices (semiconductor devices, image pickup devices, liquid-crystal display devices, thin-film magnetic heads, etc.) by illuminating the reticle (mask) by the illumination device (illumination step) and performing an exposure of a transcription pattern formed on the mask, onto the photosensitive substrate by the projection optical system (exposure step). An example of a method for producing semiconductor devices as microdevices by forming a predetermined circuit pattern on a wafer or the like as a photosensitive substrate by use of the exposure apparatus of the present embodiment will be described below with reference to the flowchart of FIG. 20.

First, step 301 in FIG. 20 is to form an evaporated metal film on each of wafers in one lot. Next step 302 is to apply a photoresist onto the metal film on each of the wafers in the lot. Thereafter, step 303 is to sequentially perform an exposure to transcribe an image of a pattern on a mask into each shot area on each of the wafers in the lot through the projection optical system, using the exposure apparatus of the present embodiment. Step 304 thereafter is to perform development of the photoresist on each of the wafers in the lot, and next step 305 is to perform etching with the resist pattern as a mask on each of the wafers in the lot to form a circuit pattern corresponding to the pattern on the mask, in each shot area on each wafer.

Thereafter, through formation of circuit patterns of upper layers and others, the devices such as semiconductor devices are produced. The semiconductor device production method described above permits us to obtain the semiconductor devices with an extremely fine circuit pattern at high throughput. Step 301 to step 305 are to perform the respective steps of evaporation of metal on the wafers, application of the resist onto the metal film, exposure, development, and etching, but it is needless to mention that the method may be so arranged that, prior to these steps, a silicon oxide film is formed on the wafer and thereafter the resist is applied onto the silicon oxide film, followed by the respective steps of exposure, development, etching, and so on.

The exposure apparatus of the present embodiment can also produce a liquid-crystal display device as a microdevice by forming predetermined patterns (circuit pattern, electrode pattern, etc.) on a plate (glass substrate). An example of a method of this production will be described below with reference to the flowchart of FIG. 21. In FIG. 21, pattern forming step 401 is to execute a so-called photolithography step of performing an exposure to transcribe a pattern of a mask onto a photosensitive substrate (a glass substrate coated with a resist or the like) by the exposure apparatus of the present embodiment. This photolithography step results in forming the predetermined pattern including a number of electrodes and others on the photosensitive substrate. Thereafter, the exposed substrate is processed through respective steps of development, etching, resist removal, and so on to form a predetermined pattern on the substrate, and is then transferred to next color filter forming step 402.

Next, the color filter forming step 402 is to form a color filter in a configuration wherein a number of sets of three dots corresponding to R (Red), G (Green), and B (Blue) are arrayed in a matrix, or in a configuration wherein a plurality of sets of filters of three stripes of R, G, and B are arranged in the direction of horizontal scan lines. After the color filter forming step 402, cell assembly step 403 is then executed. The cell assembly step 403 is to assemble a liquid crystal panel (liquid crystal cell), using the substrate with the predetermined pattern obtained in the pattern forming step 401, the color filter obtained in the color filter forming step 402, and so on. In the cell assembly step 403, for example, a liquid crystal is poured into the space between the substrate with the predetermined pattern obtained in the pattern forming step 401 and the color filter obtained in the color filter forming step 402, thereby producing a liquid crystal panel (liquid crystal cell).

Module assembly step 404 thereafter is to attach each of components such as an electric circuit, a backlight, etc. for display operation of the assembled liquid crystal panel (liquid crystal cell), thereby completing a liquid-crystal display device. The production method of the liquid-crystal display device described above permits liquid-crystal display devices with the extremely fine circuit pattern to be produced at high throughput.

As described above, the projection optical system according to the first aspect of the embodiment comprises at least two reflecting mirrors and the boundary lens with the surface on the first surface side having the positive refracting power, has all the transmitting members and reflecting members arranged along the single optical axis, and has the effective imaging area not including the optical axis, wherein the optical path between the boundary lens and the second surface is filled with the medium having the refractive index larger than 1.1. As a result, the embodiment successfully realizes the relatively compact projection optical system having the excellent imaging performance as well corrected for various aberrations such as chromatic aberration and curvature of field and being capable of securing the large effective image-side numerical aperture while well suppressing the reflection loss on the optical surfaces.

In the projection optical system according to the second aspect of the embodiment, the intermediate image of the first surface is formed in the first imaging optical system, and it is thus feasible to readily and securely achieve the optical path separation between the beam toward the first surface and the beam toward the second surface, even in the case where the numerical apertures of the projection optical system are increased. Since the second imaging optical system is provided with the first lens unit having the negative refracting power, it is feasible to shorten the total length of the catadioptric projection optical system and to readily achieve the adjustment for satisfying the Petzval's condition. Furthermore, the first lens unit relieves the variation due to the difference of field angles of the beam expanded by the first field mirror, so as to suppress occurrence of aberration. Therefore, good imaging performance can be achieved throughout the entire region in the exposure area, even in the case where the object-side and image-side numerical apertures of the catadioptric projection optical system are increased in order to enhance the resolution.

The projection optical system according to the third aspect of the embodiment comprises at least six mirrors, and thus the first intermediate image and the second intermediate image can be formed without increase in the total length of the catadioptric projection optical system, even in the case where the object-side and image-side numerical apertures of the catadioptric projection optical system are increased in order to enhance the resolution. Therefore, it is feasible to readily and securely achieve the optical path separation between the beam toward the first surface and the beam toward the second surface. Since the projection optical system is provided with at least six mirrors and the second lens unit having the negative refracting power, the Petzval's condition can be readily met and correction for aberration can be readily made, through the adjustment of each mirror or each lens forming the second lens unit, or the like.

The projection optical system according to the third aspect of the embodiment is the thrice-imaging optical system, whereby the first intermediate image is an inverted image of the first surface, the second intermediate image an erect image of the first surface, and the image formed on the second surface an inverted image. Therefore, in the case where the catadioptric projection optical system of the embodiment is mounted on the exposure apparatus and where the exposure is carried out with scanning of the first surface and the second surface, the scanning direction of the first surface can be made opposite to that of the second surface and it is feasible to readily achieve such adjustment as to decrease the change in the center of gravity of the entire exposure apparatus. By reducing the change in the center of gravity of the entire exposure apparatus, it is feasible to reduce the vibration of the catadioptric projection optical system and to achieve good imaging performance throughout the entire region in the exposure area.

Accordingly, the exposure apparatus and exposure method using the projection optical system of the embodiment are able to perform the exposure to transcribe a fine pattern with high precision, through the projection optical system having the excellent imaging performance and the large effective image-side numerical aperture, consequently, high resolution. With use of the exposure apparatus equipped with the projection optical system of the embodiment, it is feasible to produce good microdevices by the high-precision projection exposure through the high-resolution projection optical system.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection optical system which projects a reduced image of an object arranged on a first surface onto a second surface through liquid, the projection optical system comprising:
a first imaging optical system, which forms an intermediate image of the object with light from the object; and
a second imaging optical system, which forms the reduced image with light from the intermediate image, wherein
the first imaging optical system is a catadioptric optical system including an even number of reflective mirrors,
the second imaging optical system is a dioptric optical system including no shield area on an exit pupil,
an optical axis of each optical element of the first imaging optical system and of the second imaging optical system is arranged on a single optical axis,
the second imaging optical system comprises a planoconvex lens arranged closest to the second surface in the second imaging optical system so as to come into contact with liquid, a number of 70% or more among a plurality of transmissive members of the second imaging optical system being formed with silica, and
the reduced image is an inverted image of the object and formed in a region which does not include the single optical axis.

2. The projection optical system according to claim 1, wherein the first imaging optical system includes a lens arranged on an optical path of the light from the object, a first reflective mirror arranged on an optical path from the lens, and a second reflective mirror arranged on an optical path from the light from the first reflective mirror, and
the even number of reflective mirrors are two reflective mirrors consisting of the first reflective mirror and the second reflective mirror.

3. The projection optical system according to claim 2, wherein each of the first reflective mirror and the second reflective mirror is a concave reflective mirror.

4. The projection optical system according to claim 1, wherein the light is ArF excimer laser light.

5. The projection optical system according to claim 1, wherein a central wavelength of the light is 193.3 nm.

6. The projection optical system according to claim 1, wherein a number of 88% among the plurality of transmissive members of the second imaging optical system is formed with silica.

7. The projection optical system according to claim 1, wherein all the plurality of transmissive members of the second imaging optical system are formed with silica.

8. An exposure apparatus for exposing a substrate with light from a pattern provided on a mask, the exposure apparatus comprising:
a stage for holding the substrate;
an illumination apparatus for illuminating the pattern with light; and
the projection optical system according to claim 1, arranged to form a reduced image of the pattern illuminated with the light onto the substrate held by the stage through liquid.

9. The exposure apparatus according to claim 8, further comprising:
a liquid supplying device for supplying the liquid in an optical path of the light from the projection optical system.

10. The exposure apparatus according to claim 9, wherein all the plurality of transmissive members of the second imaging optical system are formed with silica.

11. An exposure method for exposing a substrate with light from a pattern provided on a mask, the exposure method comprising:
holding the substrate by a stage;
illuminating the pattern with light; and
forming a reduced image of the pattern illuminated with the light onto the substrate held by the stage through liquid by using the projection optical system according to claim 1.

12. The exposure method according to claim 11, further comprising:
supplying the liquid to an optical path of the light from the projection optical system; and
collecting the liquid provided to the optical path.

13. The exposure method according to claim 12, wherein all the plurality of transmissive members of the second imaging optical system are formed with silica.

14. A method of manufacturing a device, comprising:
exposing a substrate with light from a pattern using the exposure apparatus according to claim 8; and
developing the substrate exposed with the light.

15. The method of manufacturing a device according to claim 14, further comprising:
supplying liquid to an optical path of light from the projection optical system; and
collecting the liquid provided to the optical path.

16. A method of manufacturing a device, comprising:
exposing a substrate with light from a pattern using the exposure method according to claim 11; and
developing the substrate exposed with the light.

17. The method of manufacturing a device according to claim 16, further comprising:
supplying liquid to an optical path of light from the projection optical system; and
collecting the liquid provided to the optical path.

18. The projection optical system according to claim 1, wherein the second imaging optical system comprises an aperture stop, first lenses arranged on an incidence side of the aperture stop and second lenses arranged on an exit side of the aperture stop,
the second lenses comprises the planoconvex lens, and
the first lenses comprises a positive lens being adjacent to the aperture stop.

19. The projection optical system according to claim 18, wherein the first lenses comprises a biconcave lens and a plurality of biconvex lenses arranged between the biconcave lens and the aperture stop.

20. The projection optical system according to claim 19, wherein the first lenses comprises a negative meniscus lens having a concave surface facing the biconcave lens, the concave surface being concave relative to the biconcave lens.

21. The projection optical system according to claim 20, wherein the negative meniscus lens is arranged on an incidence side of the biconcave lens so as to be adjacent to the biconcave lens.

22. The projection optical system according to claim 19, wherein the first lenses comprises a positive meniscus lens arranged between the biconcave lens and the plurality of biconvex lenses.

23. The projection optical system according to claim 18, wherein the first lenses comprises a biconcave lens, a biconvex lens arranged between the biconcave lens and the aperture stop, and a positive meniscus lens arranged between the biconvex lens and the aperture stop.

* * * * *